(12) United States Patent
Hisamoto et al.

(10) Patent No.: US 7,504,689 B2
(45) Date of Patent: Mar. 17, 2009

(54) SEMICONDUCTOR DEVICE AND MANUFACTURING METHOD OF SEMICONDUCTOR DEVICE

(75) Inventors: Digh Hisamoto, Kokubunji (JP); Kan Yasui, Kodaira (JP); Shinichiro Kimura, Kunitachi (JP); Tetsuya Ishimaru, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 66 days.

(21) Appl. No.: 11/182,013

(22) Filed: Jul. 15, 2005

(65) Prior Publication Data

US 2006/0022260 A1 Feb. 2, 2006

(30) Foreign Application Priority Data

Jul. 29, 2004 (JP) ............................... 2004-221764

(51) Int. Cl.
*H01L 29/792* (2006.01)
(52) U.S. Cl. ............................... 257/324; 257/E29.309; 257/315
(58) Field of Classification Search .................. None
See application file for complete search history.

(56) References Cited

U.S. PATENT DOCUMENTS

| | | | |
|---|---|---|---|
| 5,341,041 A * | 8/1994 | El Gamal ..................... 326/44 |
| 5,889,304 A | 3/1999 | Watanabe et al. ............ 257/321 |
| 5,969,383 A | 10/1999 | Chang et al. ................. 257/316 |
| 6,335,554 B1 * | 1/2002 | Yoshikawa ................... 257/316 |
| 6,420,754 B2 * | 7/2002 | Takahashi et al. ........... 257/326 |
| 6,545,312 B2 * | 4/2003 | Kusumi et al. .............. 257/315 |
| 2001/0040258 A1 * | 11/2001 | Gonzalez et al. ............ 257/368 |
| 2003/0053345 A1 * | 3/2003 | Moriya et al. ............... 365/200 |
| 2004/0119107 A1 | 6/2004 | Hisamoto et al. ........... 257/314 |

OTHER PUBLICATIONS

S. Sze, "Physics of Semiconductor Devices," 2nd Edition, Wiley-Interscience Publication, pp. 496-506, (1981).
W. Chen, "A Novel Flash Memory Device with Split Gate Source Side Injection and Ono Charge Storage Stack (SPIN)," 1997 Symposium on VLSI Technology Digest of Technical Papers, pp. 63-64.
A. T. Wu, "A Novel High-Speed, 5-Volt Programming EPROM Structure with Source-Side Injection," IEEE International Electron Device Meeting, Technical Digest, 1986, pp. 584-587.
T. Y. Chan, "The Impact of Gate-Induced Drain Leakage Current on MOSFET Scaling," IEEE International Electron Device Meeting, Technical Digest, 1987, pp. 718-721.

* cited by examiner

*Primary Examiner*—Evan Pert
*Assistant Examiner*—Ben P Sandvik
(74) *Attorney, Agent, or Firm*—Miles & Stockbridge P.C.

(57) ABSTRACT

Provided is a nonvolatile semiconductor memory device having a split gate structure, wherein a memory gate is formed over a convex shaped substrate and side surfaces of it is used as a channel. The nonvolatile semiconductor memory device according to the present invention is excellent in read current driving power even if a memory cell is scaled down.

9 Claims, 100 Drawing Sheets

1 SELECT TRANSISTOR    2 MEMORY TRANSISTOR

SEMICONDUCTOR DEVICE AND MANUFACTURING METHOD OF SEMICONDUCTOR DEVICE

CLAIM OF PRIORITY

The present application claims priority from Japanese Application JP2004-221764 filed on Jul. 29, 2004, the content of which is hereby incorporated by reference into this application.

FIELD OF THE INVENTION

The present invention relates to a semiconductor device and a manufacturing method thereof, particularly to a semiconductor device having a nonvolatile memory structure.

BACKGROUND OF THE INVENTION

One of semiconductor memories integrated in LSI is a nonvolatile memory. It is a device which does not lose its stored data when the LSI is turned off. It is a very important device for widespread application of LSI.

With regards to a nonvolatile memory of a semiconductor device, there is a description of so-called floating gate memories or memories using an insulating film on pages from 496 to 506 of S. Sze, *Physics of Semiconductor Devices,* 2nd edition, A Wiley-Interscience Publication. As described therein, it is known that different from a floating gate memory, a memory capable of storing charges in the interface of insulating films stacked one after another or in a trap in the insulating film does not need the formation of a new conductive layer and the CMOS LSI process is suited for the formation of such a memory.

It is however difficult to realize a memory which stores charges in an insulating film, because it must have sufficient charge retaining properties while injecting and releasing charges. With a view to overcoming this drawback, there is a proposal that stored information is rewritten by injection of charges having a different sign instead of release of charges. A description of this action can be found on page 63 of *Symposium on VLSI technology,* 1997. In this structure, a polycrystalline silicon gate causing memory action and a gate for selecting a cell are separated. A similar description can be found in U.S. Pat. No. 5,969,383.

In this memory cell structure, two transistors having NMOS as a base and having a memory gate on the side of a select gate are "vertically stacked". This structure is illustrated as an equivalent circuit in FIG. 1. The gate insulating film of the memory gate has a so-called MONOS structure (Metal-Oxide-Nitride-Oxide-Semiconductor (Silicon)), that is, a structure in which a silicon nitride film is sandwiched between silicon dioxide films. The gate insulating film of the select gate is a silicon dioxide film. This film and a gate insulating film of CMOS at a peripheral region or logic region can be used in common, which will be described later based on formation steps. A diffusion layer electrode is formed with the select gate and memory gate as a mask. This memory cell has four basic actions, that is, (1) writing, (2) erasing, (3) retention and (4) reading. These actions are typically called as described above, but "writing" and "erasing" can be called by another name. Although there are various different operation methods, a description will next be made with representative ones. Here, a memory cell formed as NMOS type will be described, but a PMOS type can also be formed similarly in principle.

(1) Upon writing, a positive potential is applied to a diffusion layer on a memory gate side, while a ground potential similar to that of a substrate is applied to a diffusion layer on a select gate. A high gate over drive voltage is applied to the memory gate to turn on a channel below the memory gate. The channel is turned on by setting the potential of the select gate higher, for example, by 0.1 or 0.2V than a threshold voltage. The strongest electric field then appears near the boundary between two gates and many hot electrons are generated and injected into the memory gate side. This phenomenon is known as a source side injection (SSI) and a description on it can be found on pages 584 to 587 of A. T. Wu, et al., *IEEE International Electron Device Meeting, Technical Digest,* 1986. A floating gate memory cell is used in the above description, but an injection mechanism is the same in an insulating film memory cell. Hot electron injection by this system is characterized by that electric field concentration onto a boundary between a select gate and a memory gate occurs, resulting in concentrated injection to the memory gate at the side end portion of the select gate. A floating gate memory cell has a charge retention layer composed of an electrode. In the insulating film type, on the other hand, charges are stored in an insulating film so that electrons are retained in a very narrow region.

(2) Upon erasing, a negative potential is applied to the memory gate, while a positive potential is applied to the diffusion layer on the memory gate side. Strong inversion is therefore caused in a region where the memory gate at the end of the diffusion layer and the diffusion layer are overlapped, whereby a band-band tunnel phenomenon occurs, leading to the formation of holes. A description on this band-band tunnel phenomenon can be found, for example, on pages 718 to 721 of T. Y. Chan, et al., *IEEE International Electron Device Meeting, Technical Digest,* 1987. In this memory cell, holes generated are accelerated in the channel direction, drawn by a bias of the memory gate and injected into an ONO film, whereby an erasing operation is conducted. In other words, a threshold voltage of the memory gate which has increased by the charges of electrons can be reduced by the charges of the holes thus injected.

(3) During retention, the charges are retained as charges of carriers injected into the insulating ONO film. Since the carrier movement in the insulating film is remarkably slow, they can be retained desirably even without applying a voltage to the electrode.

(4) During reading, the channel below the select gate is turned on by applying a positive potential to the diffusion layer on the side of the select gate and applying a positive potential to the select gate. Charge data retained can be read out as a current by giving an appropriate memory gate potential (that is, an intermediate potential between the threshold voltage under a written state and a threshold voltage under an erased state) permitting discrimination of a difference in the threshold voltage of the memory gate given by the written and erased states.

The memory cell having a split gate and using a hole injection according to the above-described related art features that in a hole injection state, the threshold voltage lower than the initial threshold voltage can be actualized owing to the charges of holes so that a large read current is available under an erased state. A fundamental circuit constitution of a memory cell is illustrated in FIG. 1. This memory cell has a select transistor 1 and a memory transistor 2 connected in series. Since this memory cell has MOSFET as a basic constitution, its characteristics undergo a change according to the scaling-down of the device. A current driving power can be improved by shortening the gate length or thinning the gate insulating film. The smaller the channel width, the smaller a current value. These parameters of the select gate as a conventional MOSFET can be scaled down. In the memory gate, however, in order to maintain write/erase characteristics or charge retaining properties, thickness of the gate insulating film or gate length cannot be reduced. When the memory cell is scaled down, channel-width reducing effects appear clearly. This leads to a problem of lowering of a current driving power.

SUMMARY OF THE INVENTION

An object of the present invention is therefore to overcome the above-described problem and to provide a nonvolatile semiconductor memory device having a high current driving power even if it is scaled down.

The gist of the present invention is to form a convex-shaped active region and place a select gate or memory gate so that it straddles the convex portion.

The followings are main modes of the present invention. A silicon substrate is representative of a semiconductor substrate so that a description will be made using a silicon substrate as the semiconductor substrate.

In the present invention, there is provided a nonvolatile semiconductor memory device, comprising a silicon substrate, a first metal insulator semiconductor field effect transistor ("metal insulator semiconductor field effect transistor" will hereinafter be abbreviated as MISFET) formed over the silicon substrate, and a second MISFET formed over the silicon substrate and having a second gate electrode formed with an insulating film inserted between the second gate electrode and a first gate electrode of the first MISFET. A gate insulating film of the second MISFET has a charge retaining function, and a current flowing between a first diffusion layer electrode and a second diffusion layer electrode is controlled by a change in voltage characteristics caused by the second gate electrode. It has following characteristics further.

In a direction crossing with each gate electrode of the first and second MISFETs, the device has a first diffusion layer electrode, a first channel region—corresponding to the first gate electrode—of the first MISFET, a second channel region—corresponding to the second gate electrode—of the second MISFET, and a second diffusion layer electrode opposite to the first diffusion layer electrode with the first channel region and second channel region sandwiched therebetween.

The device has a convex shaped semiconductor region in a direction crossing with a channel direction connecting the first diffusion layer electrode, and the second diffusion layer electrode, and the channel region of either one or both of the MISFETs is formed over the side walls of the convex type semiconductor region.

Described specifically, in one aspect, at least a first channel region of the first MISFET is formed over the side walls of the convex shaped semiconductor region. In a second aspect, at least a second channel region of the second MISFET is formed over the side walls of the convex shaped semiconductor region. In a third aspect, channel regions of the first and second MISFETs are formed over the side walls of the convex shaped semiconductor region.

Different from the above-described modes of the present invention, a mode in which the first channel region of the first MISFET is formed over the surface of the substrate except the convex shaped semiconductor region or over a surface parallel to the upper surface of this semiconductor substrate is effective for practical use. Described specifically, when the nonvolatile semiconductor memory device is applied to a semiconductor integrated circuit semiconductor device, ordinary MISFET constituting a semiconductor integrated circuit semiconductor device is formed over the upper surface of a semiconductor substrate or over a surface parallel thereto. Accordingly, MISFETs other than a nonvolatile semiconductor memory device which has a channel formed over the side walls of the convex shaped semiconductor region can be manufactured by similar steps to the conventional ones.

In the present invention, even if a planar layout is scaled down, an effective channel width can be enlarged compared with the channel width of the layout. The nonvolatile semiconductor memory device of the present invention is therefore able to have a high current driving power in spite of the scaling down.

BRIEF DESCRIPTION OF THE DRAWINGS

FIG. 47D is a cross-sectional structural view showing the manufacturing step of the eighth device of the present invention;

FIG. 47E is a cross-sectional structural view showing the manufacturing step of the eighth device of the present invention;

FIG. 48A is a cross-sectional structural view for explaining a manufacturing step of the eighth device of the present invention;

FIG. 48B is a cross-sectional structural view showing a manufacturing step of the eighth device of the present invention;

FIG. 48C is a cross-sectional structural view showing the manufacturing step of the eighth device of the present invention;

FIG. 48D is a cross-sectional structural view showing the manufacturing step of the eighth device of the present invention;

FIG. 48E is a cross-sectional structural view showing the manufacturing step of the eighth device of the present invention;

FIG. 49 is an equivalent circuit diagram of a memory cell for explaining an equivalent resistance of the memory cell;

FIG. 50 is a plan view for explaining a memory cell layout;

FIG. 51 is a cross-sectional structural view for explaining another device structure of the present invention;

FIG. 52A is a cross-sectional structural view showing a manufacturing step of the ninth device of the present invention;

FIG. 52B is a cross-sectional structural view showing the manufacturing step of the ninth device of the present invention;

Figure 52A:
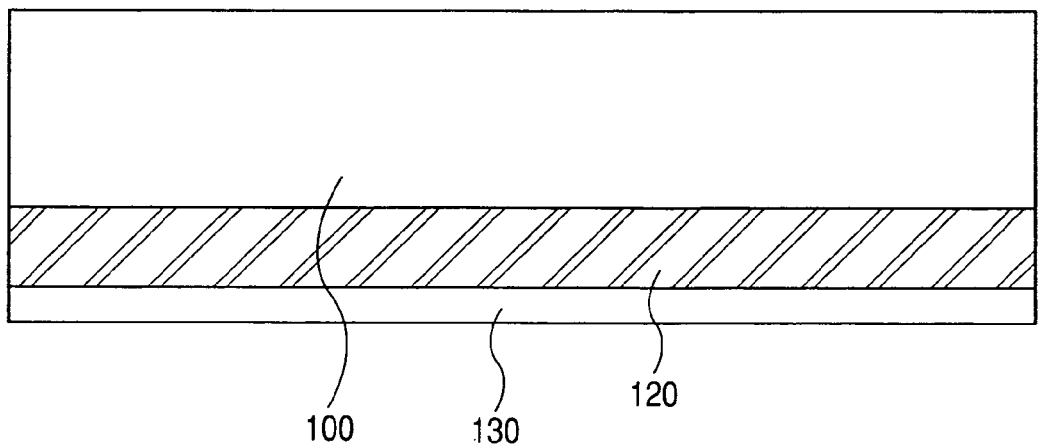
Figure 52B:
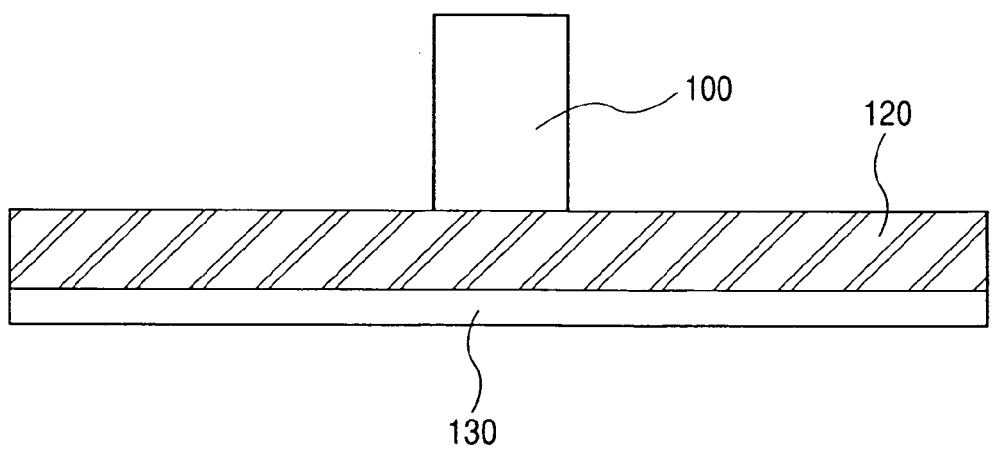
Figure 52C:
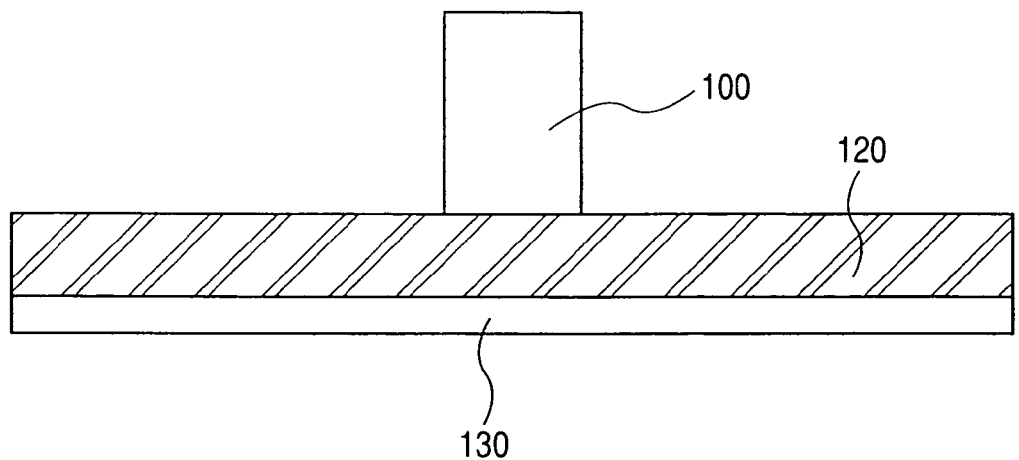
Figure 53A:
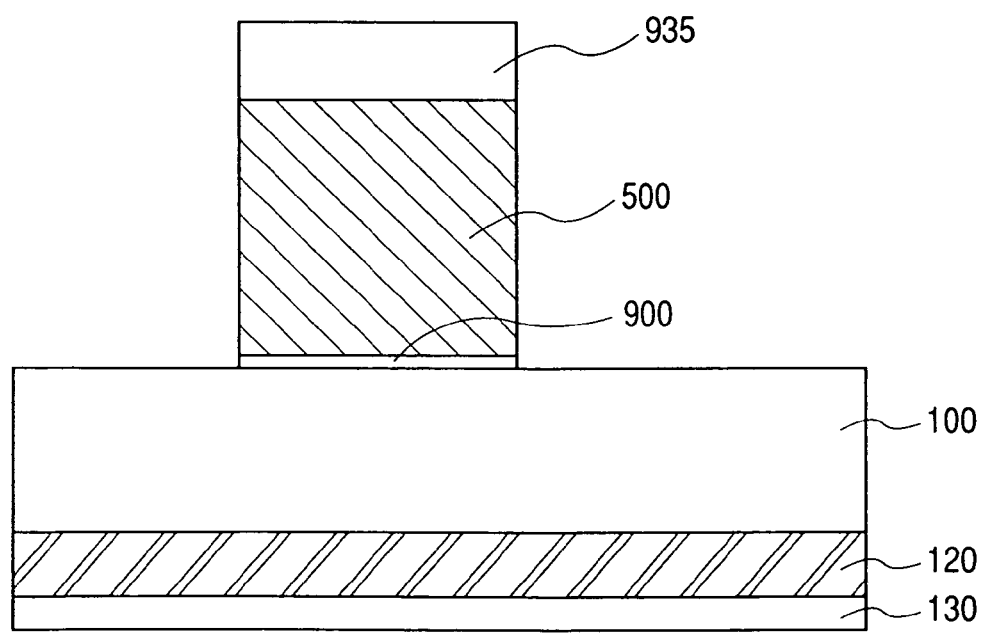
Figure 53B:
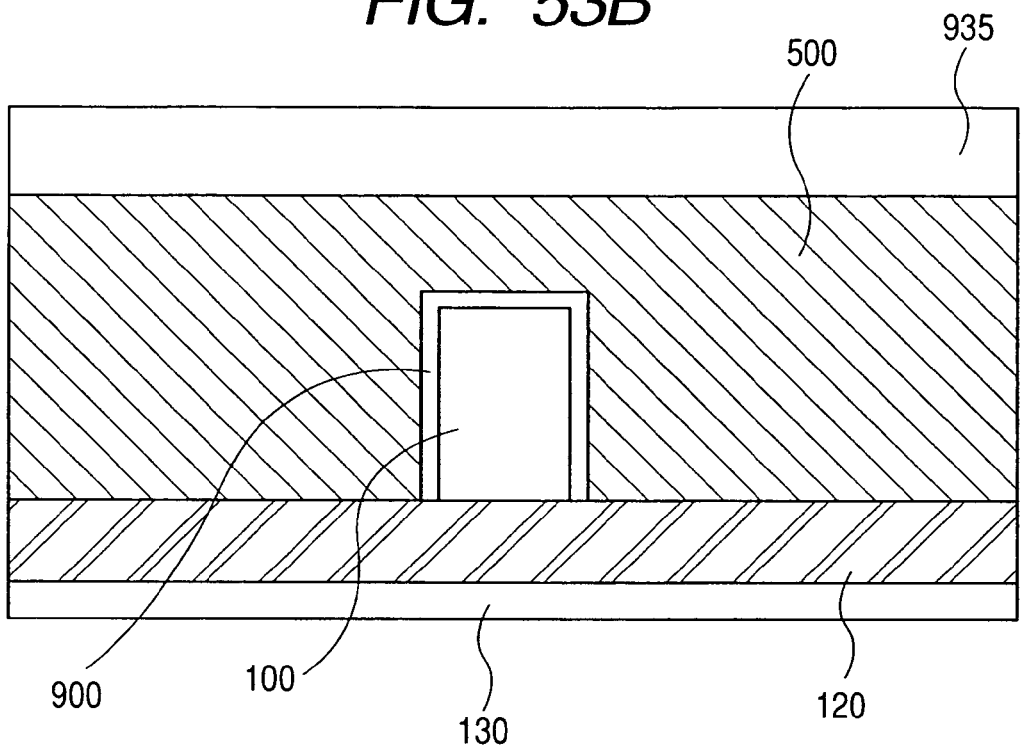
Figure 53C:
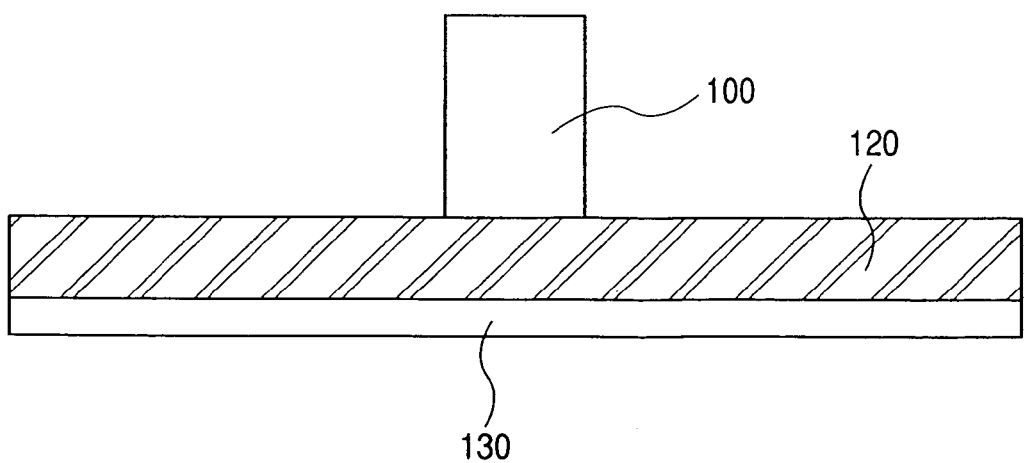
Figure 54A:
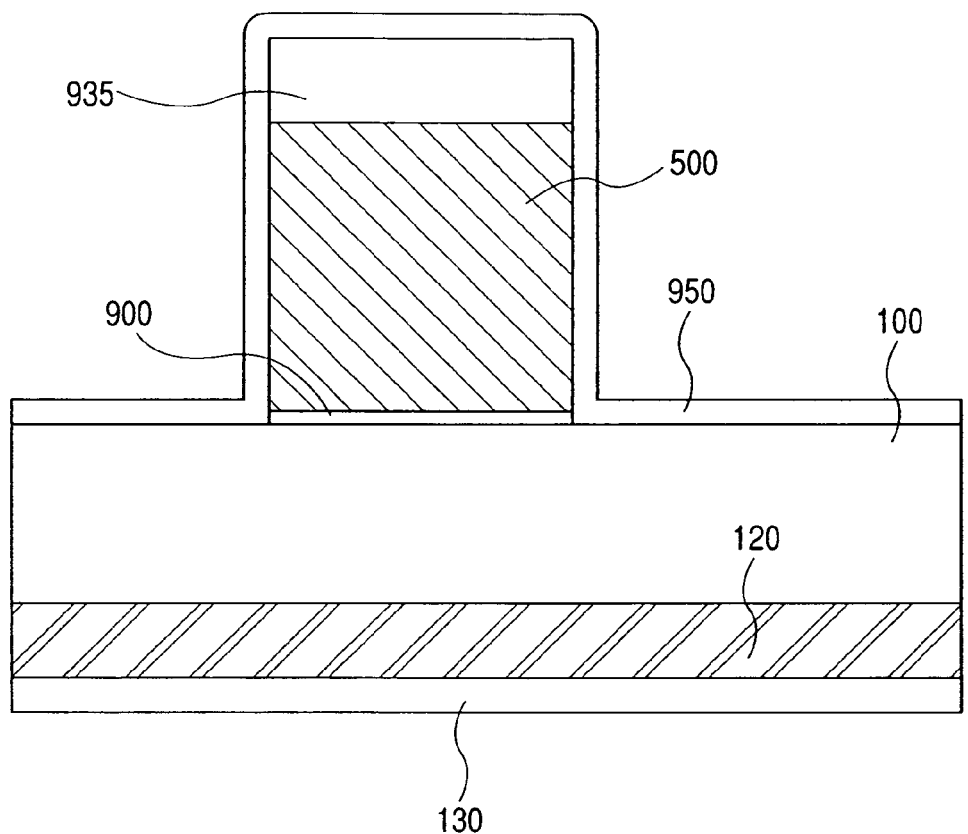
Figure 54B:
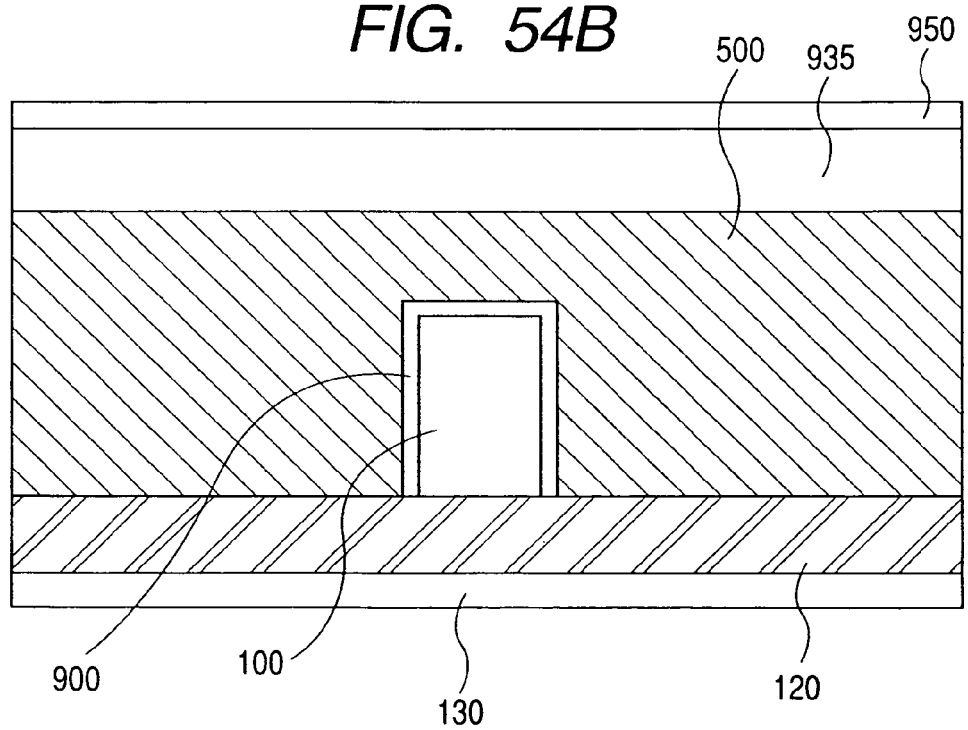
Figure 54C:
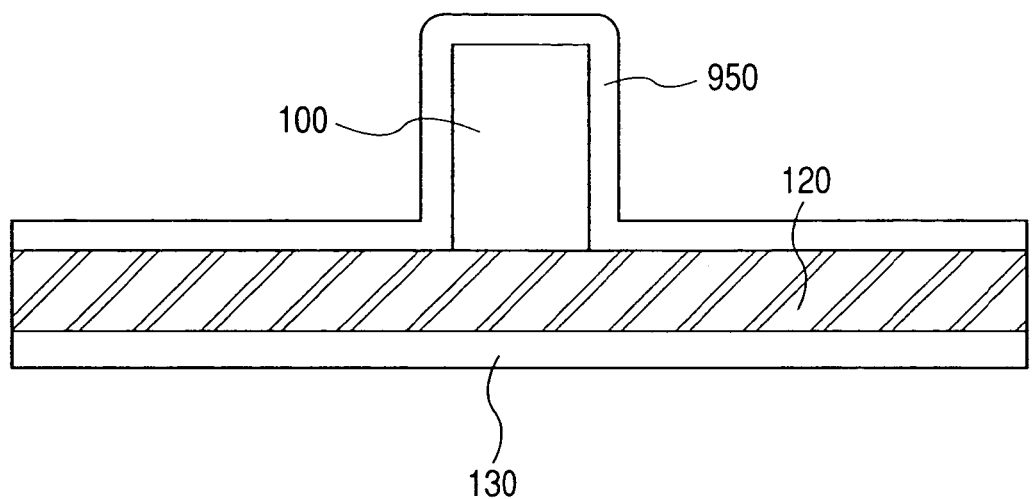
Figure 55A:
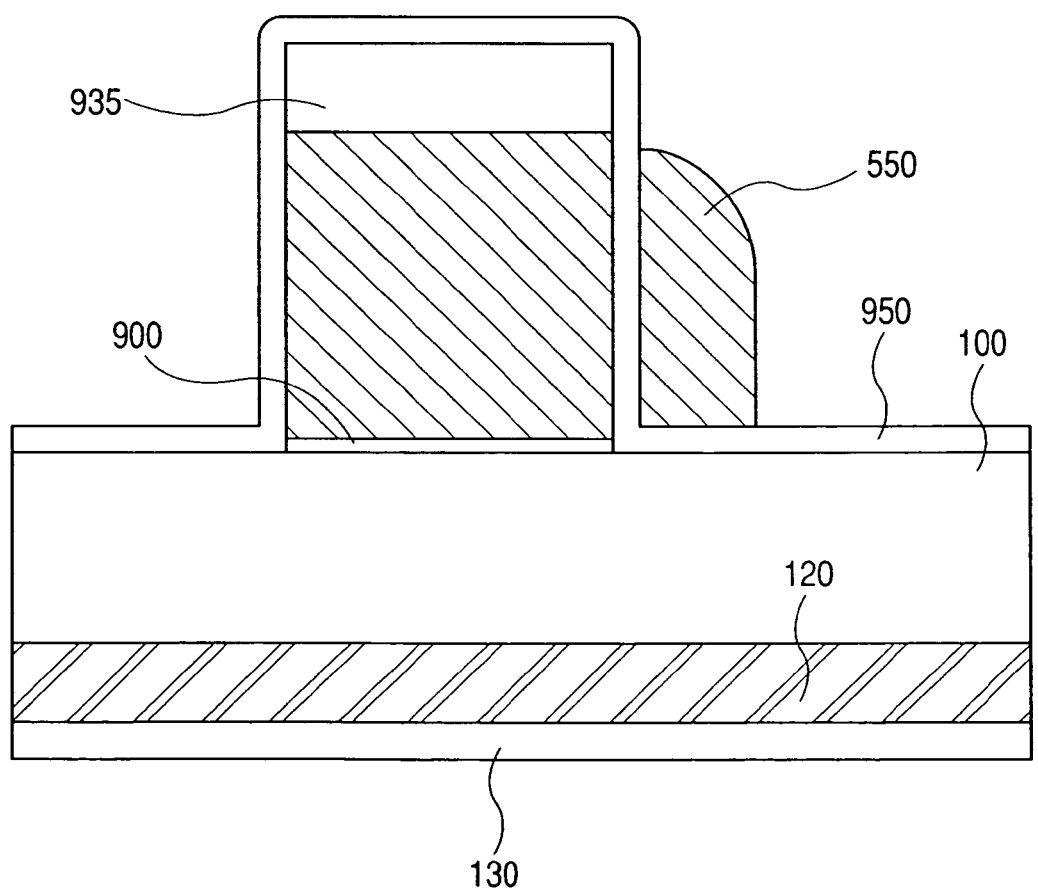
Figure 55B:
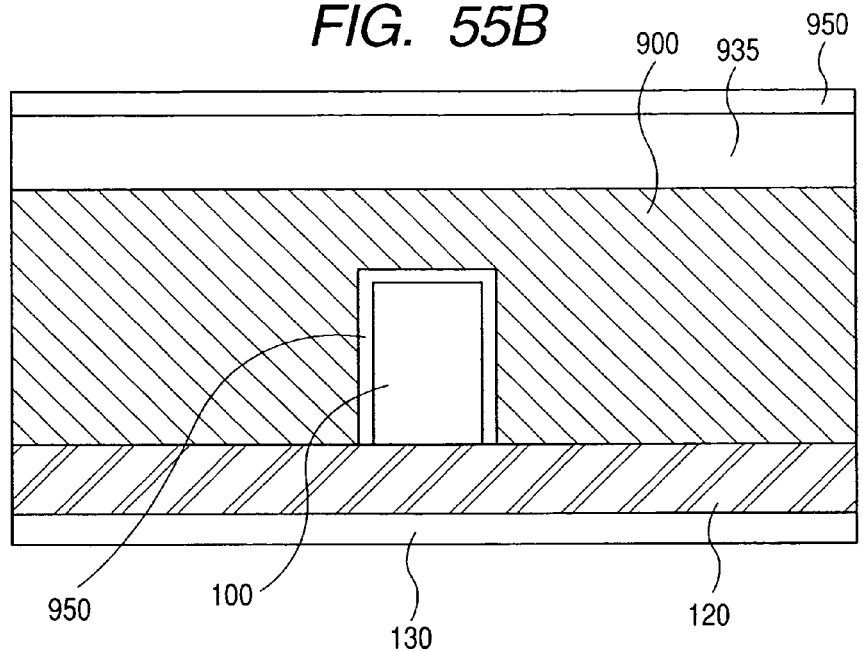
Figure 55C:
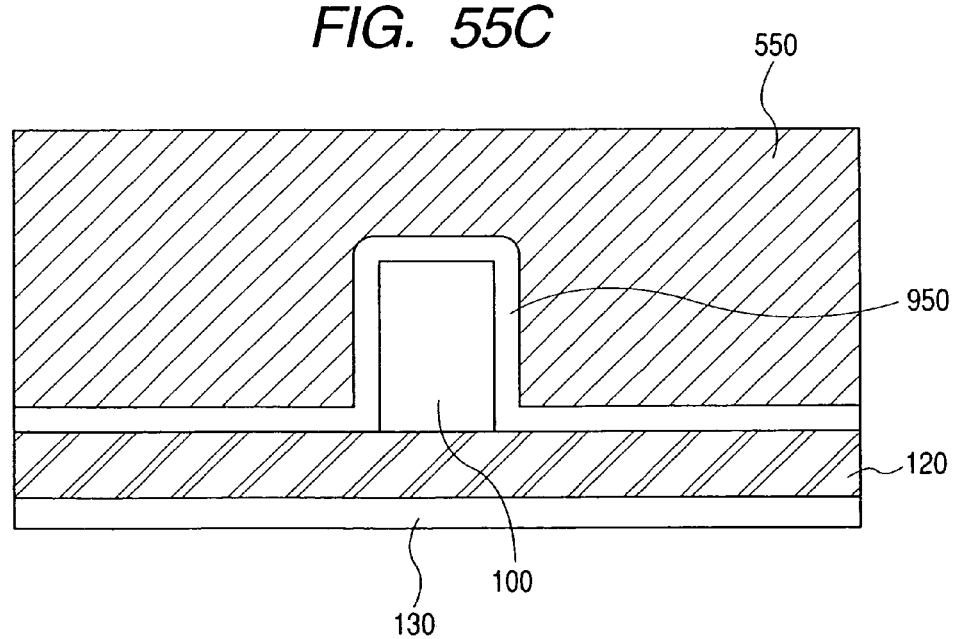
Figure 56A:
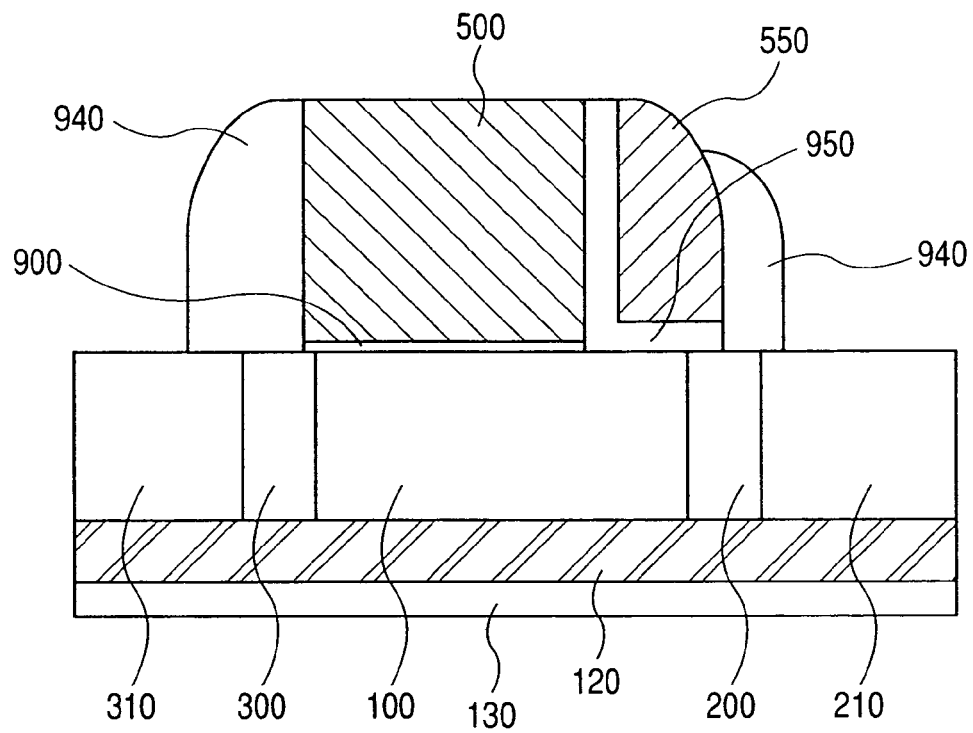
Figure 56B:
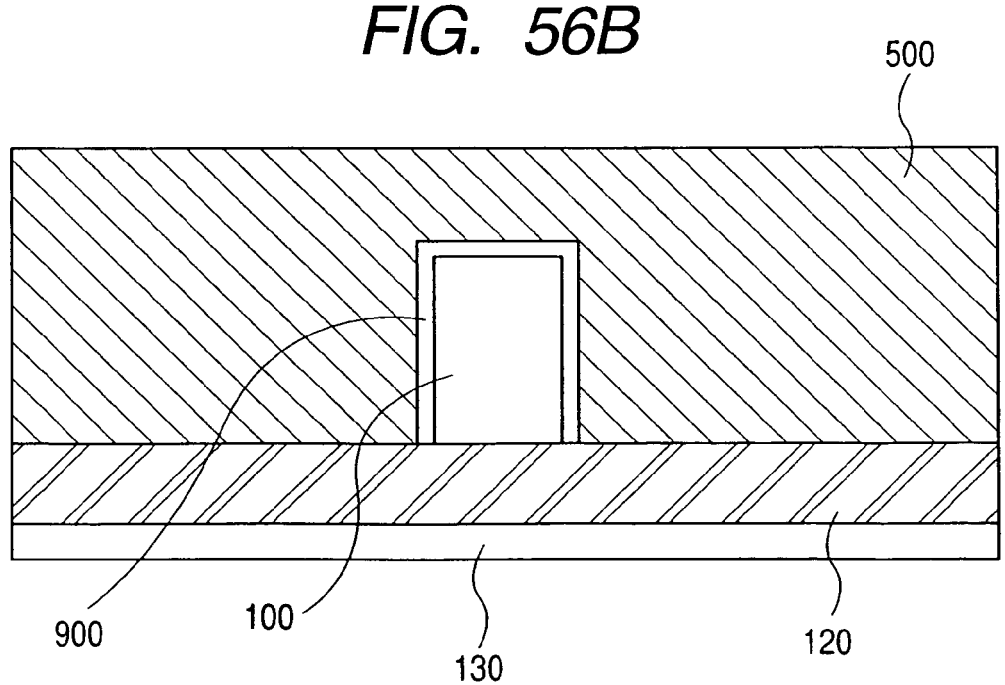
Figure 56C:
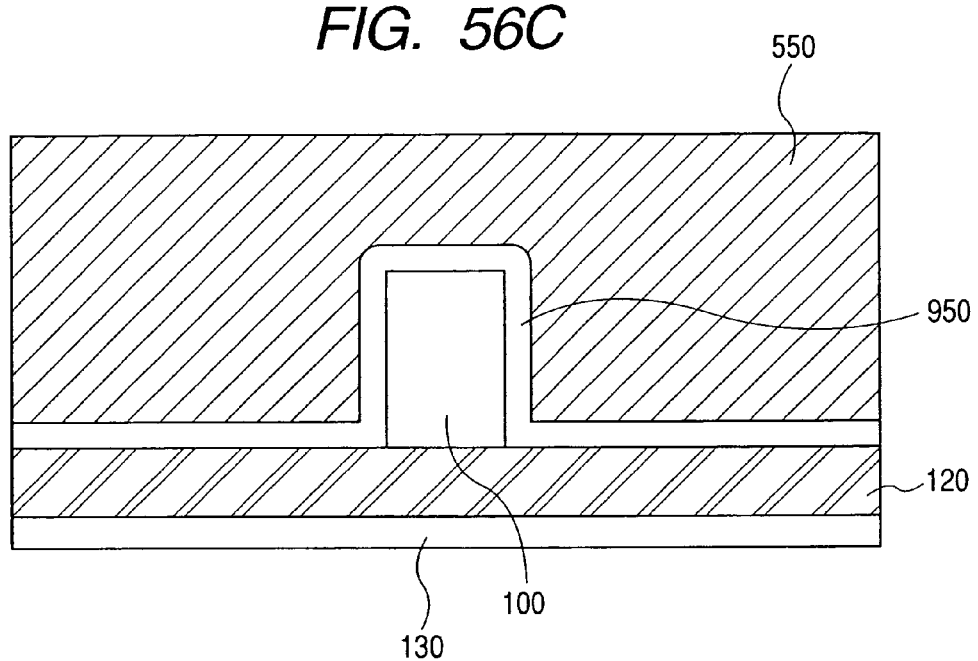
Figure 57A:
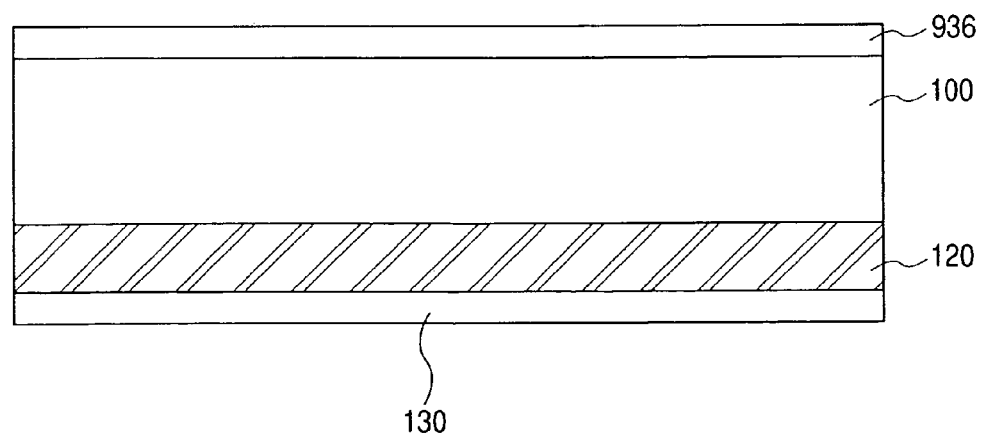
Figure 57B:
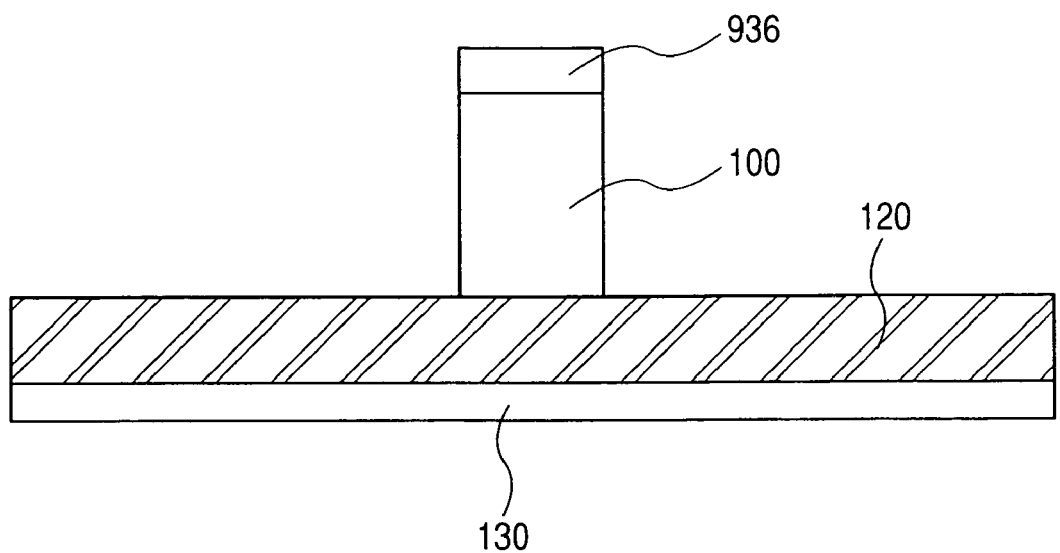
Figure 57C:
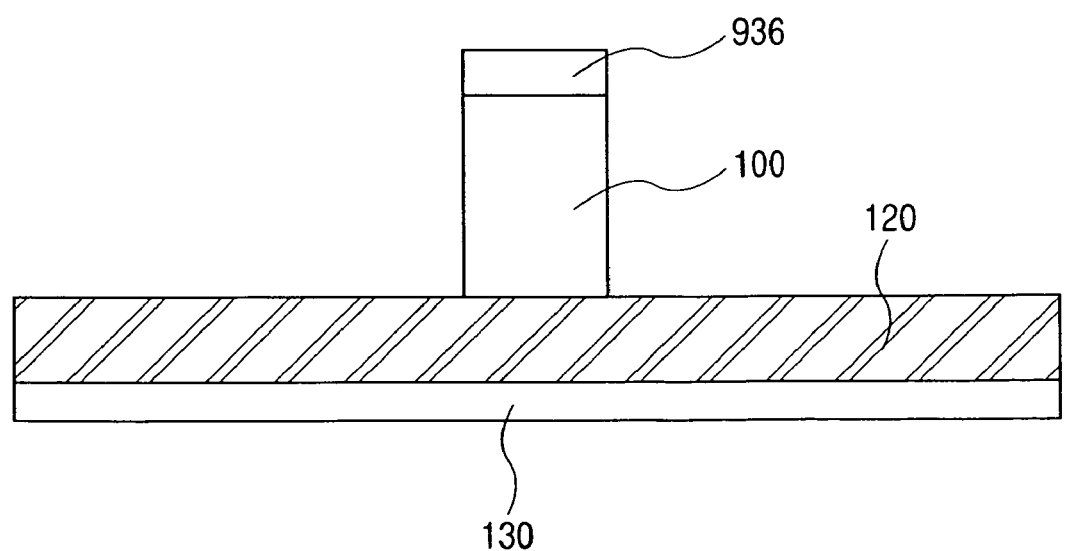
Figure 58A:
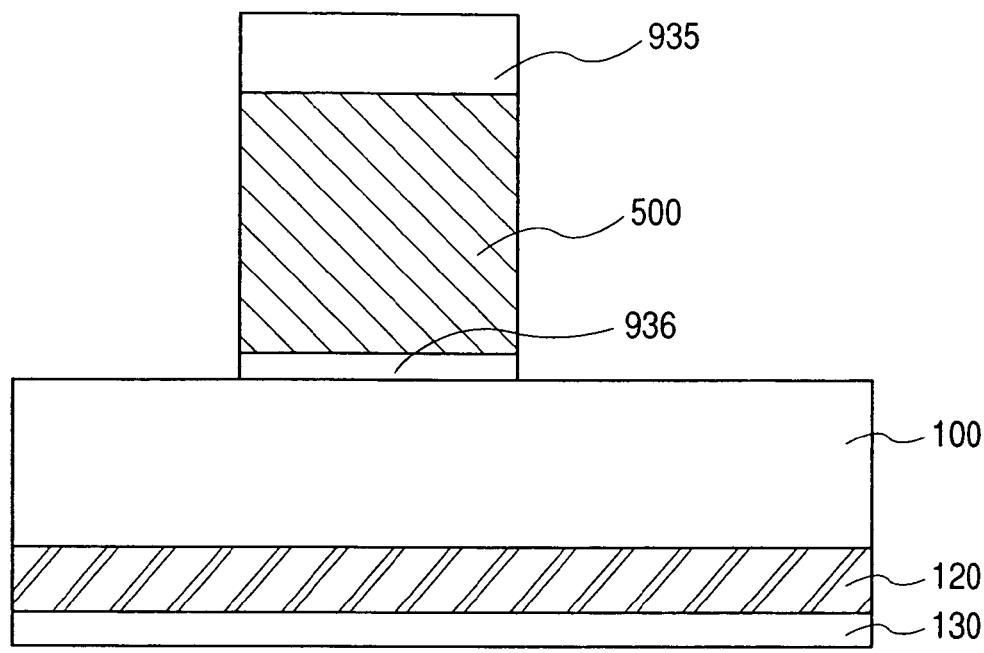
Figure 58B:
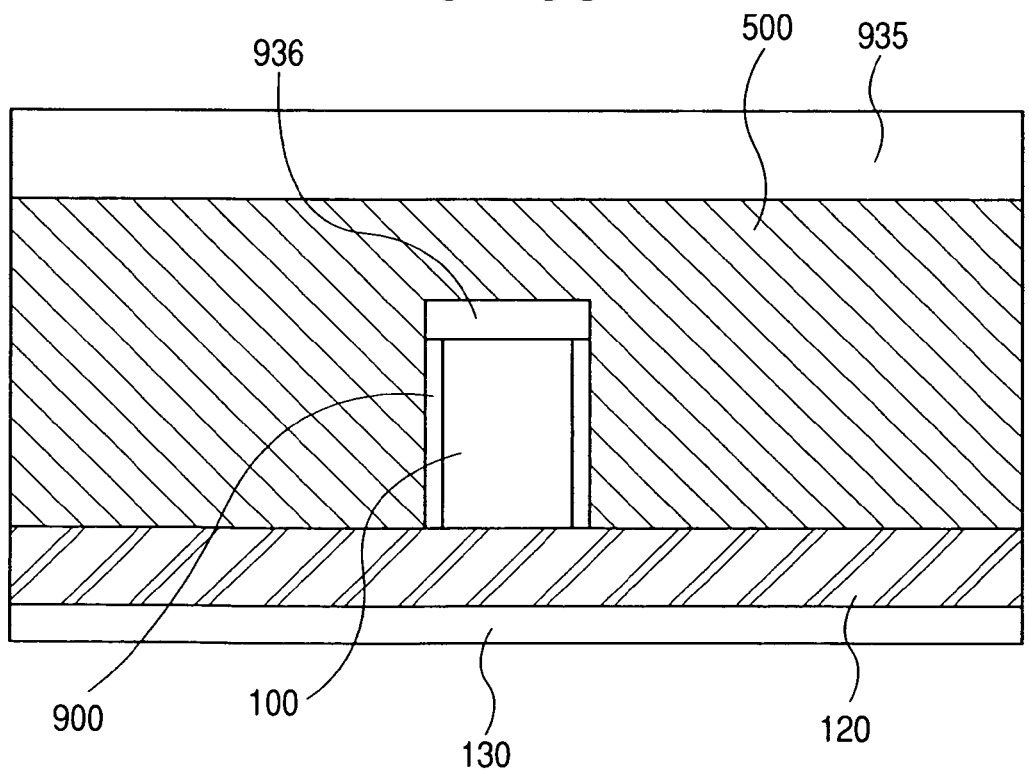
Figure 58C:
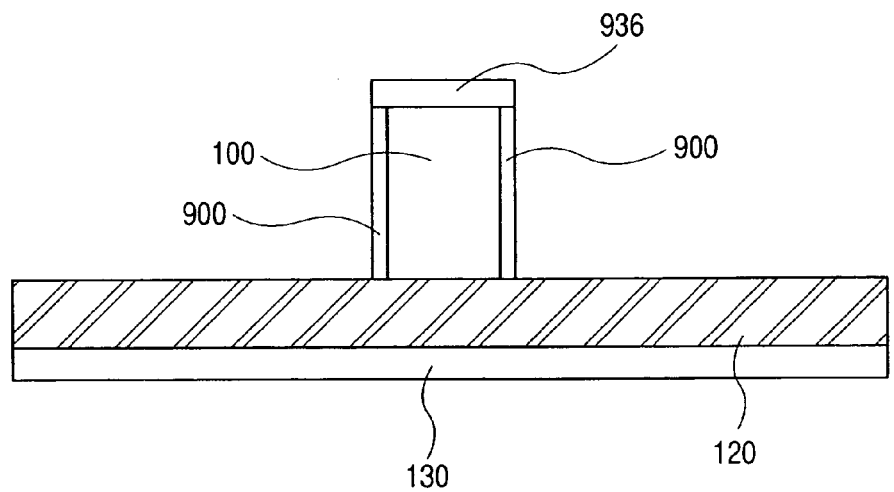
Figure 59A:
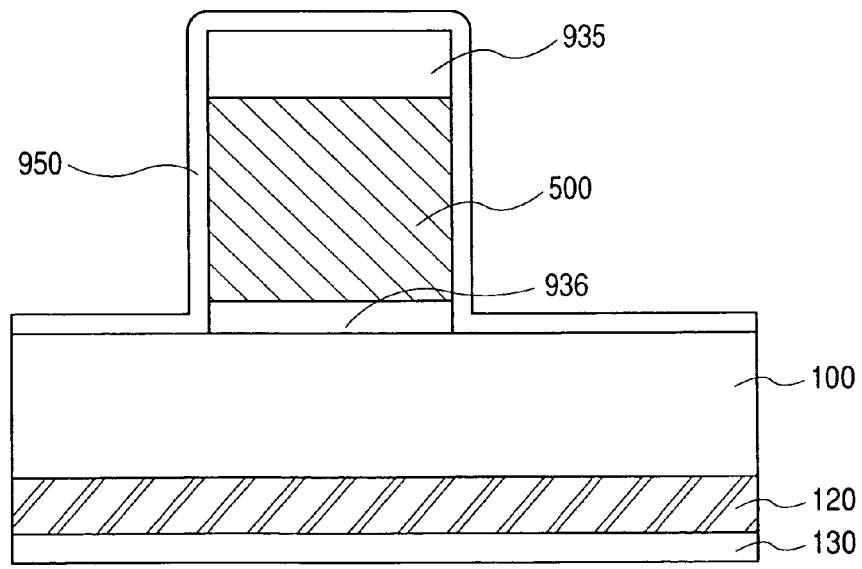
Figure 59B:
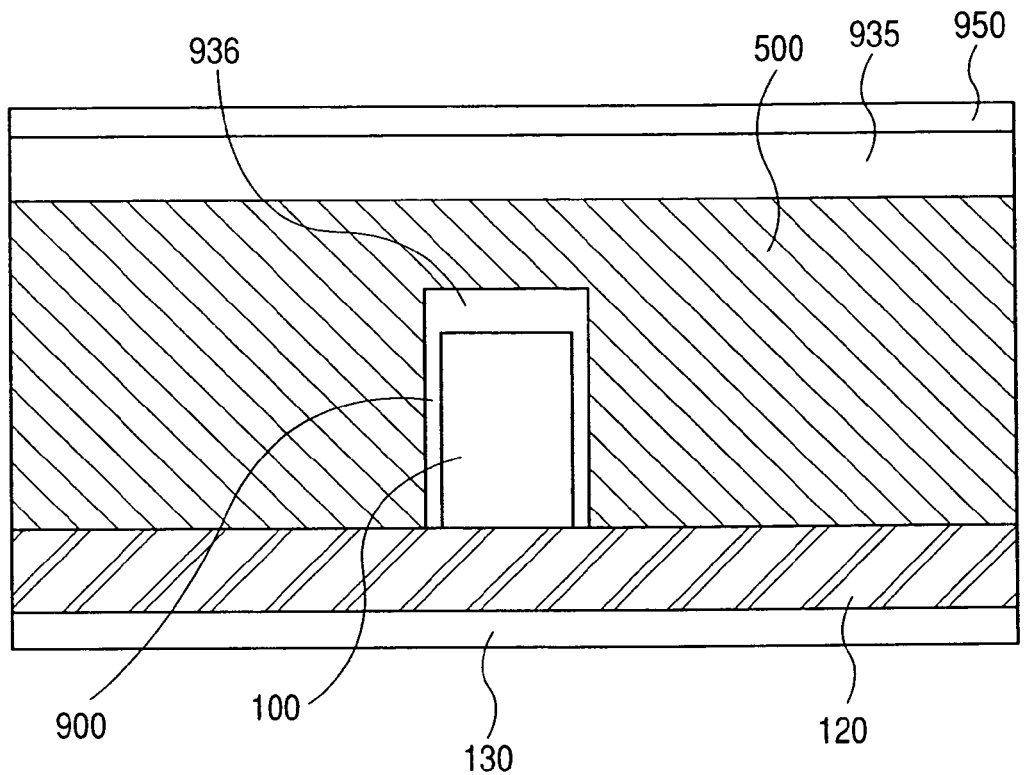
Figure 59C:
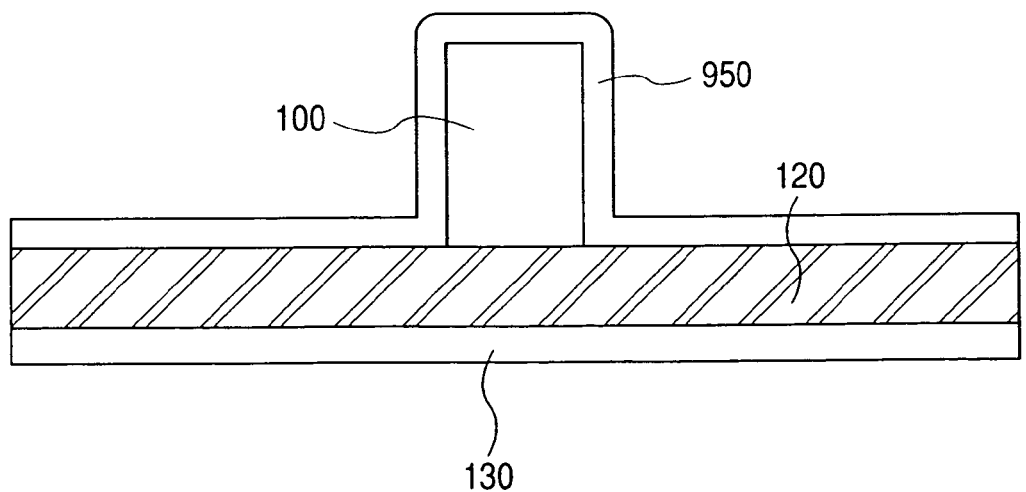
Figure 60A:
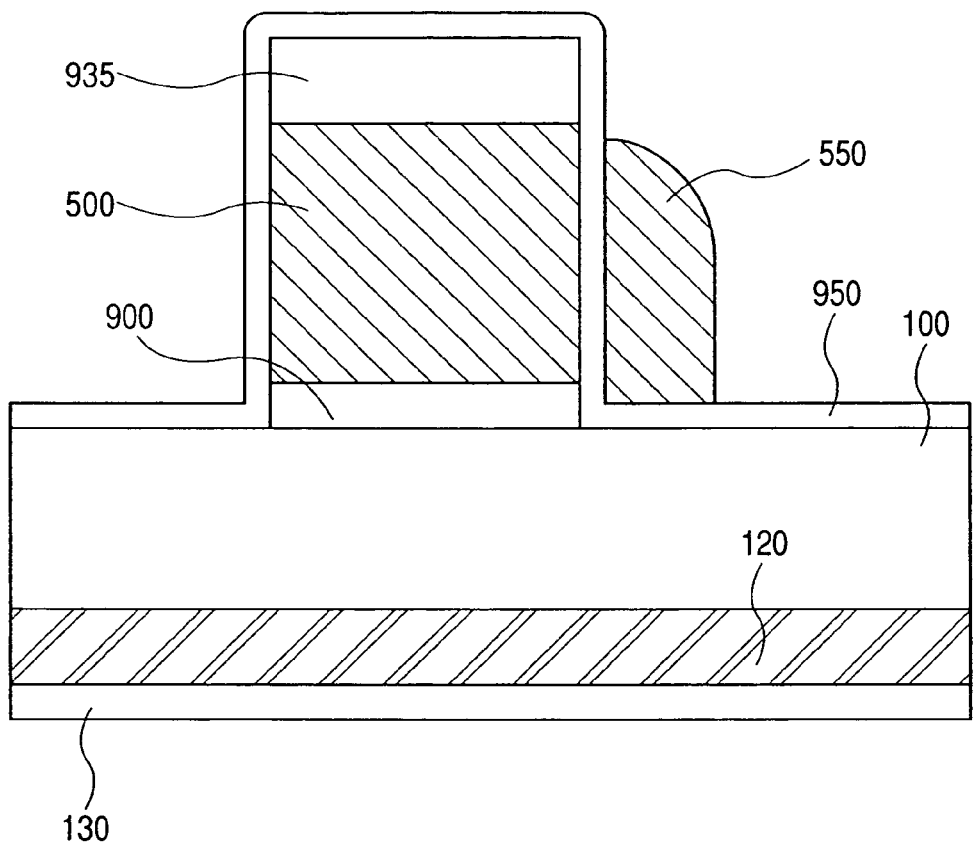
Figure 60B:
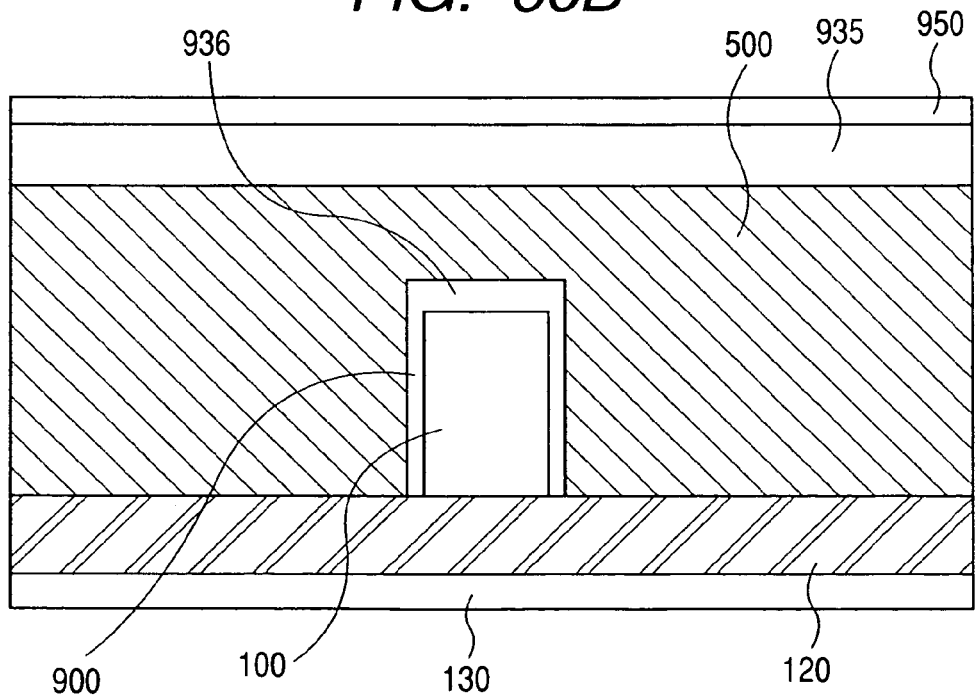
Figure 60C:
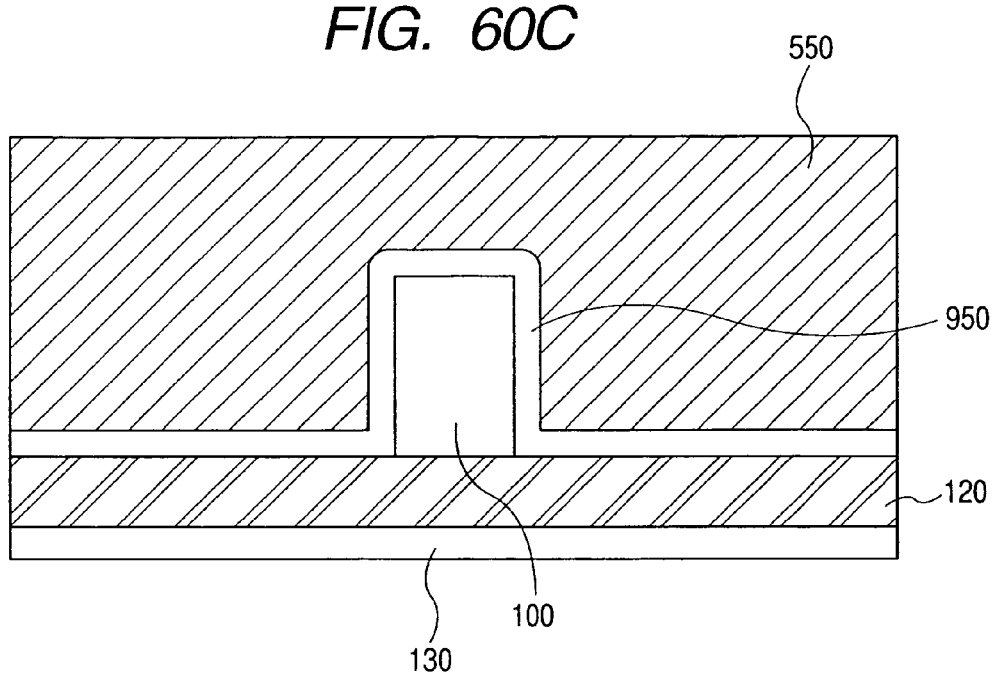
Figure 61A:
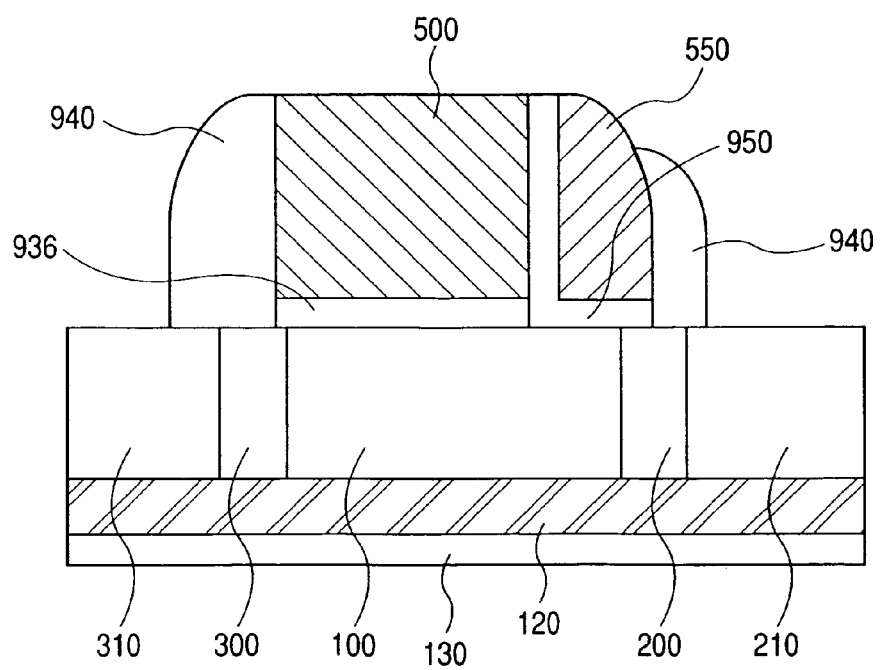
Figure 61B:
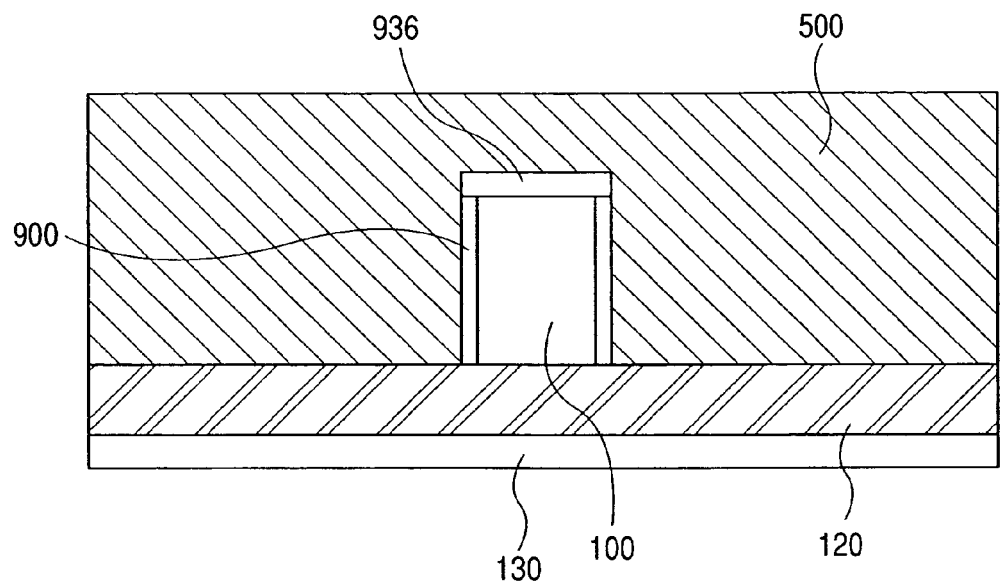
Figure 61C:
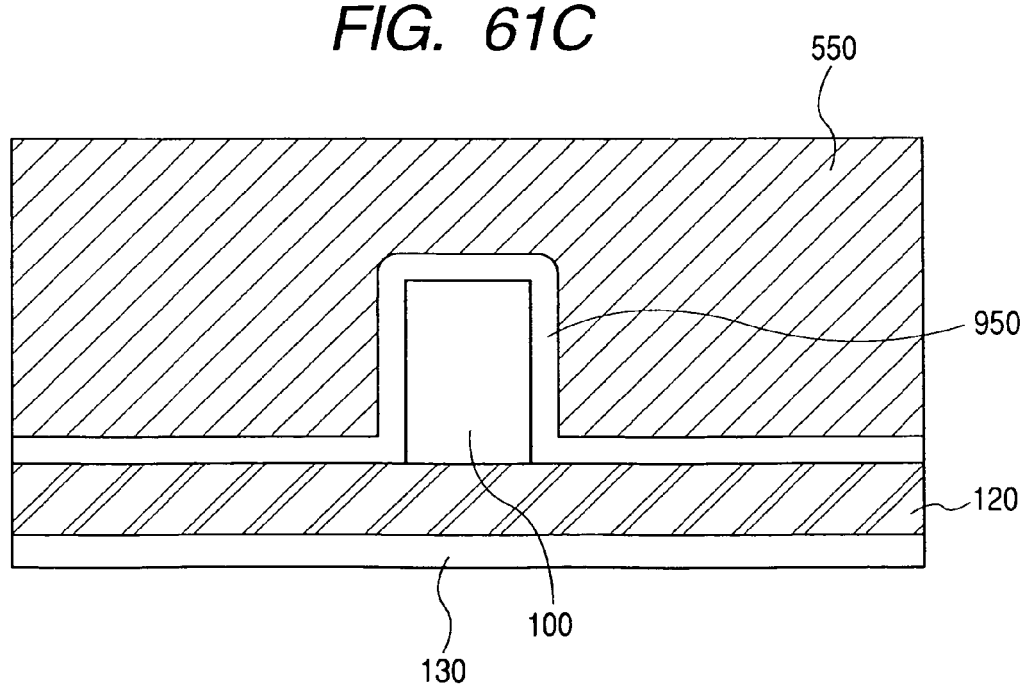
Figure 62:
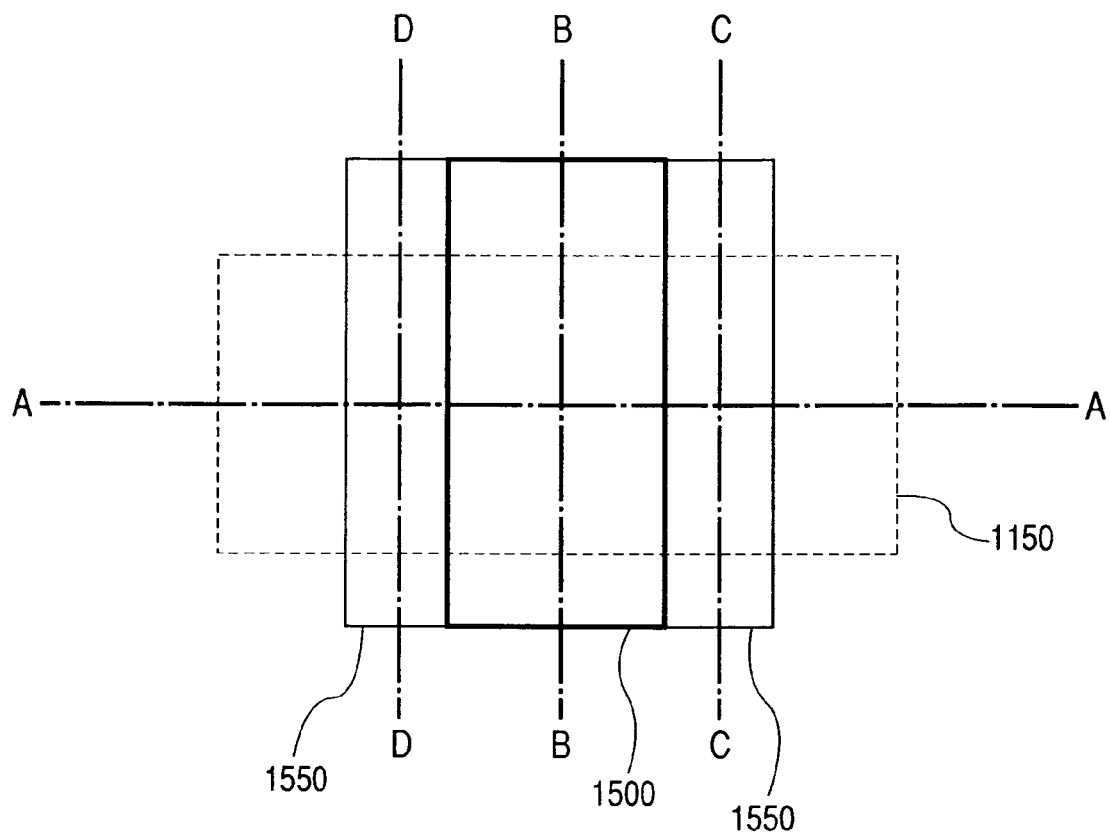
Figure 63A:
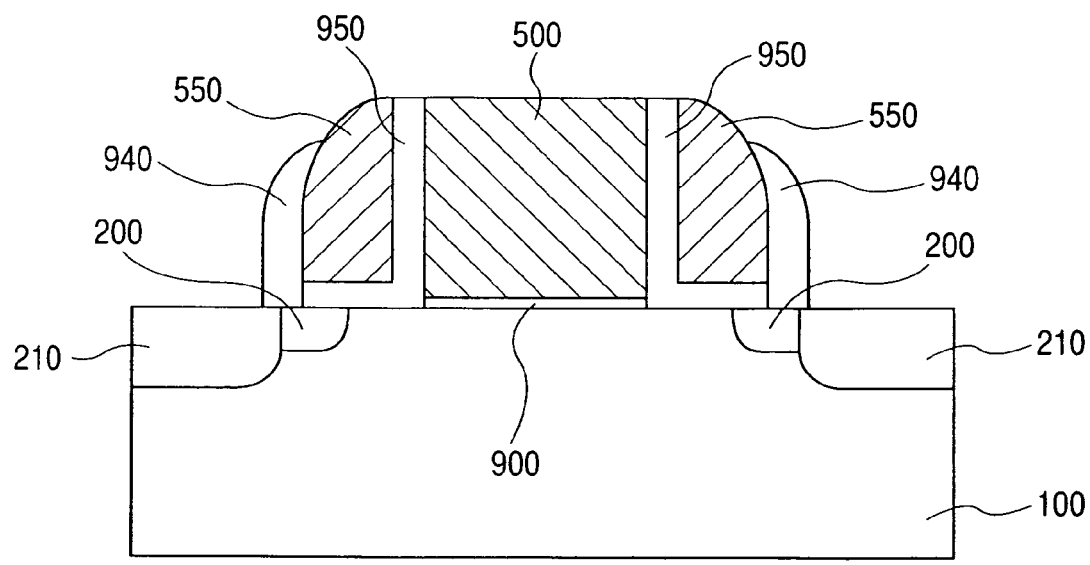
Figure 63B:
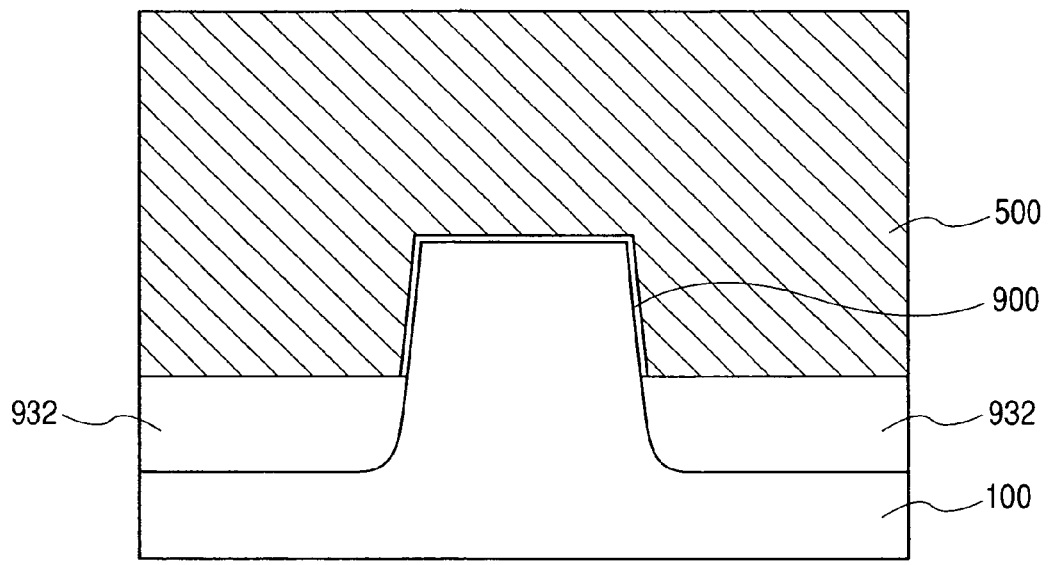
Figure 63C:
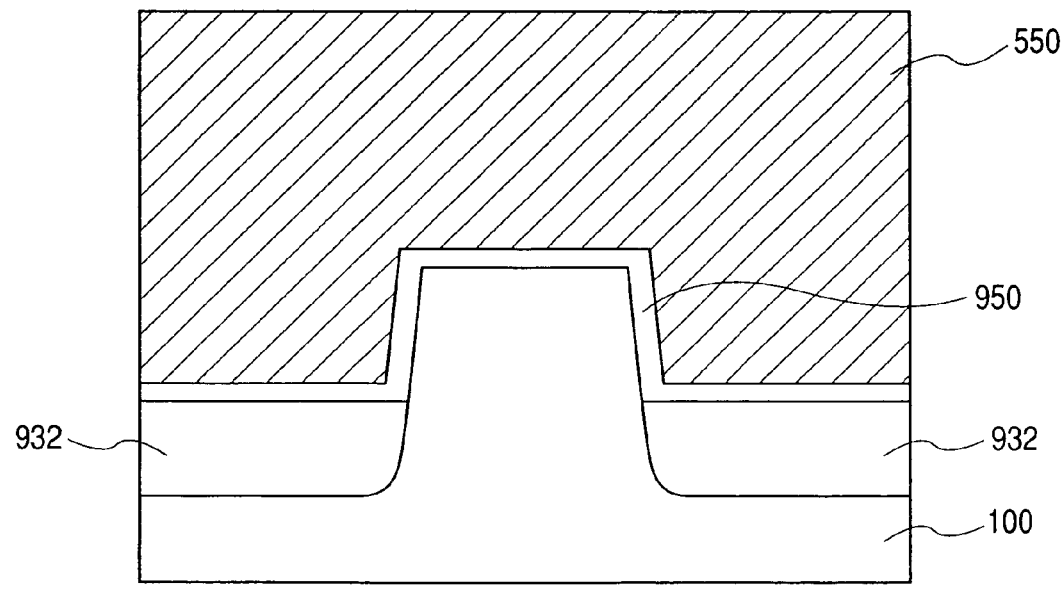
Figure 64A:
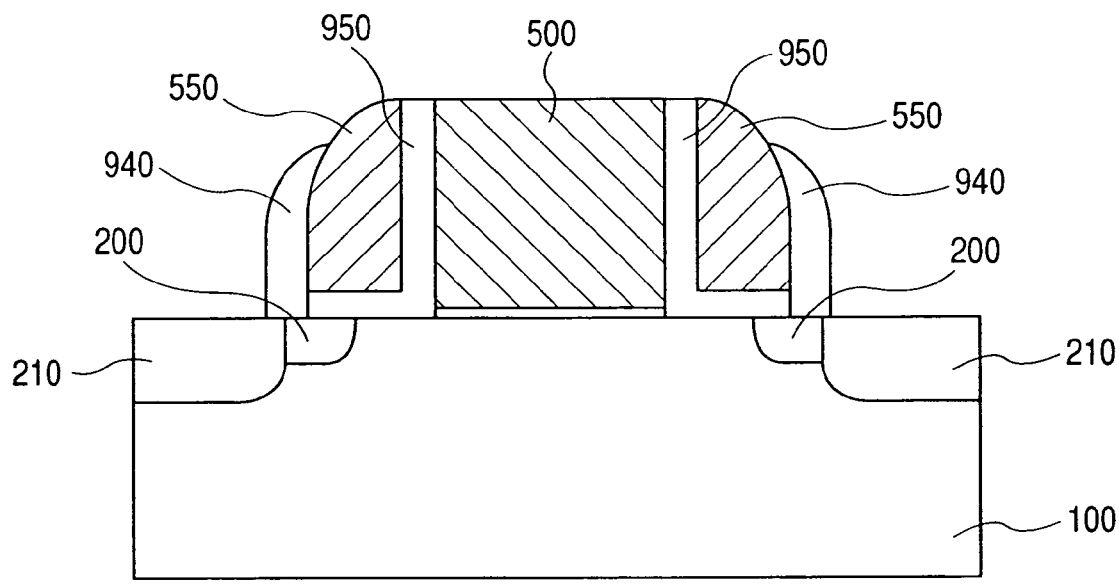
Figure 64B:
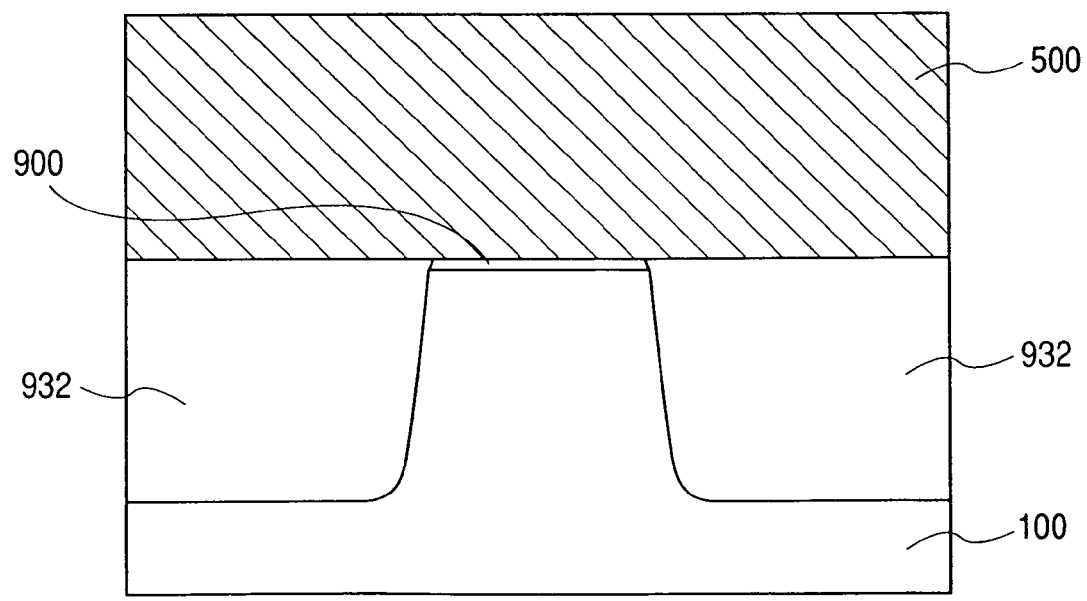
Figure 64C:
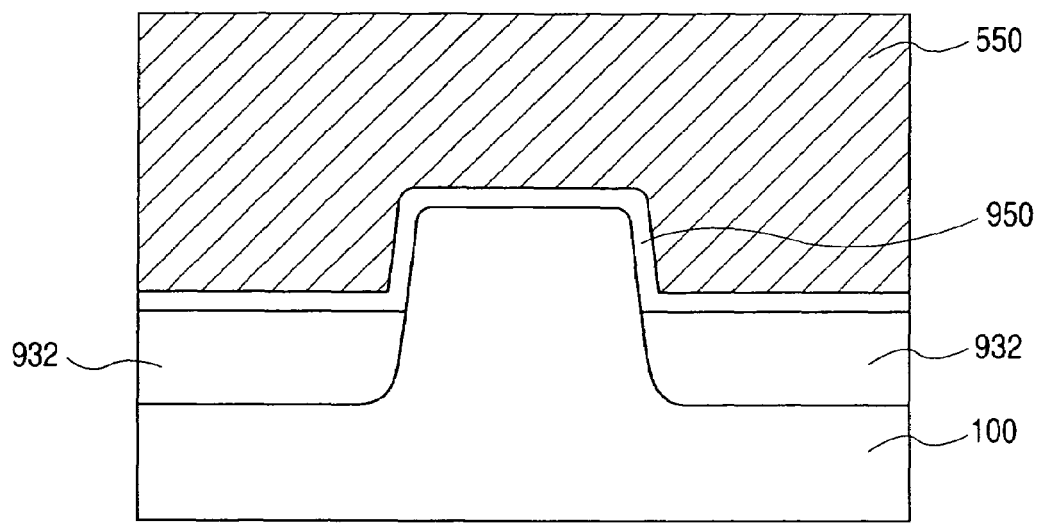
Figure 65:
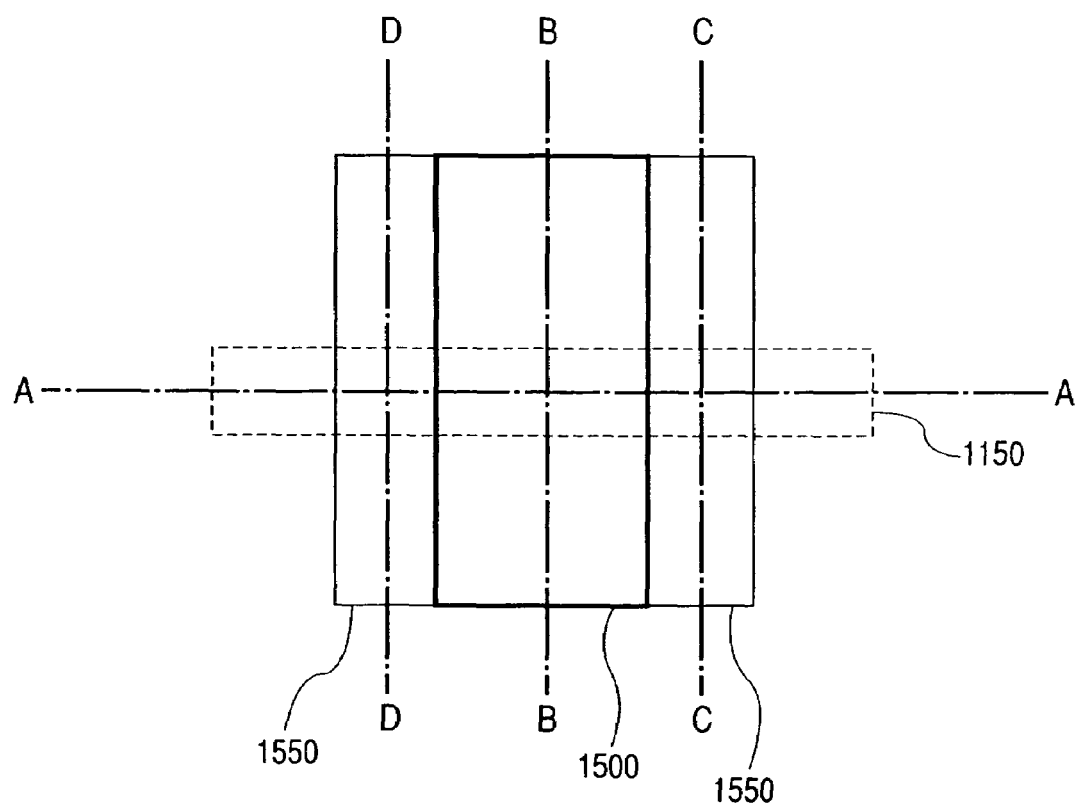
Figure 66A:
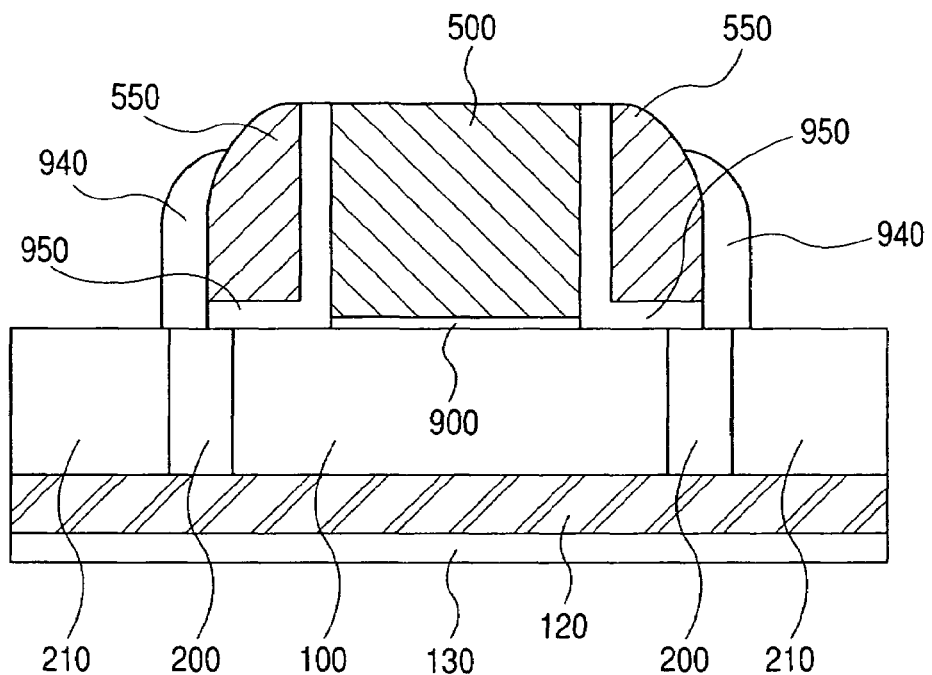
Figure 66B:
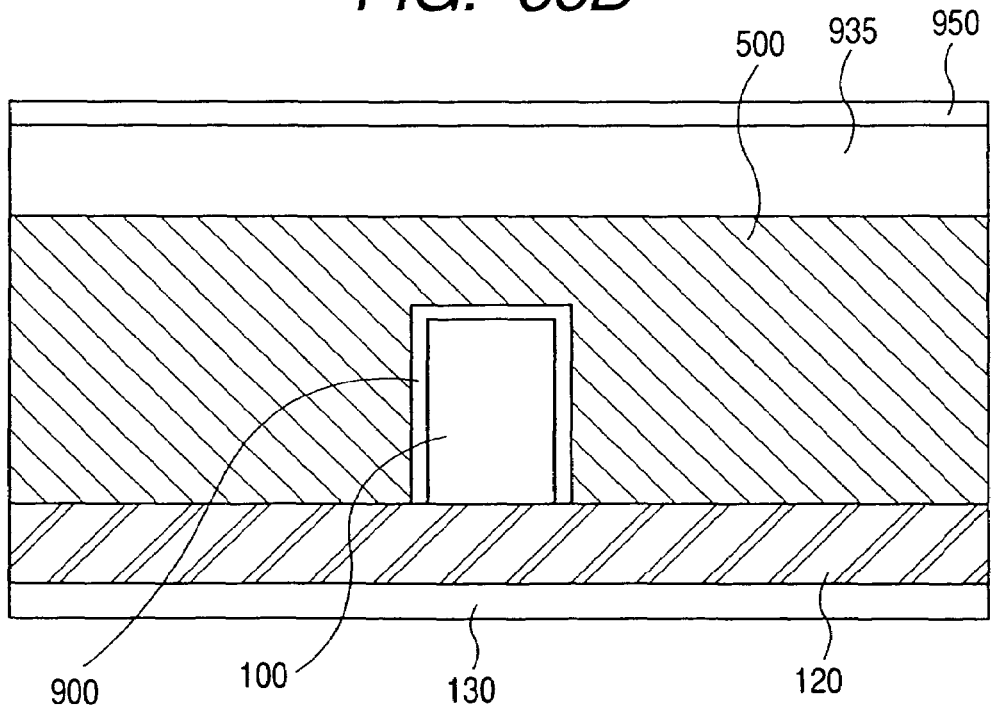
Figure 66C:
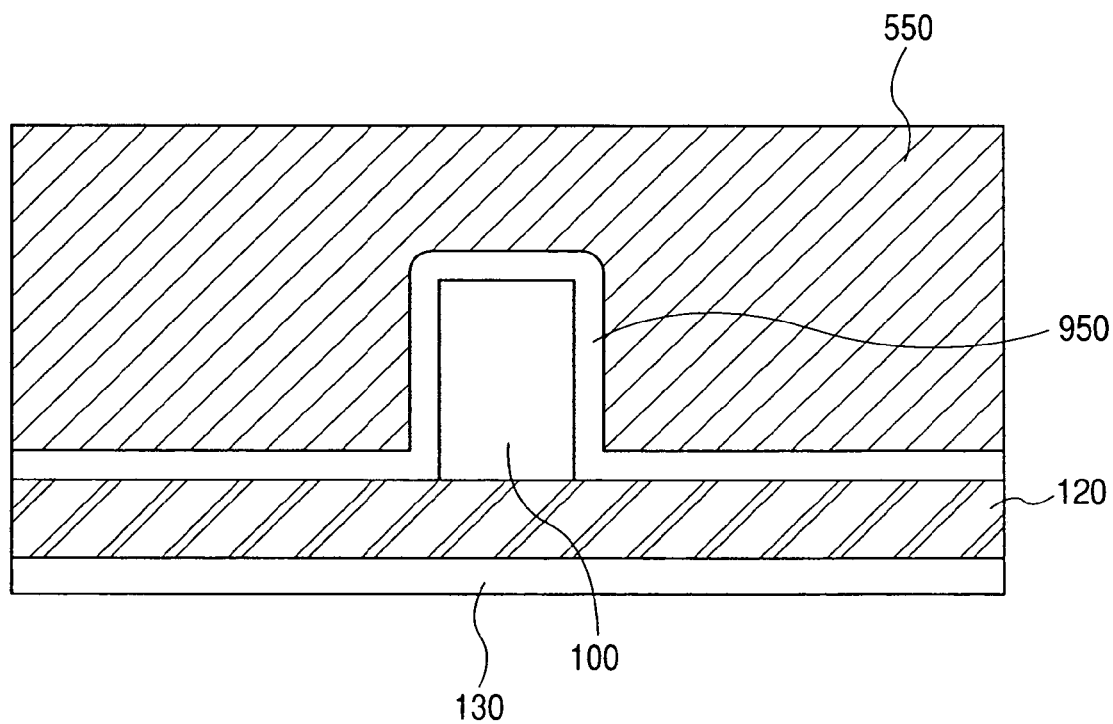

FIG. 52C is a cross-sectional structural view showing a manufacturing step of the ninth device of the present invention;

FIG. 53A is a cross-sectional structural view showing a manufacturing step of the ninth device of the present invention;

FIG. 53B is a cross-sectional structural view showing the manufacturing step of the ninth device of the present invention;

FIG. 53C is a cross-sectional structural view showing the manufacturing step of the ninth device of the present invention;

FIG. 54A is a cross-sectional structural view showing a manufacturing step of the ninth device of the present invention;

FIG. 54B is a cross-sectional structural view showing the manufacturing step of the ninth device of the present invention;

FIG. 54C is a cross-sectional structural view showing the manufacturing step of the ninth device of the present invention;

FIG. 55A is a cross-sectional structural view showing a manufacturing step of the ninth device of the present invention;

FIG. 55B is a cross-sectional structural view showing the manufacturing step of the ninth device of the present invention;

FIG. 55C is a cross-sectional structural view showing the manufacturing step of the ninth device of the present invention;

FIG. 56A is a cross-sectional structural view showing a manufacturing step of the ninth device of the present invention;

FIG. 56B is a cross-sectional structural view showing the manufacturing step of the ninth device of the present invention;

FIG. 56C is a cross-sectional structural view showing the manufacturing step of the ninth device of the present invention;

FIG. 57A is a cross-sectional structural view showing a manufacturing step of the tenth device of the present invention;

FIG. 57B is a cross-sectional structural view showing the manufacturing step of the tenth device of the present invention;

FIG. 57C is a cross-sectional structural view showing the manufacturing step of the tenth device of the present invention;

FIG. 58A is a cross-sectional structural view showing a manufacturing step of the tenth device of the present invention;

FIG. 58B is a cross-sectional structural view showing the manufacturing step of the tenth device of the present invention;

FIG. 58C is a cross-sectional structural view showing the manufacturing step of the tenth device of the present invention;

FIG. 59A is a cross-sectional structural view showing a manufacturing step of the tenth device of the present invention;

FIG. 59B is a cross-sectional structural view showing the manufacturing step of the tenth device of the present invention;

FIG. 59C is a cross-sectional structural view showing the manufacturing step of the tenth device of the present invention;

FIG. 60A is a cross-sectional structural view showing a manufacturing step of the tenth device of the present invention;

FIG. 60B is a cross-sectional structural view showing the manufacturing step of the tenth device of the present invention;

FIG. 60C is a cross-sectional structural view showing the manufacturing step of the tenth device of the present invention;

FIG. 61A is a cross-sectional structural view showing a manufacturing step of the tenth device of the present invention;

FIG. 61B is a cross-sectional structural view showing the manufacturing step of the tenth device of the present invention;

FIG. 61C is a cross-sectional structural view showing the manufacturing step of the tenth device of the present invention;

FIG. 62 is a plan view for explaining the layout of a memory cell;

FIG. 63A is a cross-sectional structural view showing another device structure of the present invention;

FIG. 63B is a cross-sectional structural view showing the another device structure of the present invention;

FIG. 63C is a cross-sectional structural view showing the another device structure of the present invention;

FIG. 64A is a cross-sectional structural view showing a further device structure of the present invention;

FIG. 64B is a cross-sectional structural view showing the further device structure of the present invention;

FIG. 64C is a cross-sectional structural view showing the further device structure of the present invention;

FIG. 65 is a plan view for explaining a memory cell layout;

FIG. 66A is a cross-sectional structural view showing a still further device structure of the present invention;

FIG. 66B is a cross-sectional structural view showing the still further device structure of the present invention;

FIG. 66C is a cross-sectional structural view showing the still further device structure of the present invention.

DETAILED DESCRIPTION OF THE PREFERRED EMBODIMENTS

First Embodiment

The present invention will hereinafter be described in detail with reference to examples of the present invention. First, the formation method and the structure of the present invention will be described, mainly based on a memory cell which will be an essential portion of the present invention.

Figure 2:
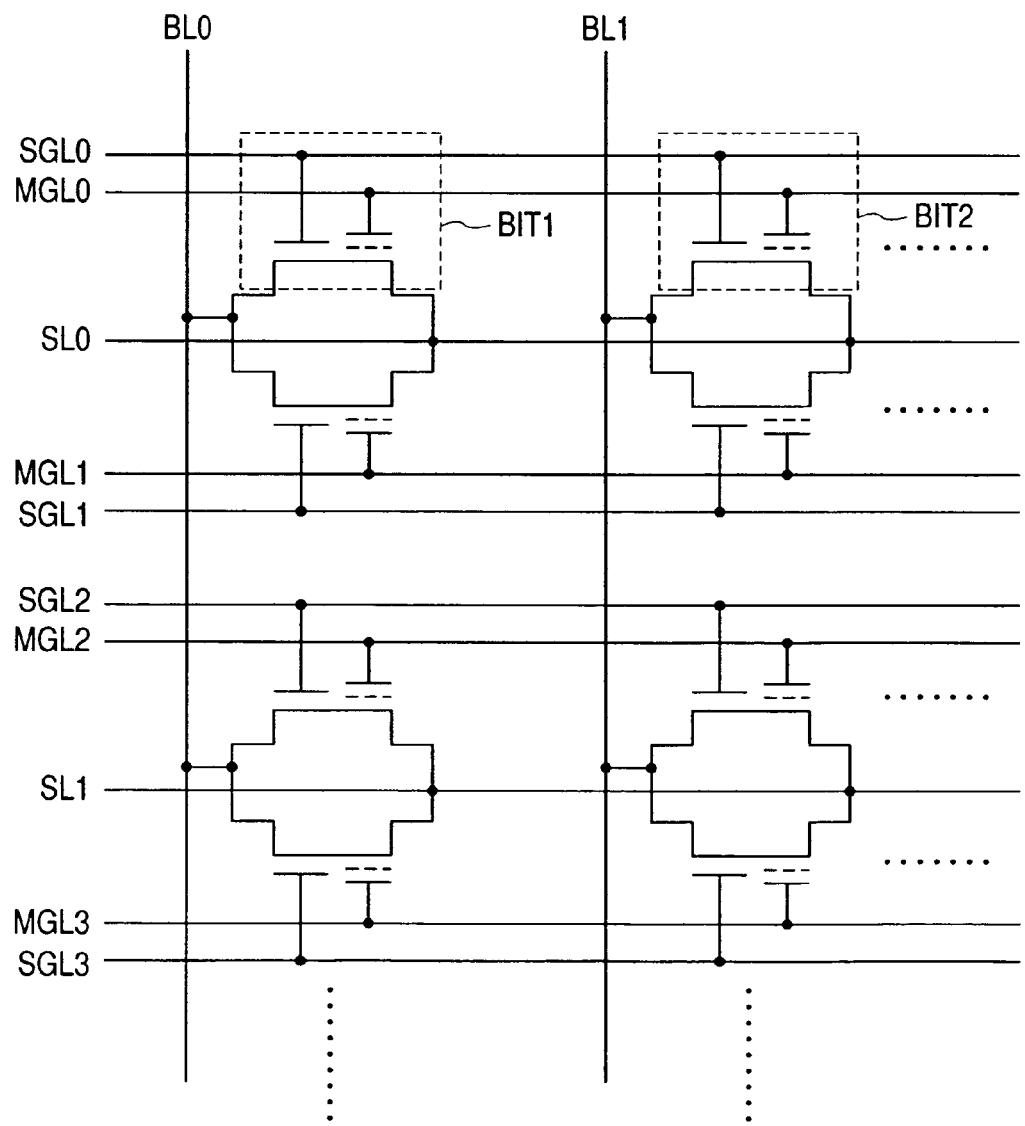
FIG. 2 is an equivalent circuit diagram for explaining a memory cell array.

An equivalent circuit of a memory array composed of memory cells of the present invention is illustrated in FIG. 2. Eight bit cells such as those common in word line (SGL) are illustrated in it. An array is formed by repeating them. In this drawing, eight memory cells (such as BIT1 and BIT2) are arranged, while bit lines (BL0, BL1), word lines (SGL0, SGL1, SGL2, SGL3) intersecting therewith, and lines (memory gate lines will hereinafter be abbreviated as MGL0, MGL1, MGL2 and MGL3) connected to memory gates are arranged. SL0 and SL1 are source lines.

Figure 3:
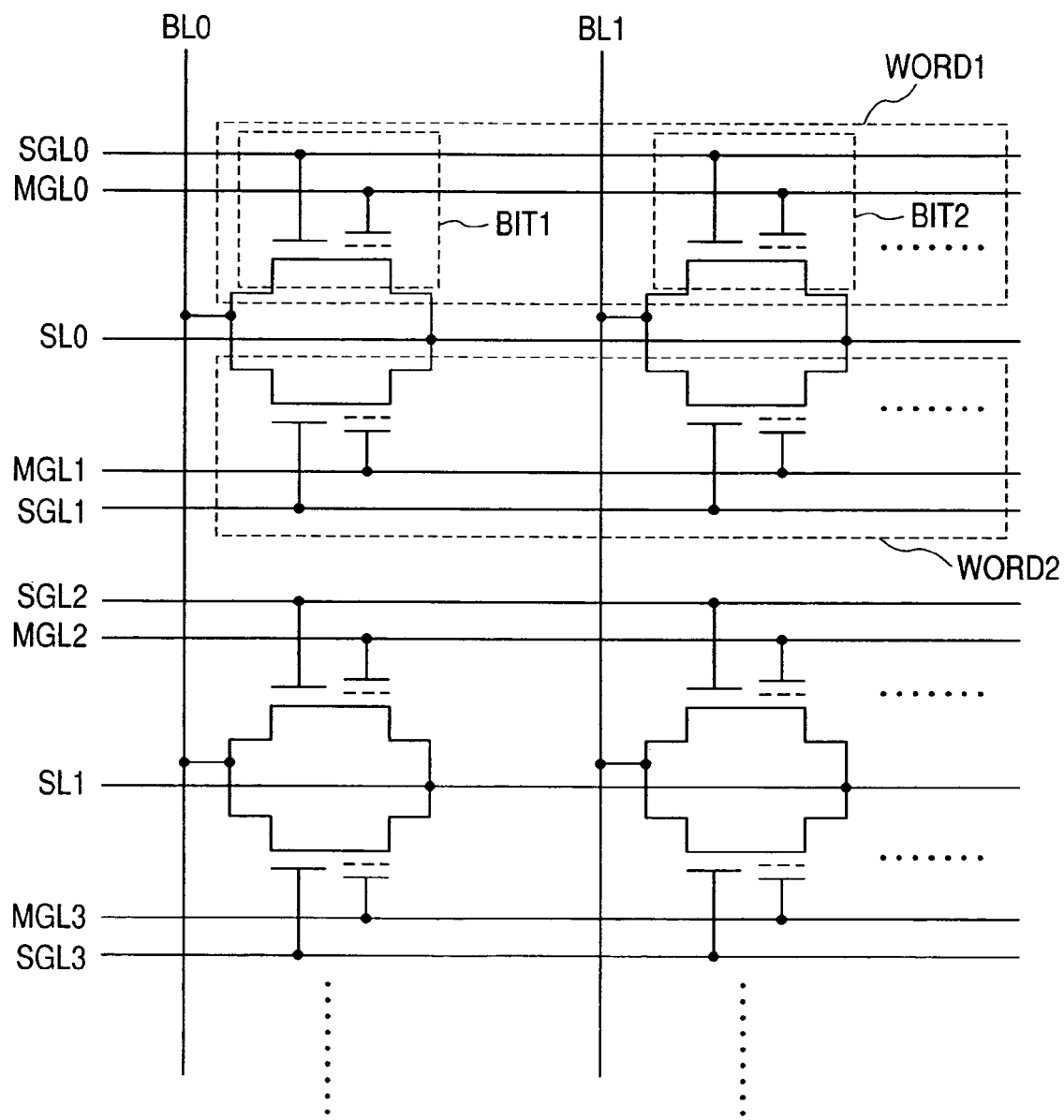
FIG. 3 is an equivalent circuit diagram for explaining the memory cell array.
Figure 4:
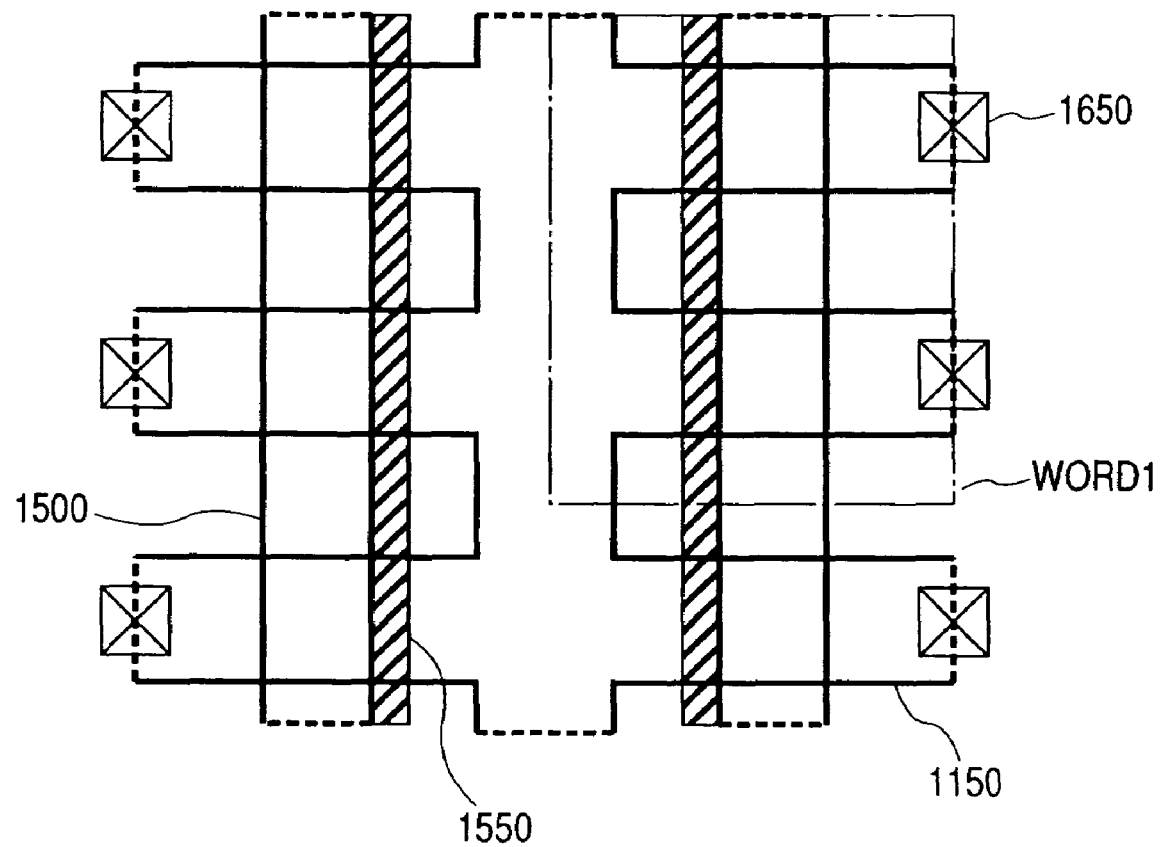
FIG. 4 is a plan view for explaining the memory cell layout.

FIGS. 3 and 4 are an equivalent circuit diagram and a plan view (layout) on a semiconductor substrate for actualizing this memory array, respectively. In this plan view, only an active region 1150, select gate 1500, memory gate 1550 and contact arrangement 1650 are illustrated to explain the cell arrangement. It is a view only for describing the arrangement and as will be described in a later formation step, the memory gate can be formed in self alignment so that a mask as illustrated in the formation step is not necessary. A region surrounded by a dashed line is a 2-bit region corresponding to WORD1 of the equivalent circuit diagram. According to the equivalent circuit diagram of FIG. 3, pairs of a select gate 1500 and a memory gate 1550 are arranged on right and left sides with a bit line BL1 as a center.

Figure 5:
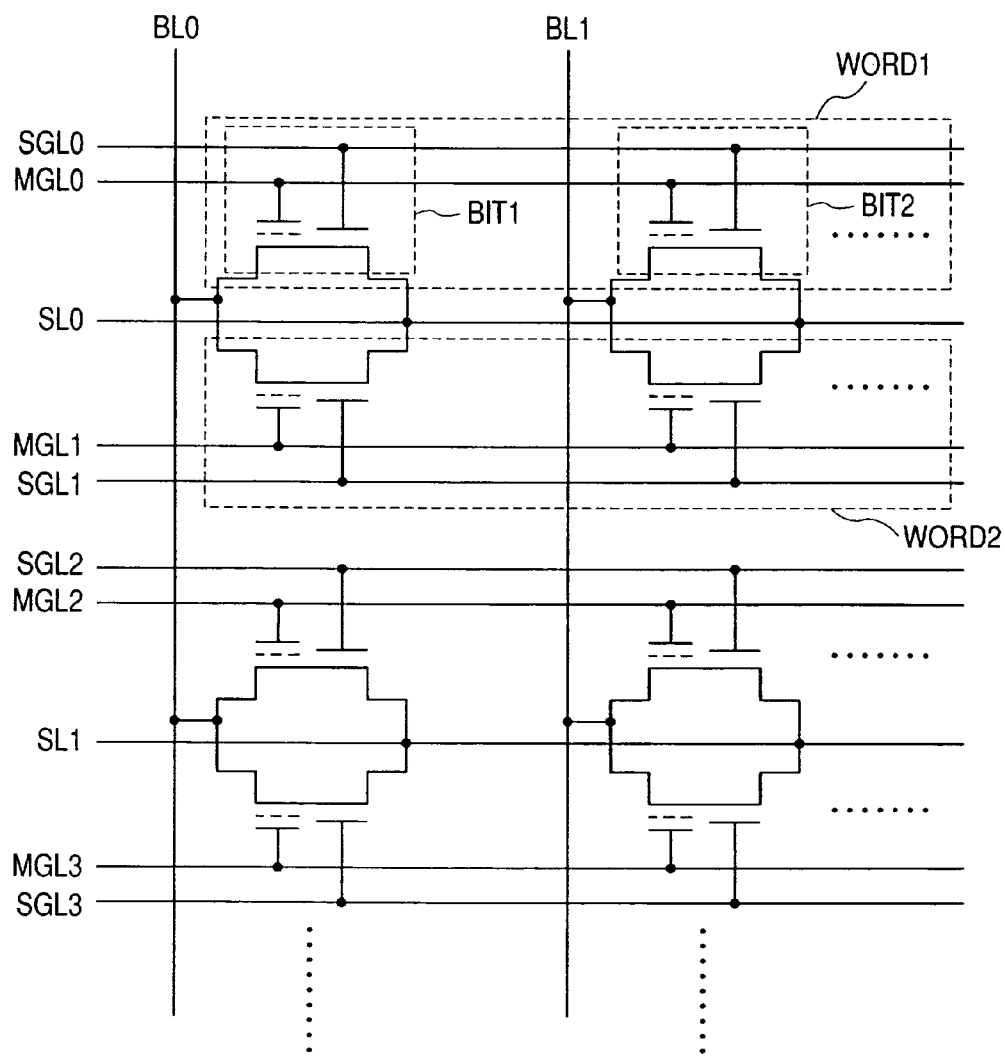
FIG. 5 is an equivalent circuit diagram for explaining a memory cell array.
Figure 6:
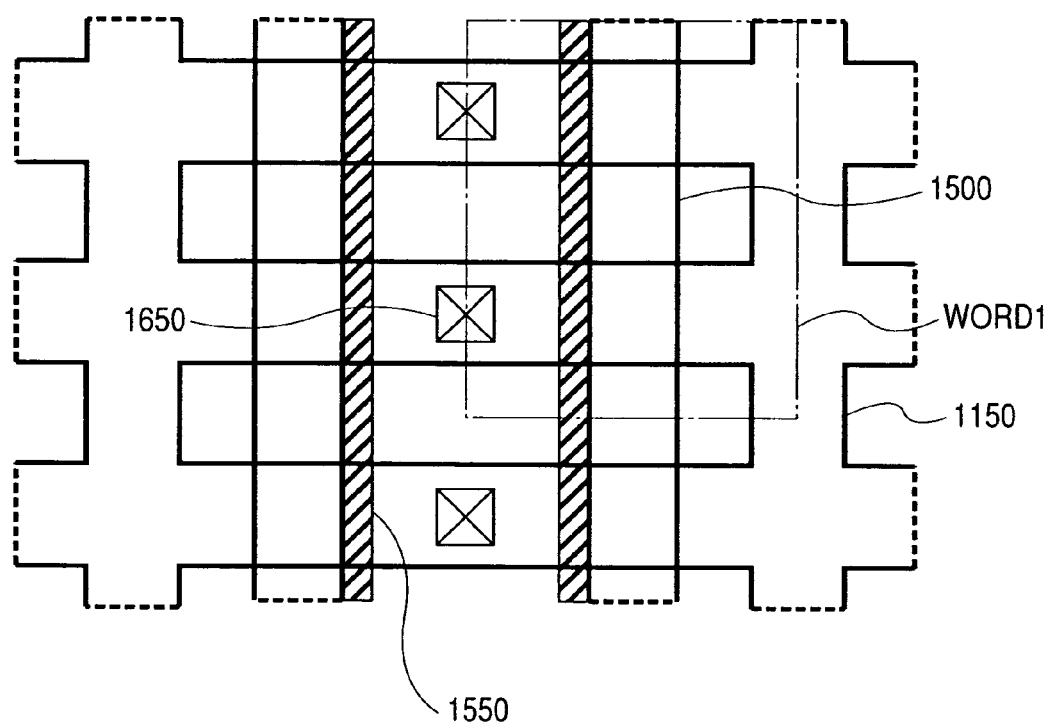
FIG. 6 is a plan view for explaining the memory cell layout.
Figure 7:
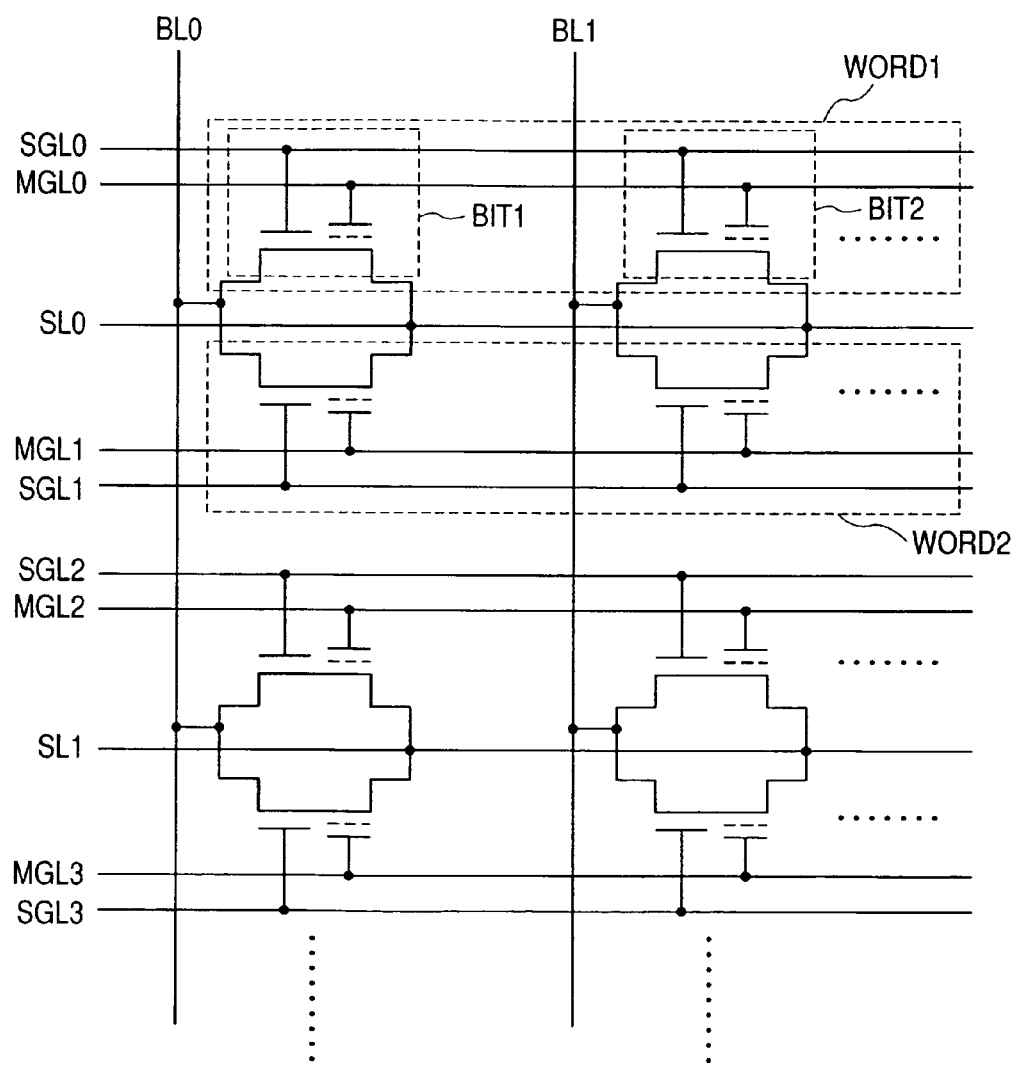
FIG. 7 is an equivalent circuit diagram for explaining a memory cell array.
Figure 8:
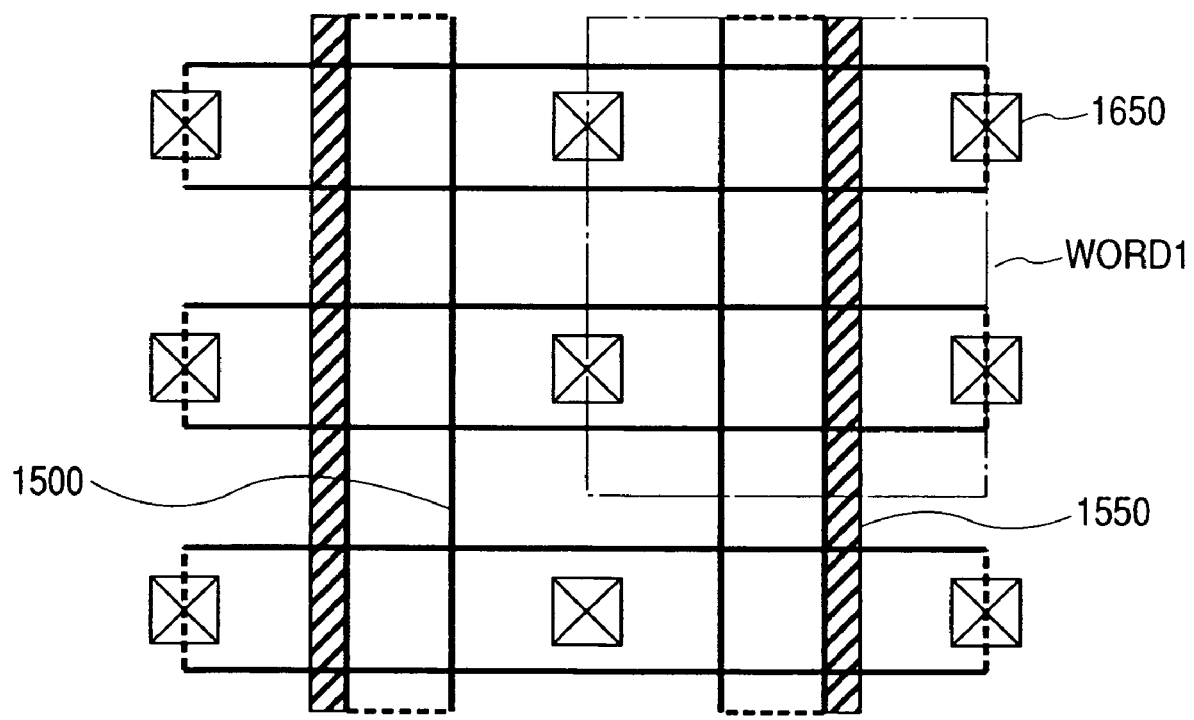
FIG. 8 is a plan view for explaining the memory cell layout.

FIGS. 5 and 6 are also an equivalent circuit diagram and plan view of a layout of a memory cell which is similar to the above-described one but has the memory gate and select gate interchanged each other. FIGS. 7 and 8 illustrate an example in which diffusion layers of all the memory cells are equipped with a contact. In this example, the active region can be formed in stripes.

Figure 9:
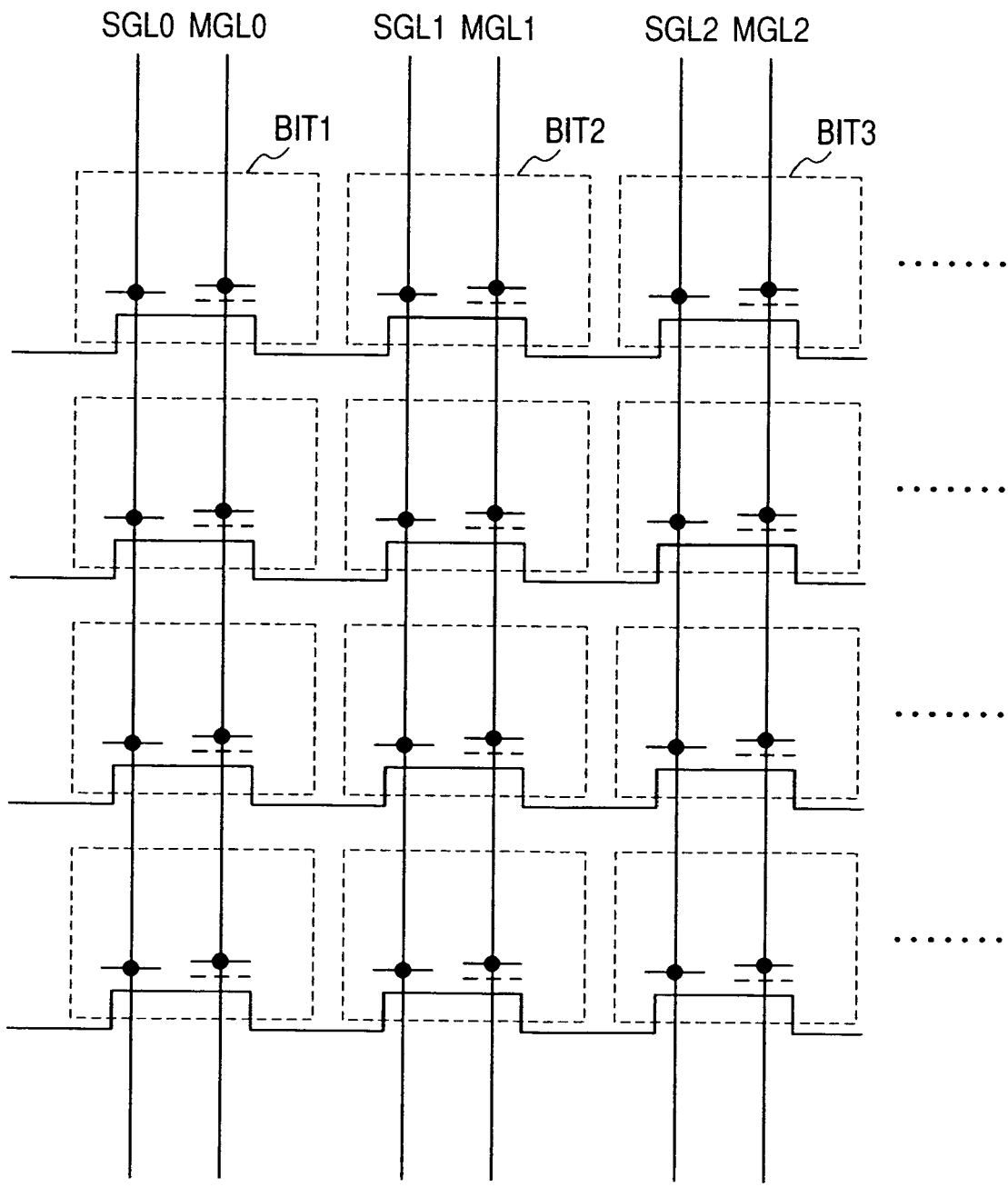
FIG. 9 is an equivalent circuit diagram for explaining a memory cell array.
Figure 10:
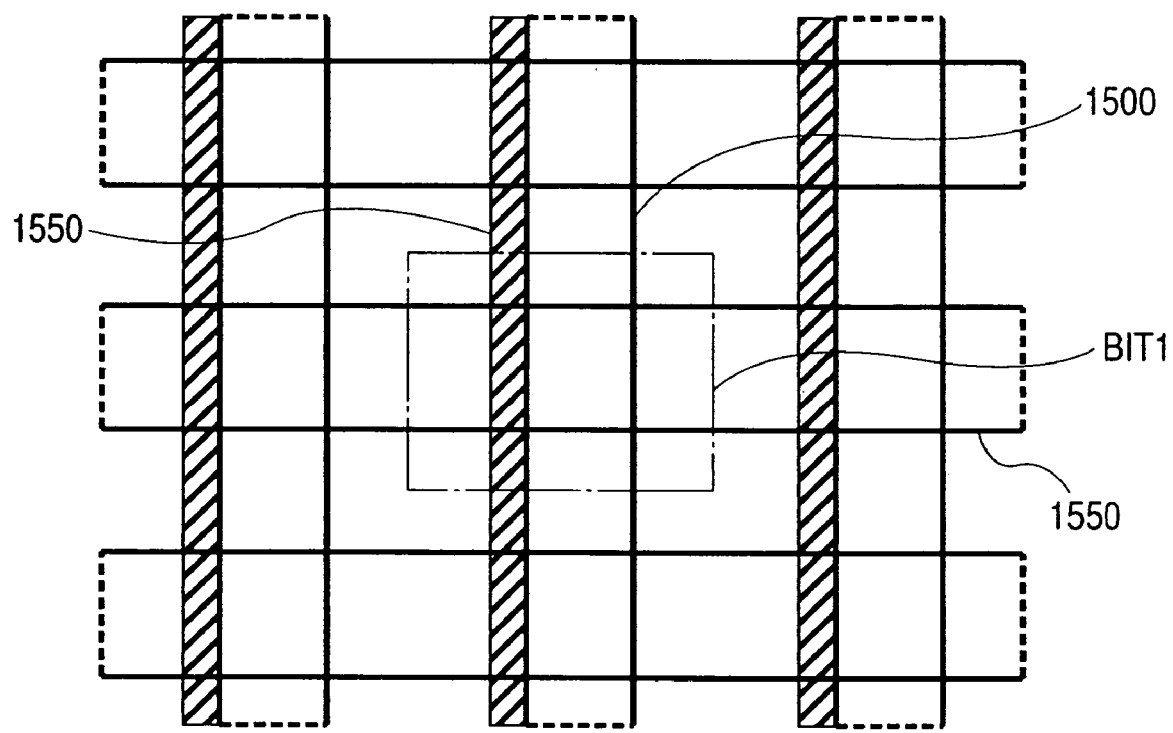
FIG. 10 is a plan view for explaining the memory cell layout.

FIGS. 9 and 10 illustrate an example in which memory cells are stacked vertically one after another and they are an equivalent circuit diagram and a plan view of their layout, respectively. In FIG. 10, arrangement of the select gate 1500 and memory gate 1550 of a BIT1 portion in FIG. 9 is illustrated. The memory cell array of this example is formed by repetition of 1-bit cell.

Various forms of a memory cell are illustrated above. They have however a similar constitution in a fundamental unit composed of a select gate and a memory gate. A formation process of a memory cell having a basic structure as illustrated in FIG. 11 will next be described.

Figure 11:
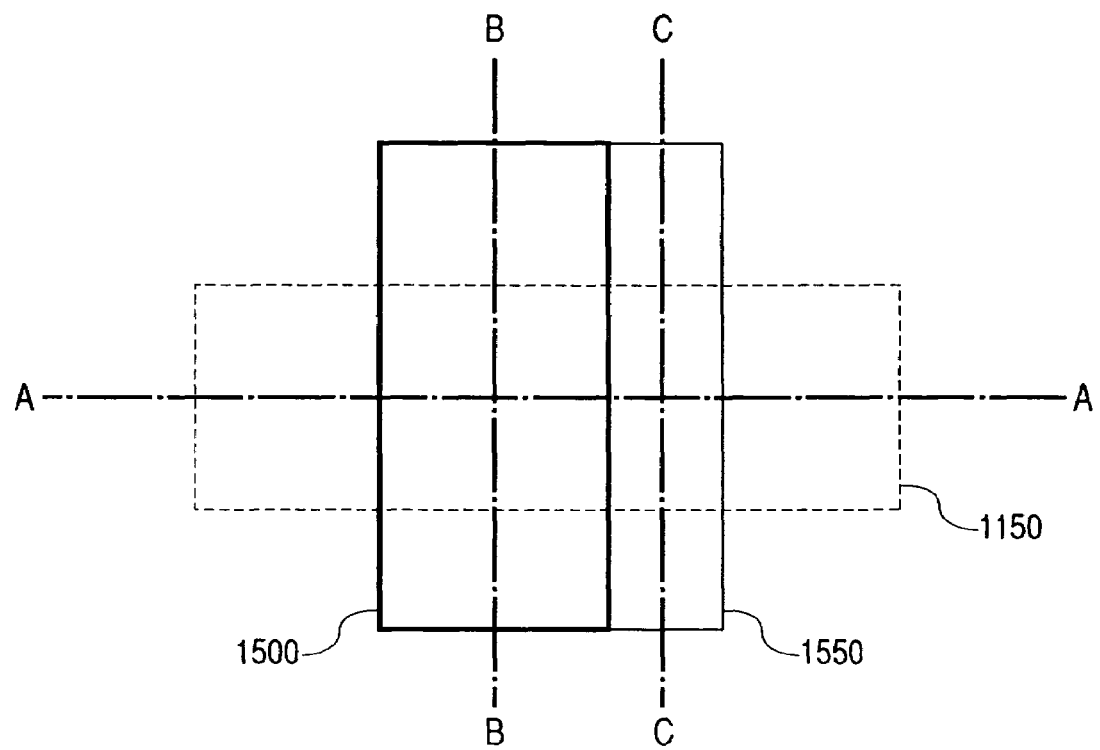
FIG. 11 is a plan view for explaining a memory cell structure.
Figure 12:
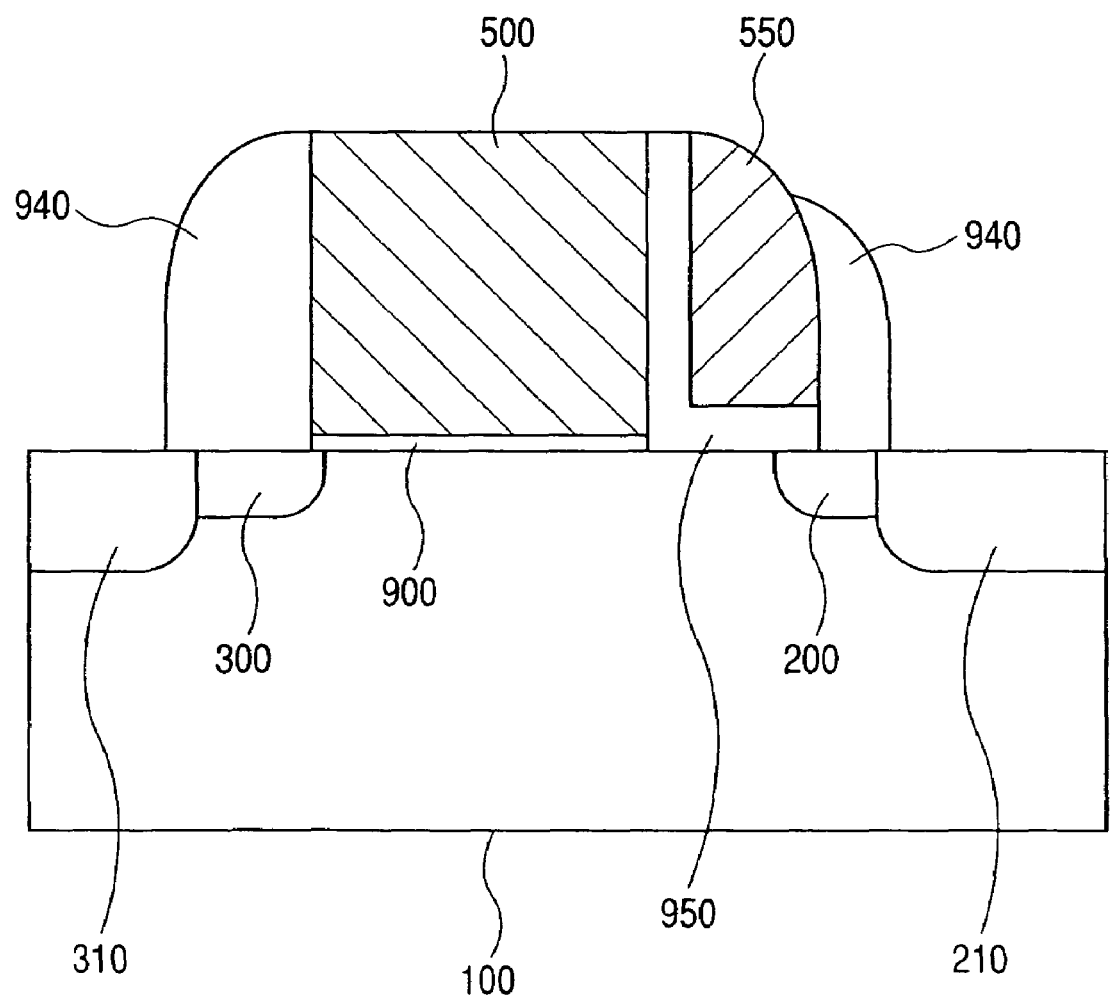
FIG. 12 is a cross-sectional structural view showing the device structure of the present invention.

The cross-sectional structure of a memory cell formed in accordance with the layout of FIG. 11 is shown in FIG. 12. As can be seen from the plan view of FIG. 11, it has a select gate 1500 and a memory gate 1550 juxtaposed over an active region 1150. A realized example of such a constitution is shown in FIG. 12. A select gate 500 and a memory gate 550 are formed over a semiconductor substrate 100 via gate insulating films 900 and 950. A side surface spacer 940 is formed over one of the sidewalls of each of the select gate 500 and memory gate 550. The select gate 500 and memory gate 550 are insulated by an extending portion of the gate insulating film 950. A portion indicated by numeral 950 is a charge retaining portion and it has, for example, a silicon dioxide film, a silicon nitride film and a silicon dioxide film stacked one after another. In this diagram, respective stacked films constituting this film stack structure are omitted. On the memory gate side, diffusion layers 200 and 210 are formed. For facilitating understanding, these diffusion layers are called "source". Diffusion layers 300 and 310 are formed on the select gate side. These diffusion layers are called "drain". In this example, the diffusion layer 210 and the diffusion layer 310 are formed in self alignment with the side surface spacer 940.

FIG. 13A to FIG. 20C are schematic cross-sectional views illustrating the semiconductor device according to first embodiment of the present invention in the order of its manufacturing steps. In these drawings, the cross-section (A-A cross-section) in a channel direction of FIG. 11 is illustrated each of in FIGS. 13A, 14A, 15A, 16A, 17A, 18A, 19A, and 20A, the cross-section including the select gate is illustrated in each of FIGS. 13B, 14B, 15B, 16B, 17B, 18B, 19B, and 20B, and the cross-section including the memory gate is illustrated in each of FIGS. 13C, 14C, 15C, 16C, 17C, 18C, 19C, and 20C. The manufacturing method will be described here by using a process corresponding to so-called 0.13 μm generation.

Figure 13A:
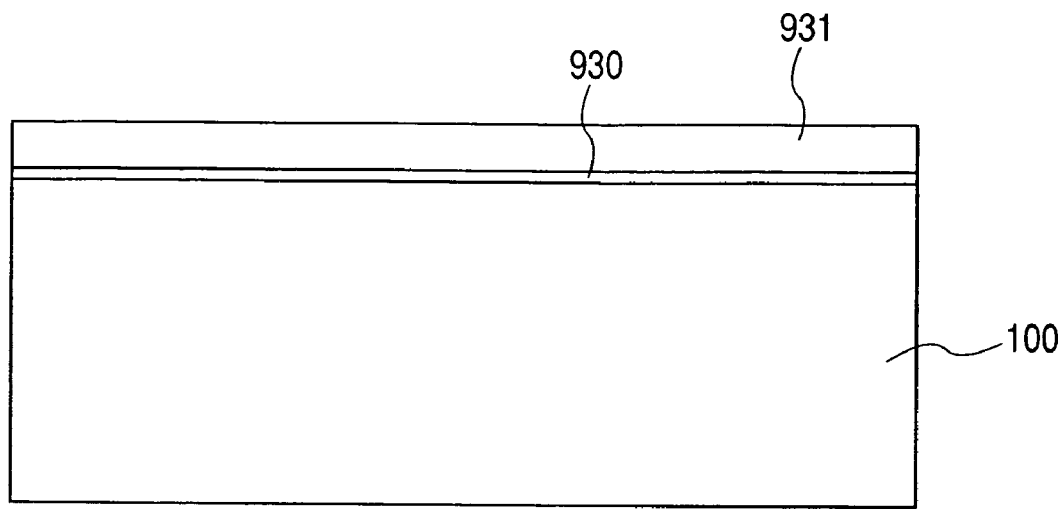
FIG. 13A is a cross-sectional structural view showing a manufacturing step of a first device of the present invention.
Figure 13B:
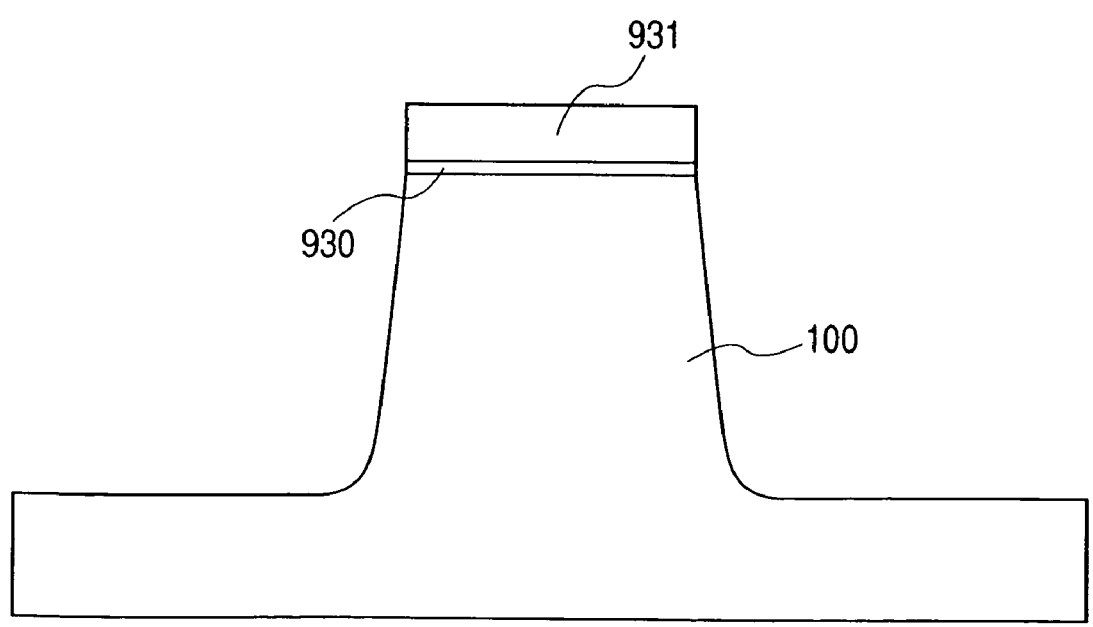
FIG. 13B is a cross-sectional structural view showing the manufacturing step of the first device of the present invention.
Figure 13C:
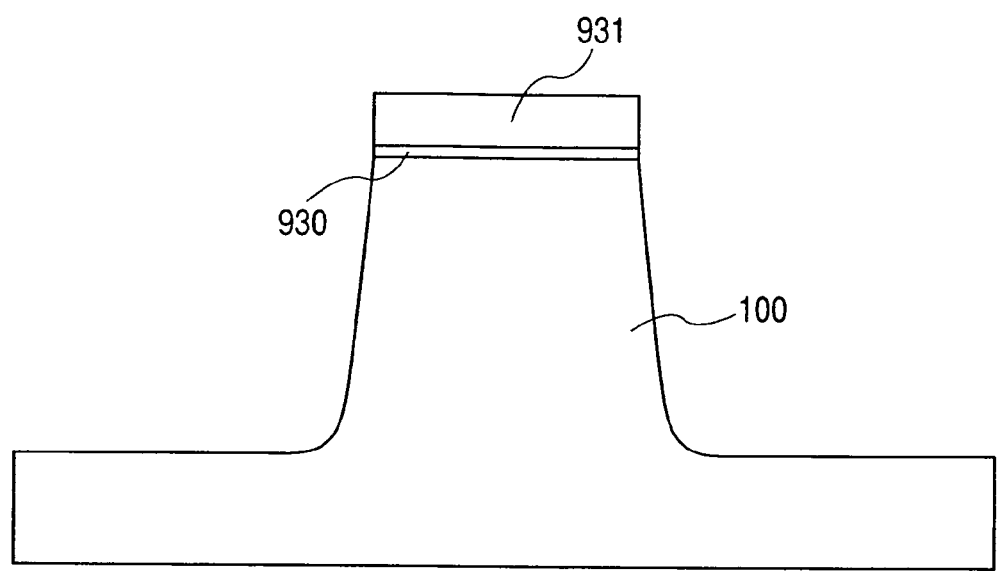
FIG. 13C is a cross-sectional structural view showing the manufacturing step of the first device of the present invention.

After formation of an oxide film 930 of 10 nm thickness over the surface of an active region of the semiconductor substrate 100, a silicon nitride film 931 is deposited to give its thickness of 100 nm by CVD. By using lithography, the film stack made of the silicon nitride film 931 and oxide film 930, and the semiconductor substrate 100 were etched by 300 mm to pattern the active region (corresponding to 1150 of FIG. 11) into a desired shape (FIGS. 13A, 13B and 13C).

Figure 14A:
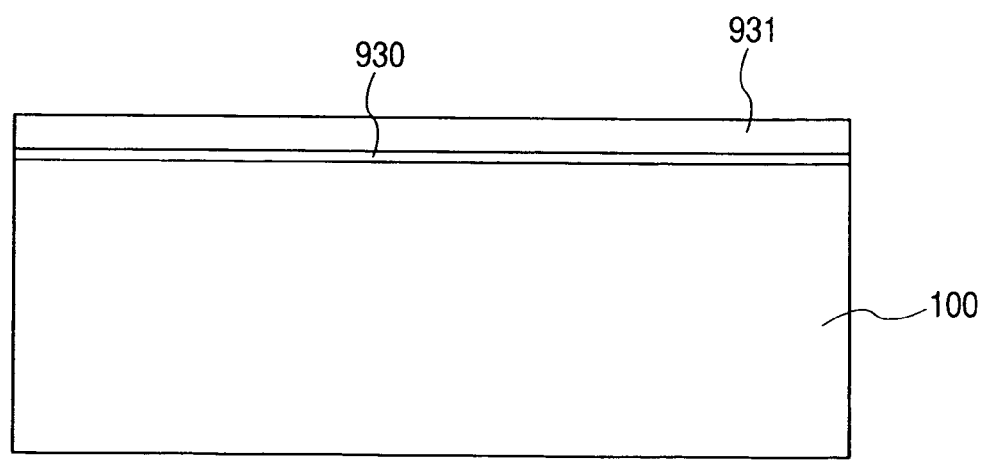
FIG. 14A is a cross-sectional structural view showing a manufacturing step of the first device of the present invention.
Figure 14B:
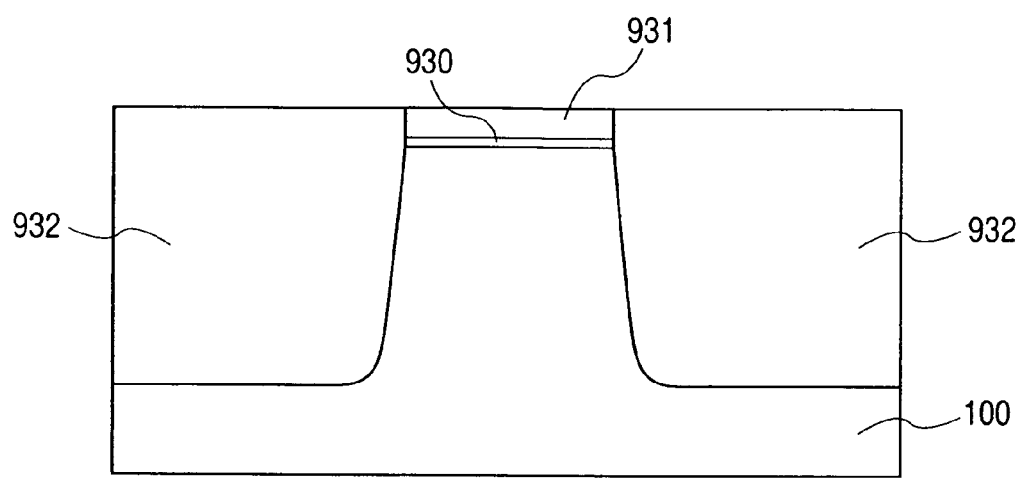
FIG. 14B is a cross-sectional structural view showing the manufacturing step of the first device of the present invention.
Figure 14C:
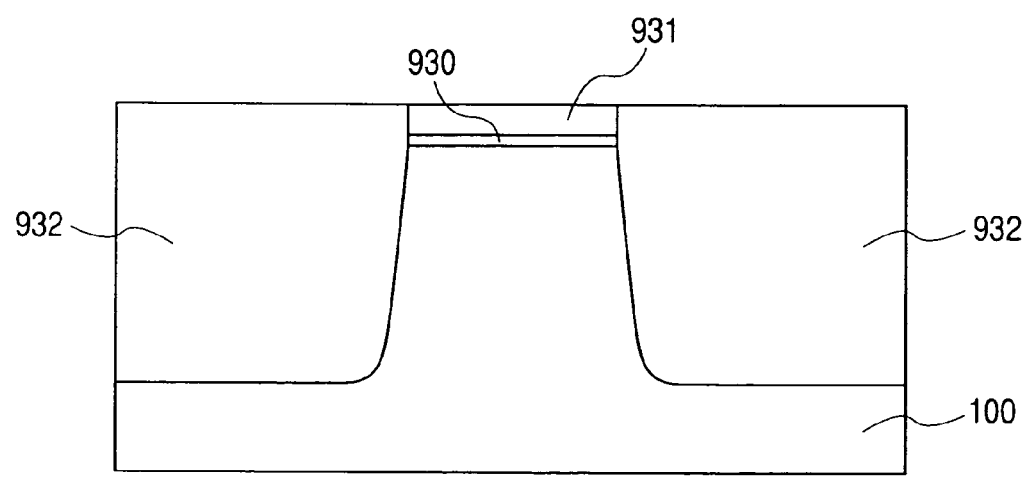
FIG. 14C is a cross-sectional structural view showing the manufacturing step of the first device of the present invention.

After the surface of the trench formed in the above step is oxidized, a silicon dioxide film 932 is deposited. The oxide film on the surface of the semiconductor substrate is omitted because it complicates the drawing. The surface of the semiconductor substrate thus prepared is subjected to chemical mechanical polishing (CMP) to complete a shallow trench isolation (STI) (FIGS. 14A, 14B and 14C).

Figure 15A:
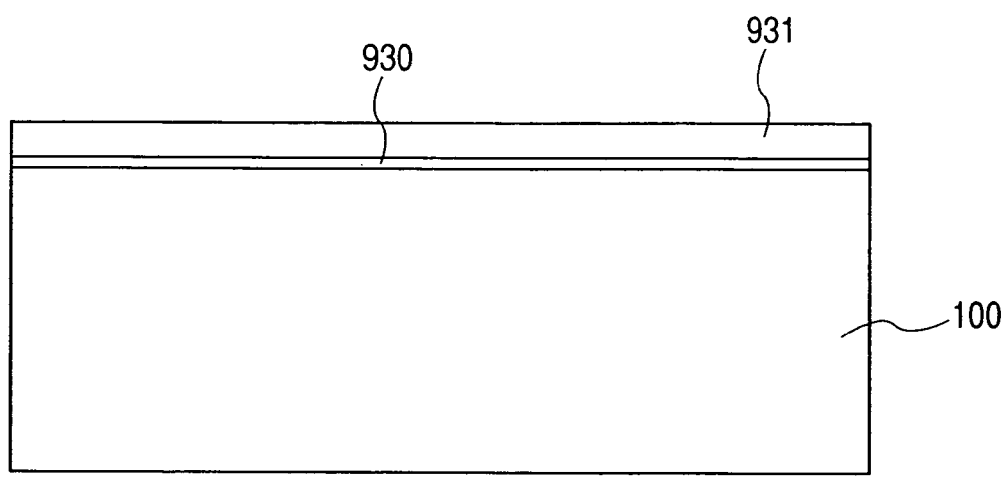
FIG. 15A is a cross-sectional structural view showing a manufacturing step of the first device of the present invention.
Figure 15B:
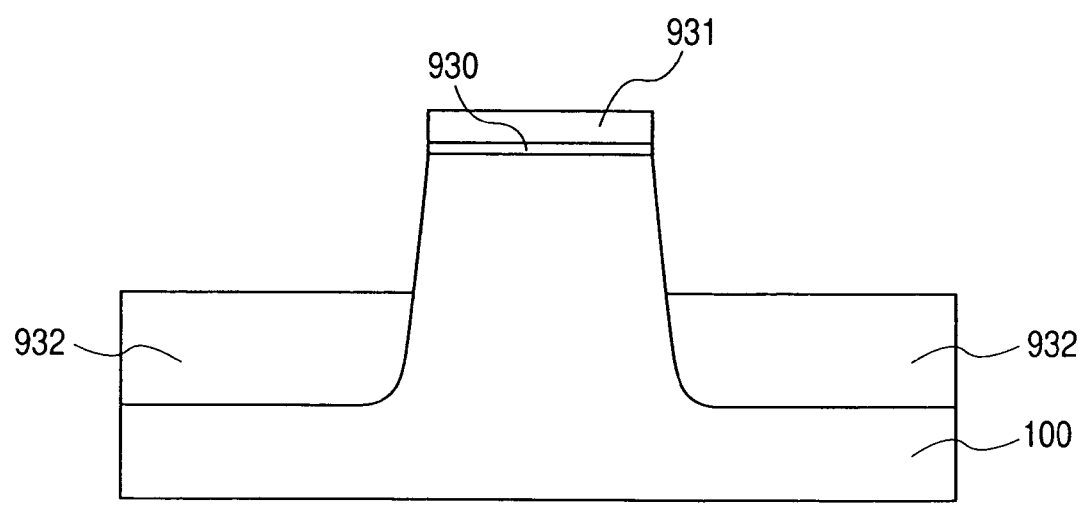
FIG. 15B is a cross-sectional structural view showing the manufacturing step of the first device of the present invention.
Figure 15C:
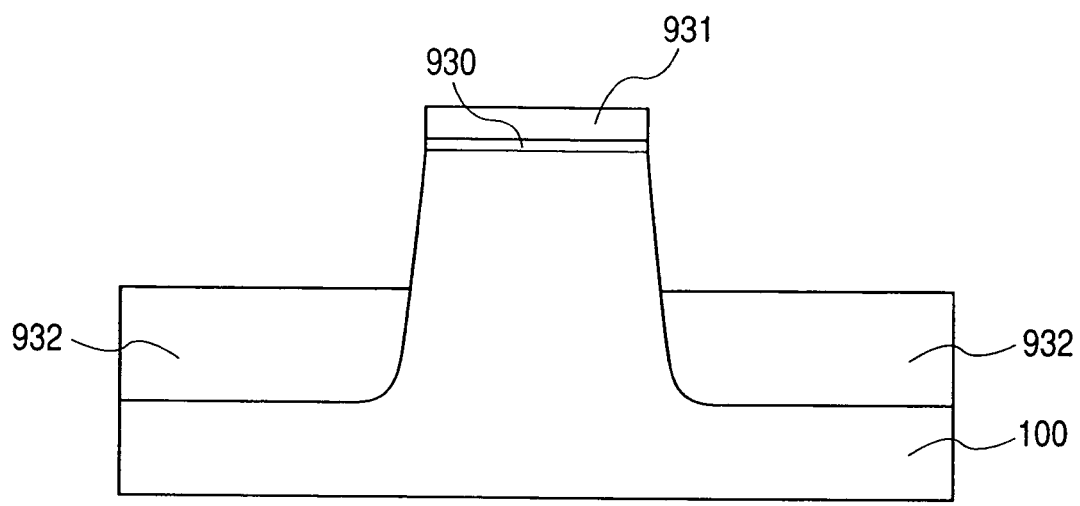
FIG. 15C is a cross-sectional structural view showing the manufacturing step of the first device of the present invention.

With the nitride film 930 as a mask, the oxide film 932 is etched by 50 nm to form a convex. Damage to the substrate can be avoided by employing wet etching for etching of the oxide film (FIGS. 15A, 15B and 15C).

Figure 16A:
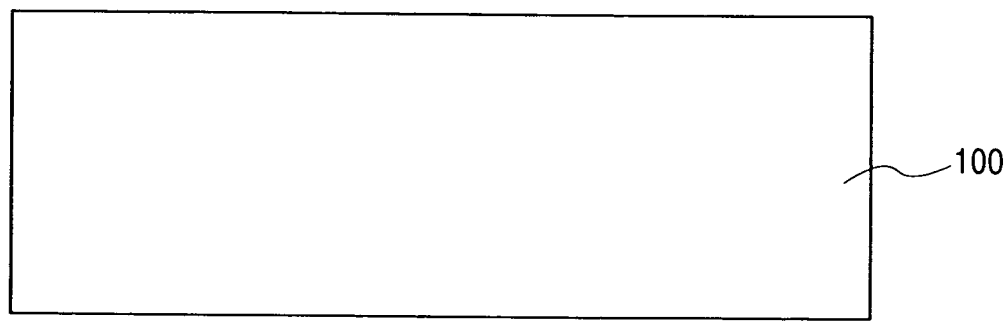
FIG. 16A is a cross-sectional structural view showing a manufacturing step of the first device of the present invention.
Figure 16B:
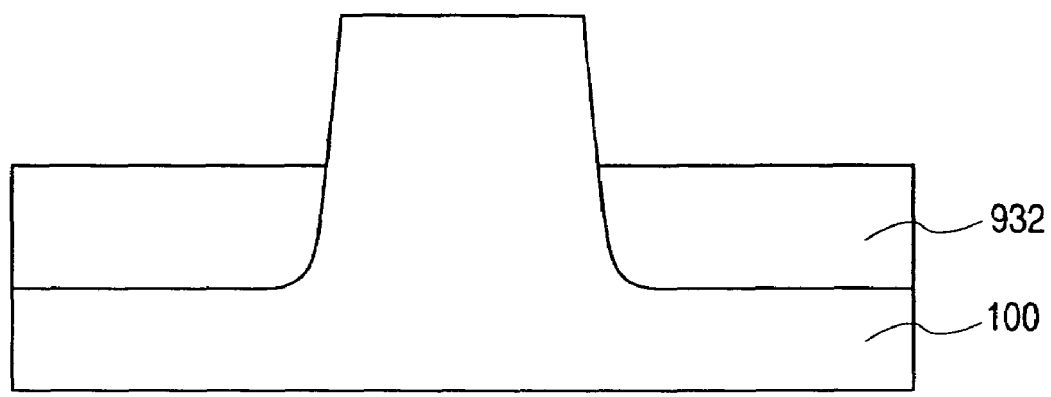
FIG. 16B is a cross-sectional structural view showing the manufacturing step of the first device of the present invention.
Figure 16C:
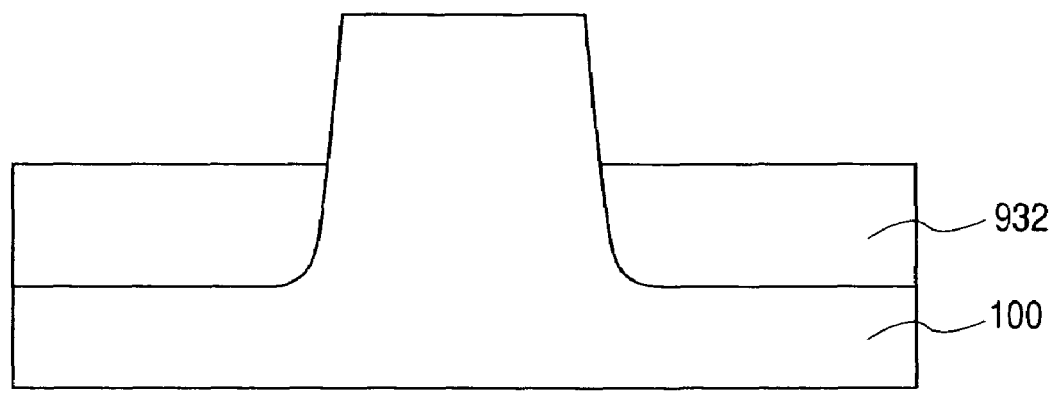
FIG. 16C is a cross-sectional structural view showing the manufacturing step of the first device of the present invention.

The silicon nitride film 931 and oxide film 930 which have served as a mask are removed to expose a silicon surface in the active region (FIGS. 16A, 16B and 16C).

Figure 17A:
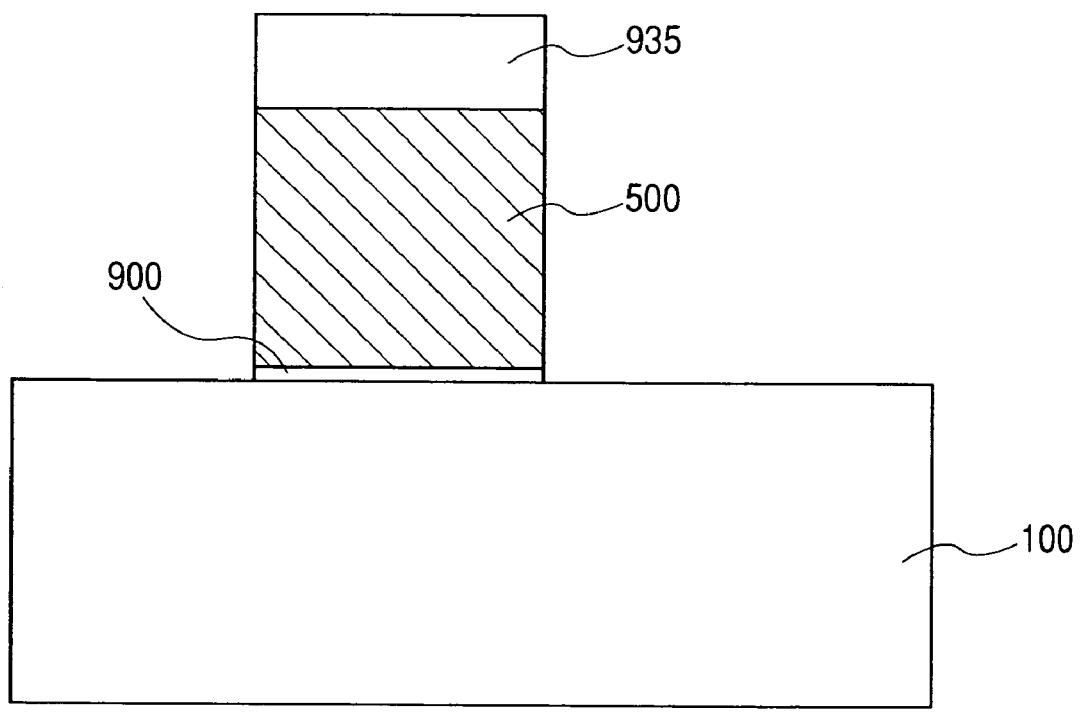
FIG. 17A is a cross-sectional structural view showing a manufacturing step of the first device of the present invention.
Figure 17B:
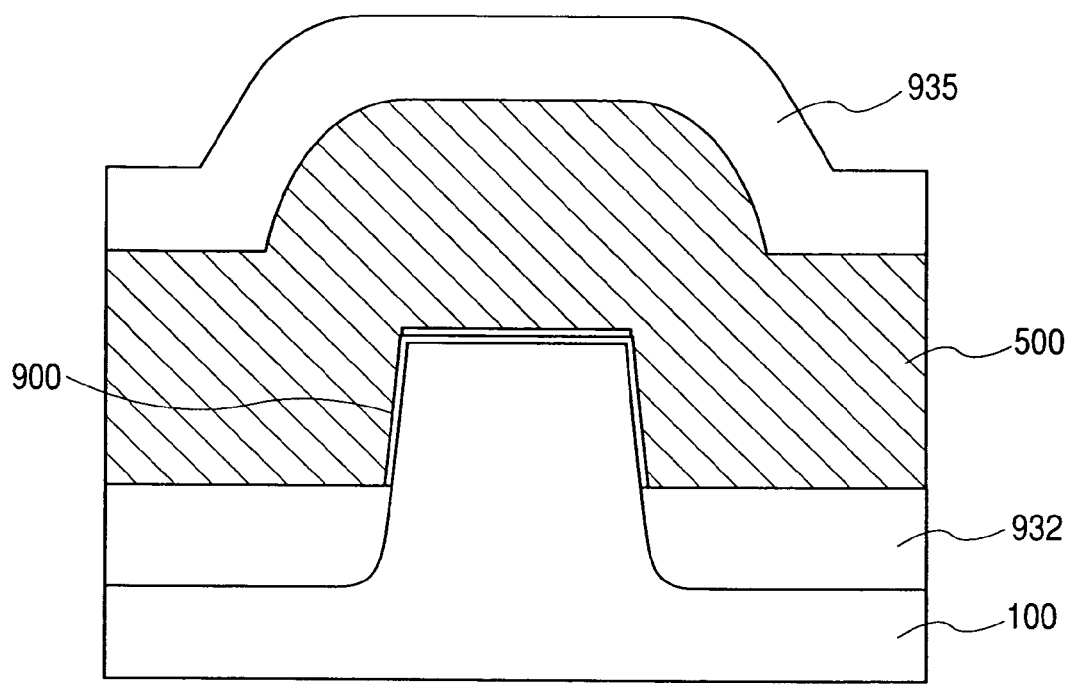
FIG. 17B is a cross-sectional structural view showing the manufacturing step of the first device of the present invention.
Figure 17C:
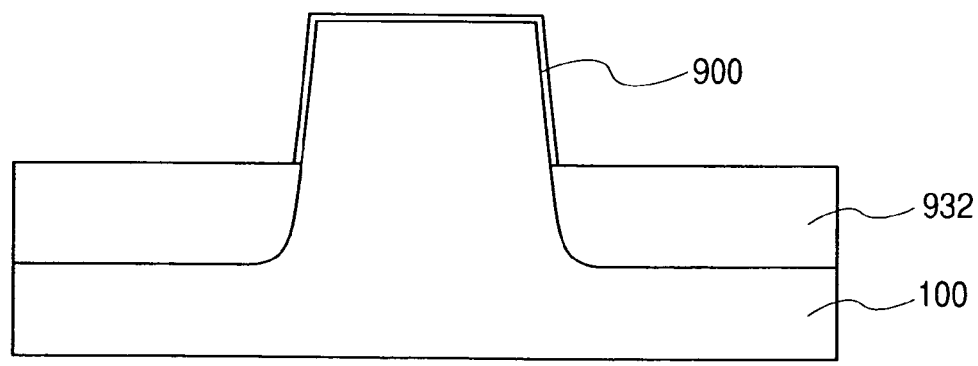
FIG. 17C is a cross-sectional structural view showing the manufacturing step of the first device of the present invention.

After formation of a gate insulating film 900 of 2.5 nm thickness by thermal oxidation of the surface of the semiconductor substrate, polycrystalline silicon 500 is deposited by CVD (Chemical Vapor Deposition) to give its film thickness of 200 nm, followed by deposition of a silicon dioxide film 935 of 50 nm thickness. After patterning with the select gate pattern (FIG. 11, 1500), the oxide film 935 and polycrystalline silicon 500 are etched to form a select gate electrode. As illustrated in FIG. 17(C), etching is performed completely so as not to leave the polycrystalline silicon 500 on the side surfaces of the convex in the memory gate region (FIGS. 17A, 17B and 17C).

After removal of the gate insulating film 900 from the memory gate region, the exposed surface of the substrate is oxidized by 4 nm. By depositing a silicon nitride film of 8 nm thickness and a silicon dioxide film of 7 nm thickness over the oxidized surface by CVD, an ONO film 950 is formed. For the formation of this ONO film 950, ISSG (In-Situ Steam Generation) oxidation can be employed. In other words, an oxide film is caused to grow by 5 nm by subjecting the surface of the substrate to ISSG oxidation and then a silicon nitride film is deposited to give a thickness of 14 nm. The silicon nitride film is then subjected to ISSG oxidation, whereby an upper oxide film of 6 nm thickness can be formed.

Figure 18A:
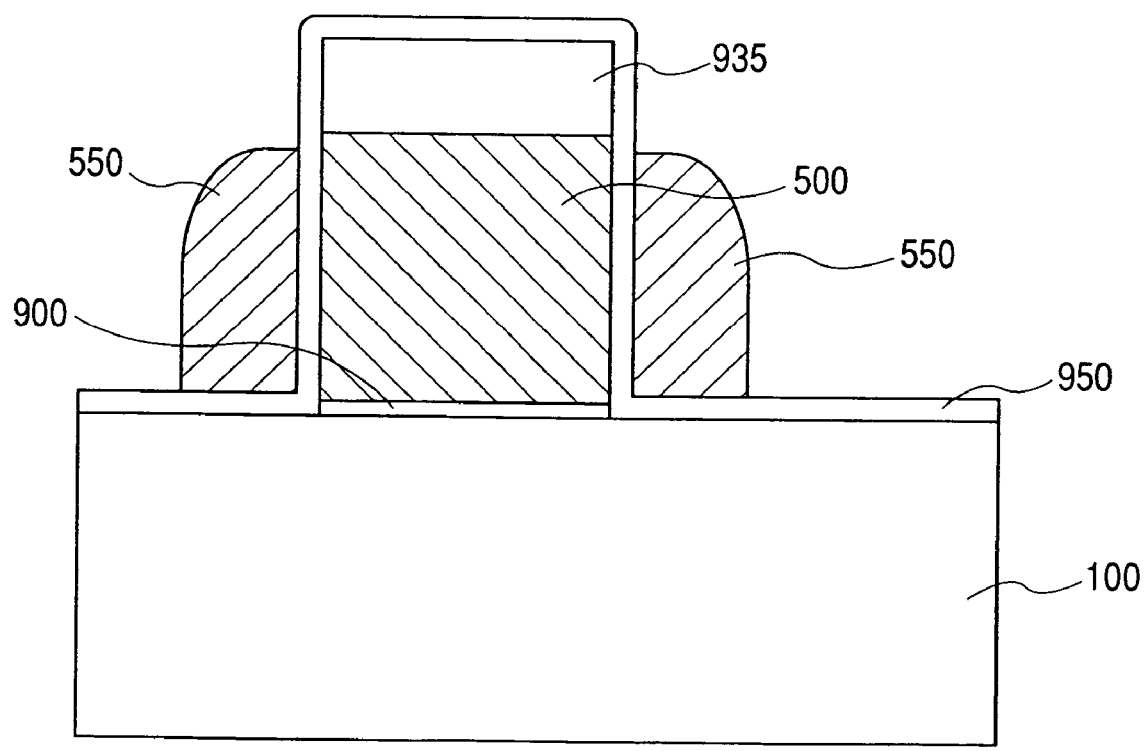
FIG. 18A is a cross-sectional structural view showing a manufacturing step of the first device of the present invention.
Figure 18B:
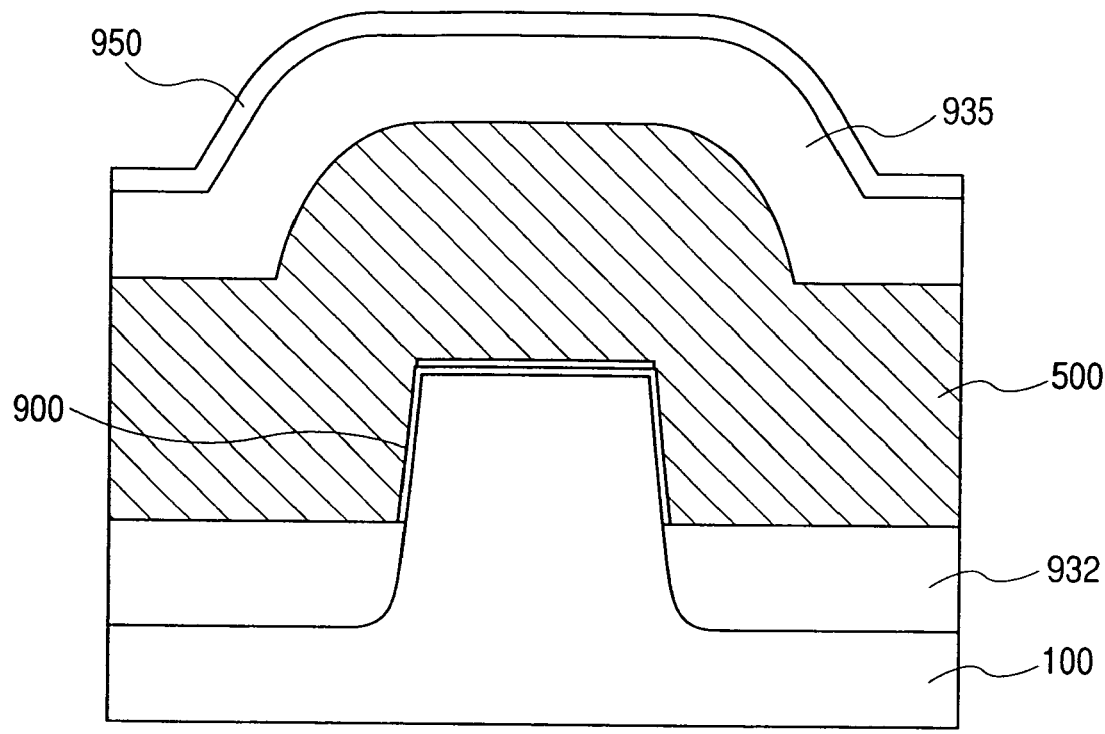
FIG. 18B is a cross-sectional structural view showing the manufacturing step of the first device of the present invention.
Figure 18C:
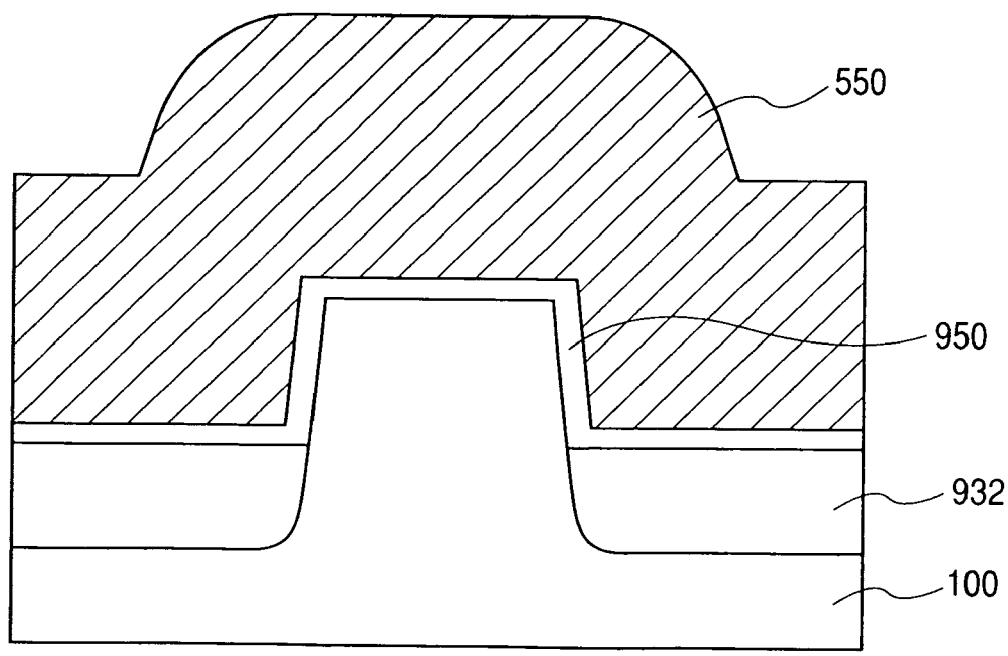
FIG. 18C is a cross-sectional structural view showing the manufacturing step of the first device of the present invention.

Over the ONO film 950 thus formed, polycrystalline silicon in situ doped heavily with phosphorus is deposited to give its thickness of 70 nm. The resulting polycrystalline silicon film is anisotropically etched to form a memory gate 550 in the spacer form over the side surfaces of the select gate 500. During this formation, photoresist pattern used as a mask may be placed at a contact formation portion (FIGS. 18A, 18B and 18C). Although not illustrated here, additional etching can be performed to remove an unnecessary portion of the polycrystalline silicon 550 from the convex side surface.

Figure 19A:
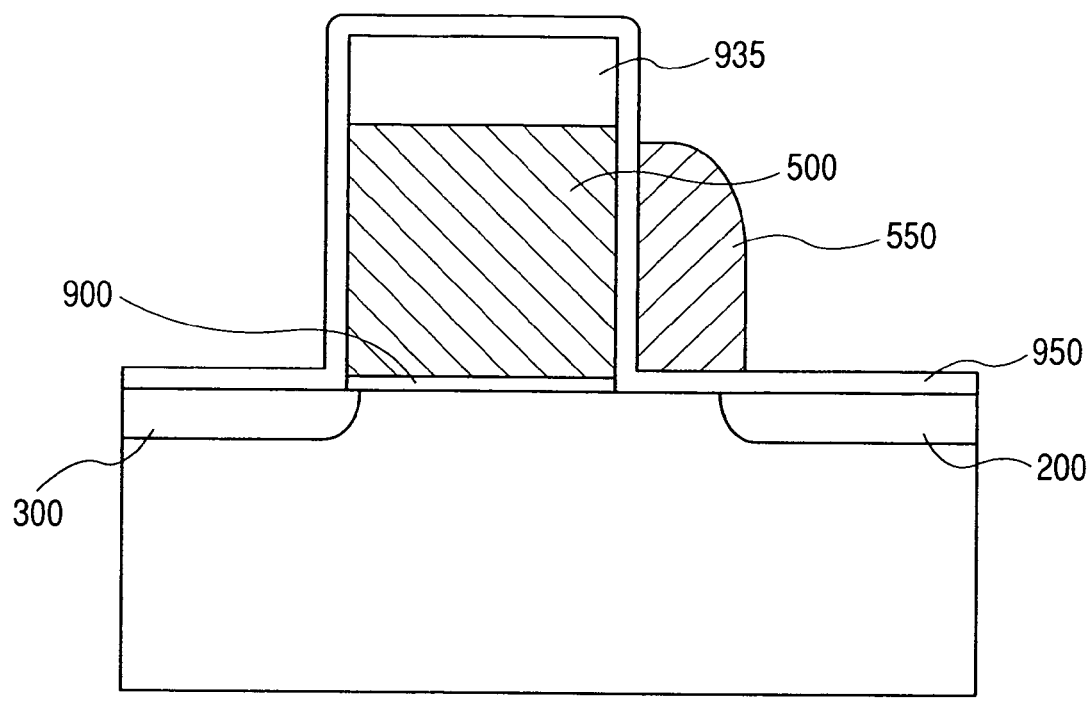
FIG. 19A is a cross-sectional structural view showing a manufacturing step of the first device of the present invention.
Figure 19B:
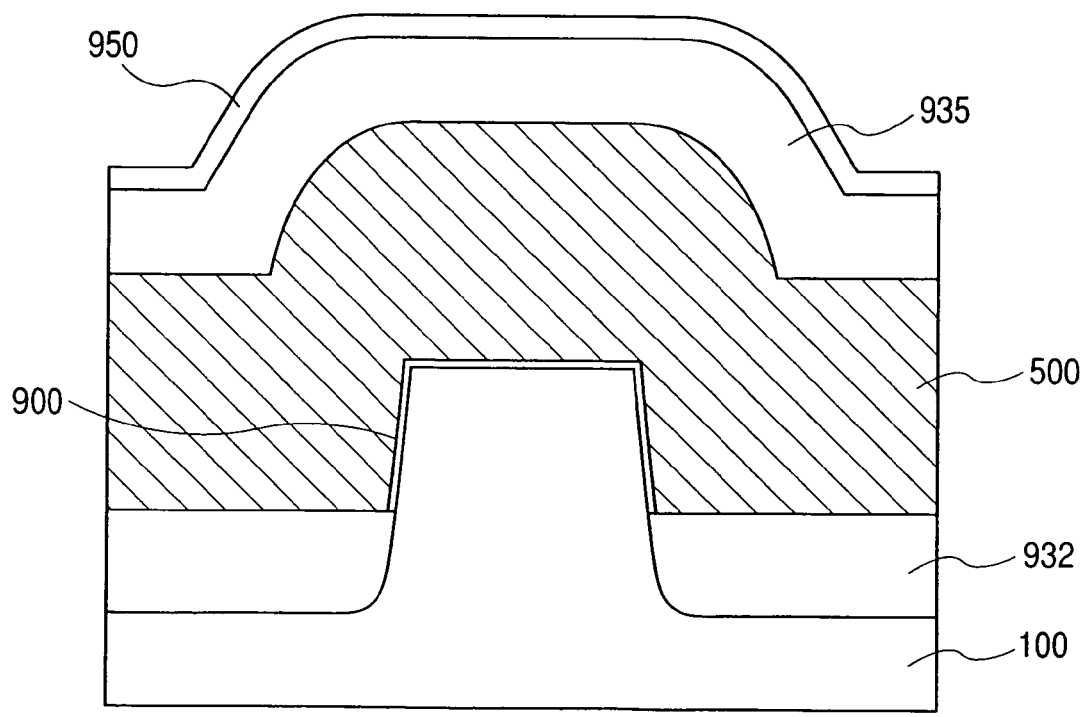
FIG. 19B is a cross-sectional structural view showing the manufacturing step of the first device of the present invention.
Figure 19C:
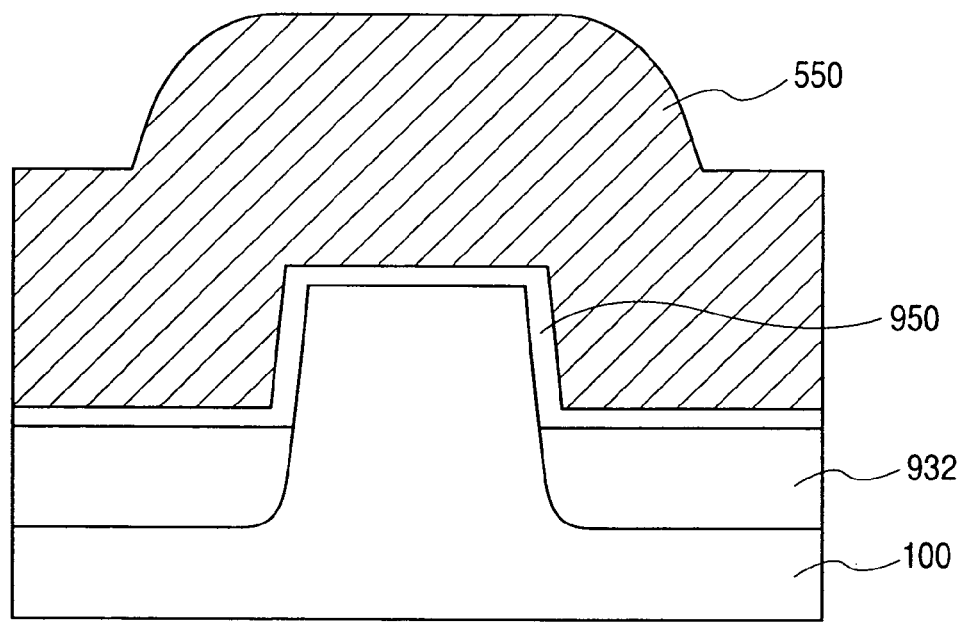
FIG. 19C is a cross-sectional structural view showing the manufacturing step of the first device of the present invention.

An unnecessary portion of the polycrystalline silicon 550 is then removed by etching. The unnecessary portion of the polycrystalline layer is, more specifically, a polycrystalline silicone layer on the side surface of the select gate 500 which is on the side opposite to a region which will be a memory gate. During this etching, the ONO film 950 can be used as an underlying protecting layer. With the select gate 500 and memory gate 550 as masks, arsenic is ion-implanted to form a source 200 and a drain 300 (FIGS. 19A, 19B and 19C).

By the removal of the exposed ONO film 950 by etching and ion implantation of arsenic with the select gate 500 and memory gate 550 as masks to form the source 200 and drain 300, shallow junction can be formed while reducing an acceleration energy during ion implantation. At this time, a thermal oxide film of 3 nm thickness may be formed over the substrate as a surface protecting layer against ion implantation. Use of the ISSG oxidation method in this thermal oxidation step enables to form an oxide film also over the side surfaces of the silicon nitride film of the ONO film stack, whereby a structure having a good interface of a nitride film—oxide film can be formed at the periphery of the nitride film.

Figure 20A:
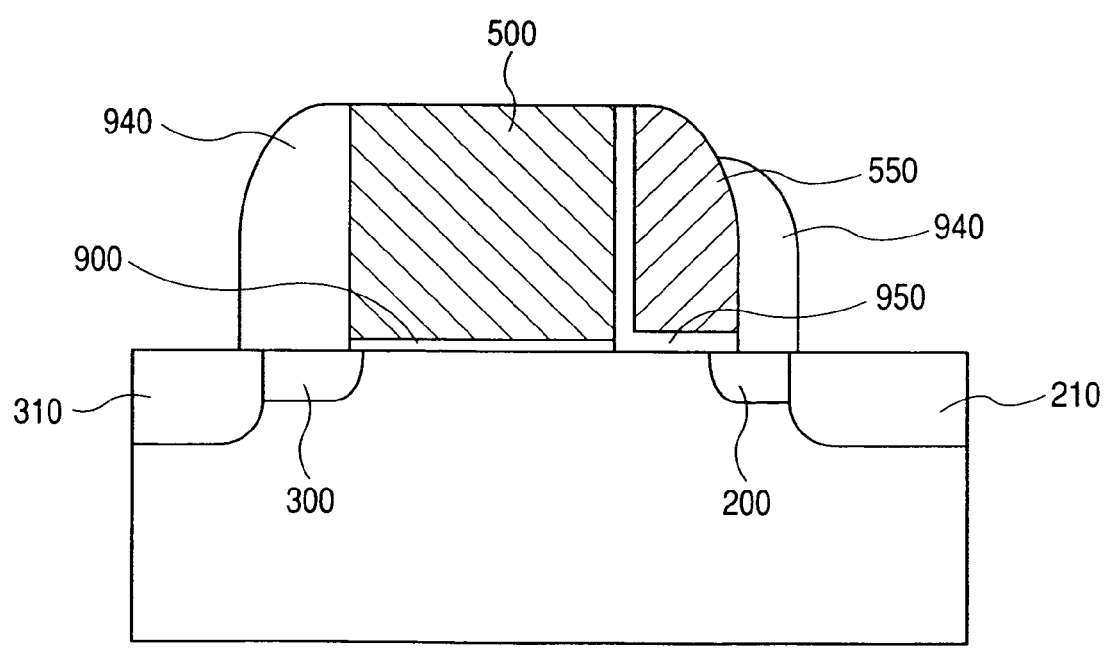
FIG. 20A is a cross-sectional structural view showing a manufacturing step of the first device of the present invention.
Figure 20B:
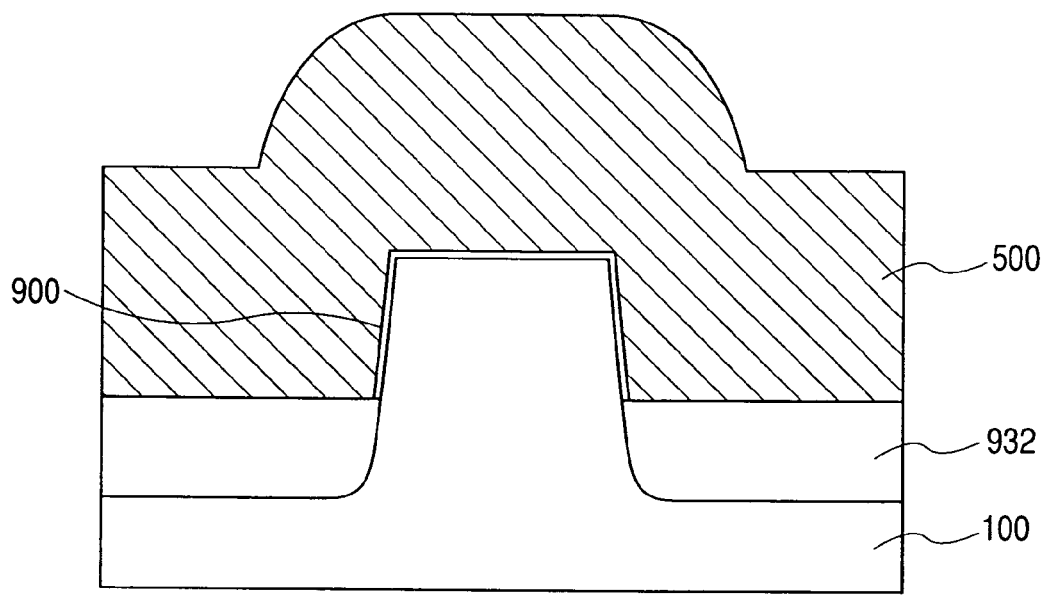
FIG. 20B is a cross-sectional structural view showing the manufacturing step of the first device of the present invention.
Figure 20C:
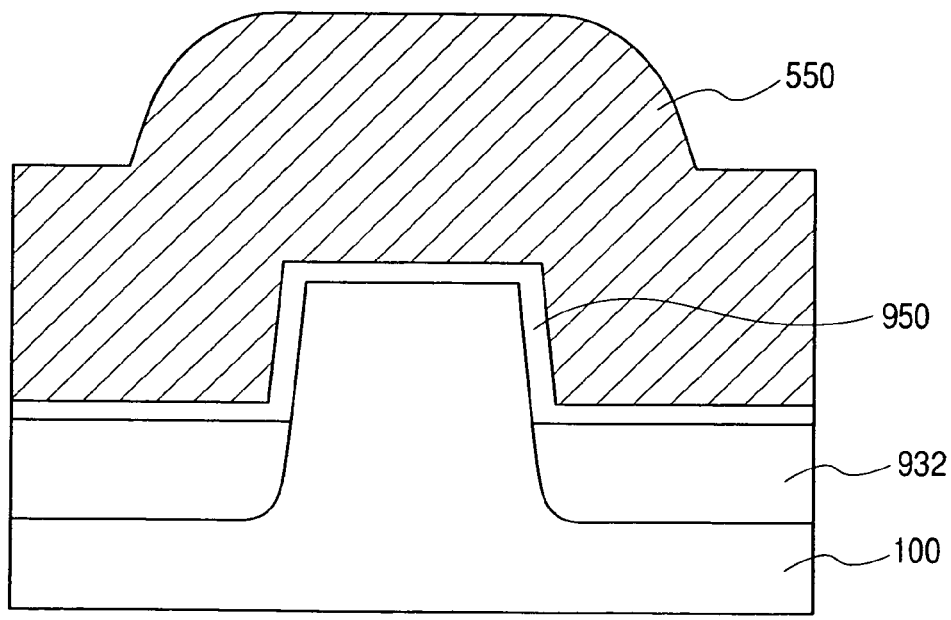
FIG. 20C is a cross-sectional structural view showing the manufacturing step of the first device of the present invention.

A silicon dioxide film of 100 nm thickness is then deposited, and then anisotropically etched to form spacers 940 over the side surface of the select gate 500 and memory gate 550. With these as a mask, arsenic is ion-implanted to form a diffusion layer 210 and a diffusion layer 310 (FIGS. 20A, 20B and 20C). Together with this impurity doping, an impurity can also be doped into the select gate 500. These steps are carried out in accordance with an ordinarily employed LDD (Lightly doped drain) process. By the metallization step ordinarily employed in the CMOS process, the formation of the memory cell of this embodiment can be completed.

Second Embodiment

The above-described formation process is more stabilized and shown as a second embodiment in FIG. 21A to FIG. 25C. In these drawings, respective cross-sections illustrated FIG. 11 are employed as in the above-described example. In short, each of FIGS. 21A to 21C, 22A to 22C, 23A to 23C, 24A to 24C, and 25A to 25C are cross-sections similar to those in the above-described example.

Figure 21A:
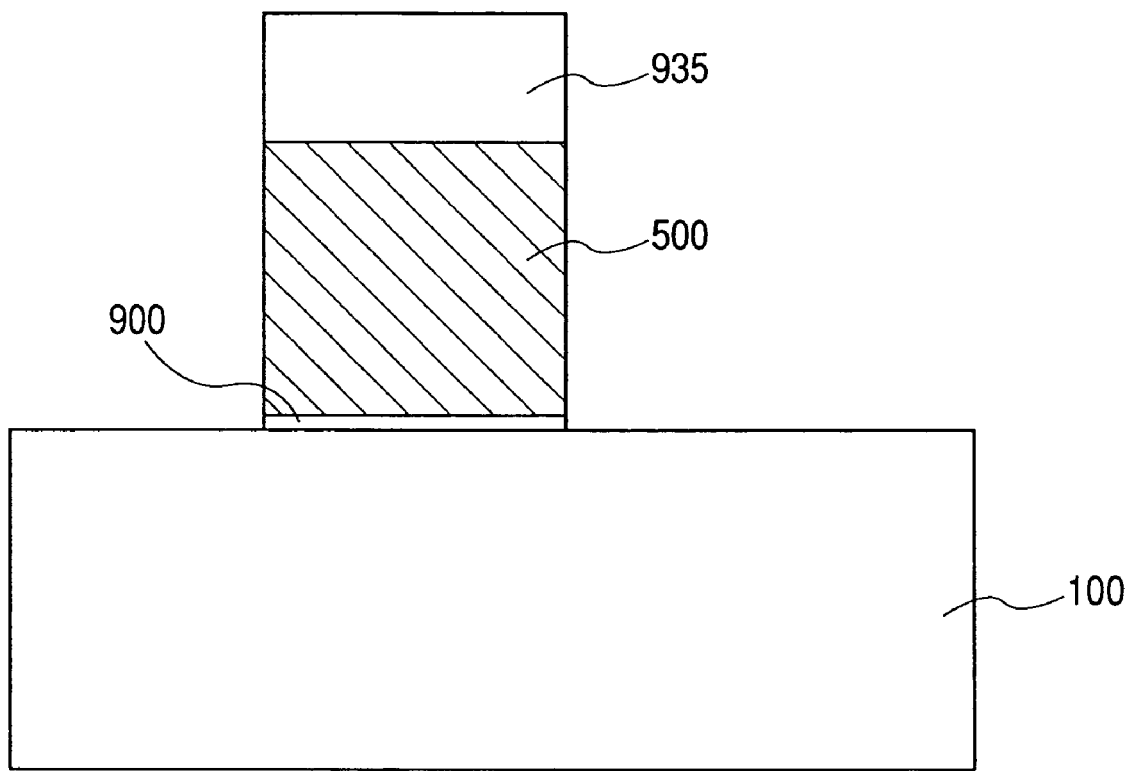
FIG. 21A is a cross-sectional structural view showing a manufacturing step of a second device of the present invention.
Figure 21B:
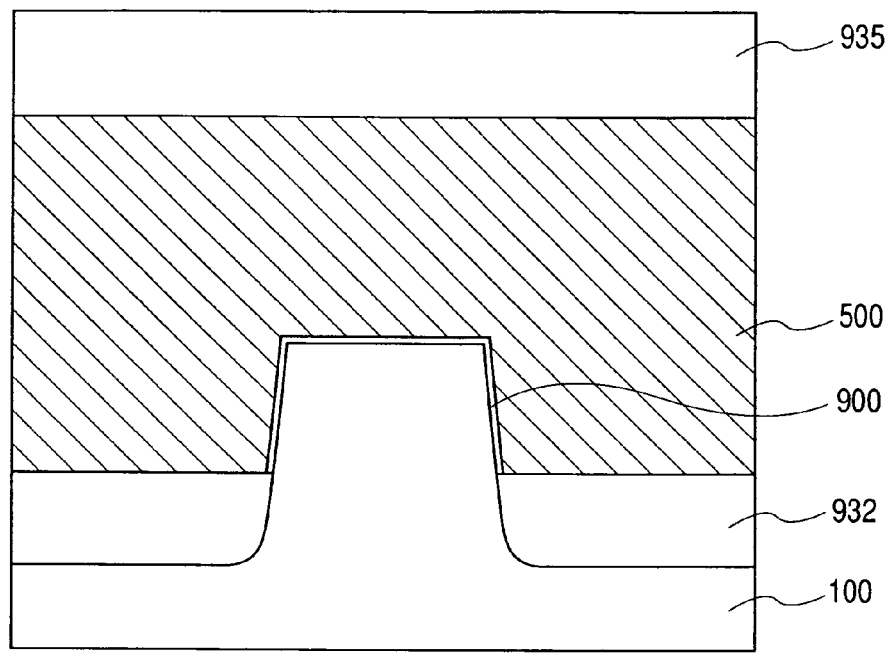
FIG. 21B is a cross-sectional structural view showing the manufacturing step of the second device of the present invention.
Figure 21C:
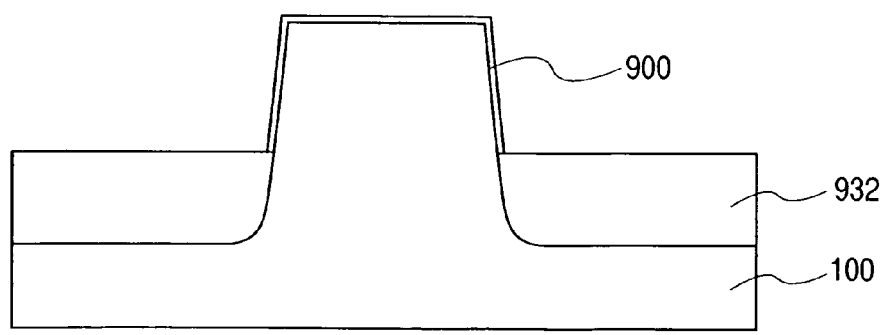
FIG. 21C is a cross-sectional structural view showing the manufacturing step of the second device of the present invention.

After completion of the steps up to FIGS. 16A, 16B and 16C in the first embodiment, a gate insulating film 900 is formed. Polycrystalline silicon 500 is deposited to give its thickness of 300 nm, followed by polishing of this polycrystalline silicon by CMP, whereby the surface of the polycrystalline silicon 500 is planarized. The thickness at the top of the convex portion in the active region is adjusted to 200 nm. A silicon dioxide film 935 of 50 nm thickness is then deposited. With a select gate pattern (indicated by numeral 1500 in FIG. 11), the oxide film 935 and polycrystalline silicon 500 are etched to form a select gate (FIGS. 21A, 21B and 21C).

Figure 22A:
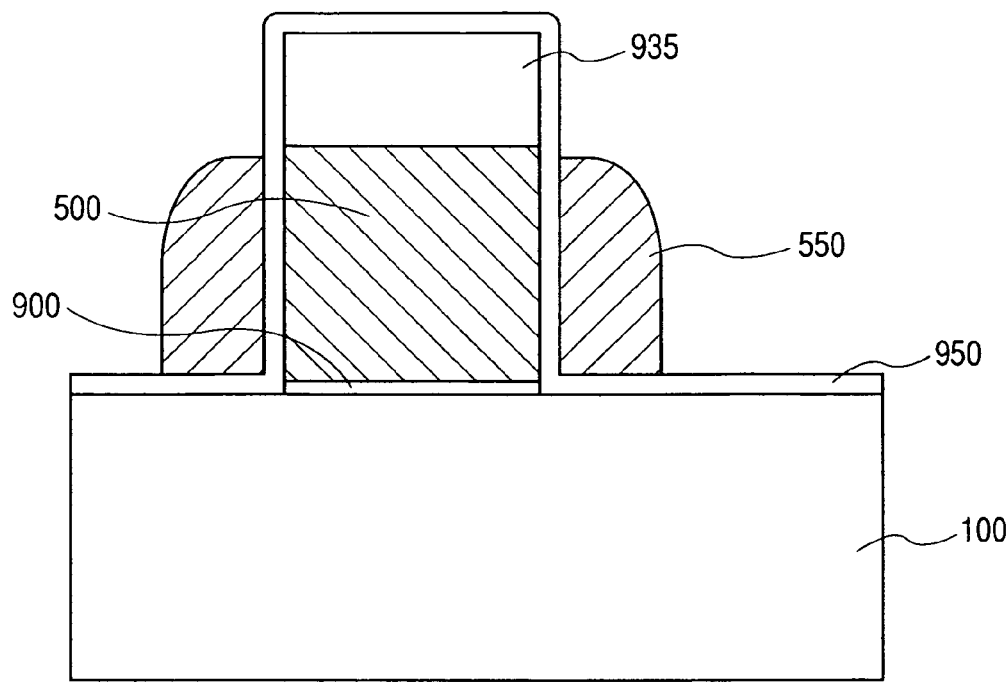
FIG. 22A is a cross-sectional structural view showing a manufacturing step of the second device of the present invention.
Figure 22B:
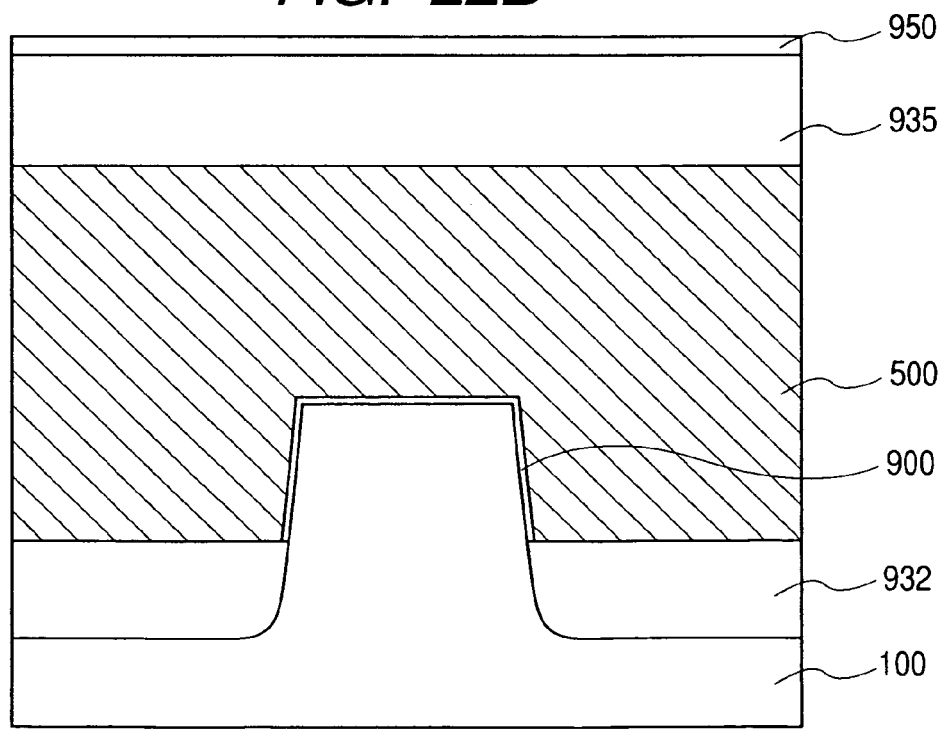
FIG. 22B is a cross-sectional structural view showing the manufacturing step of the second device of the present invention.
Figure 22C:
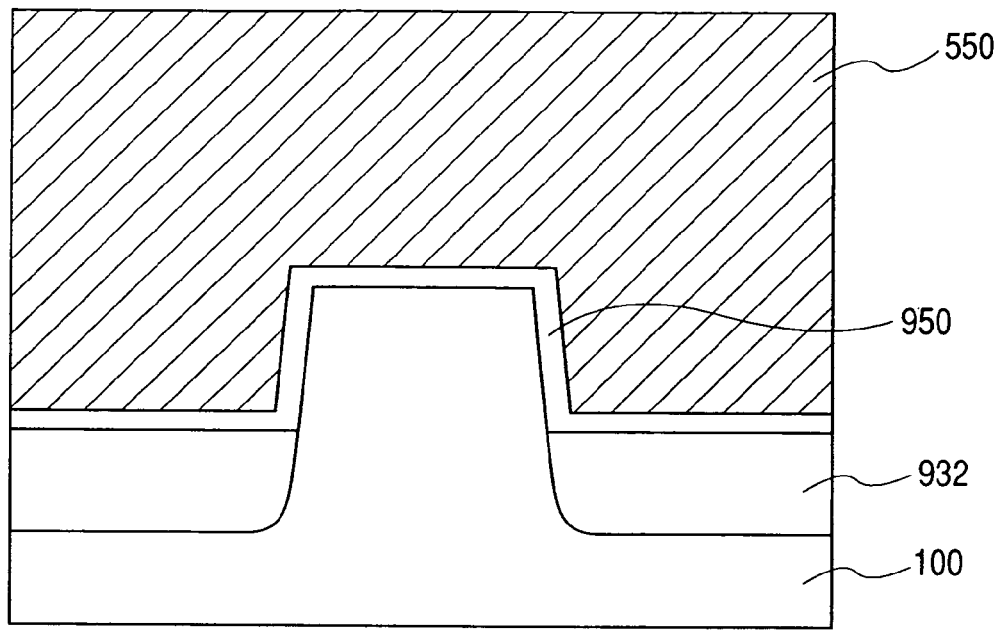
FIG. 22C is a cross-sectional structural view showing the manufacturing step of the second device of the present invention.

After deposition of polycrystalline silicon which will be a memory gate 550, spacer-forming step is carried out, whereby the memory gate is formed (FIGS. 22A, 22B and 22C).

Figure 23A:
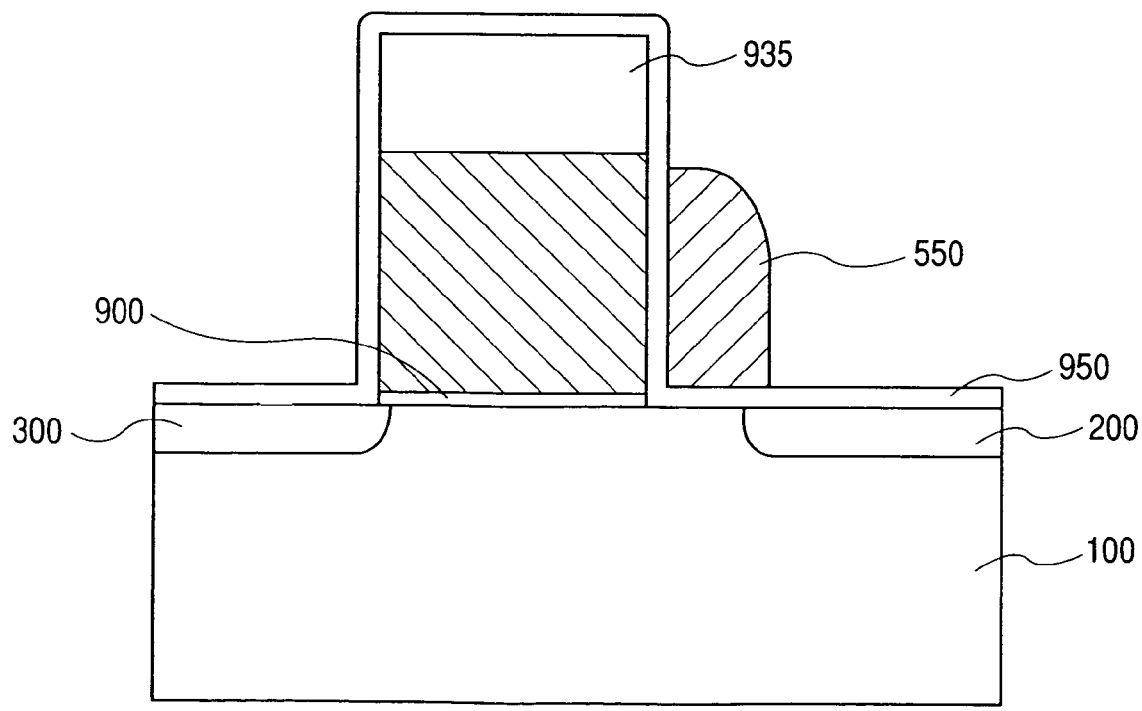
FIG. 23A is a cross-sectional structural view showing a manufacturing step of the second device of the present invention.
Figure 23B:
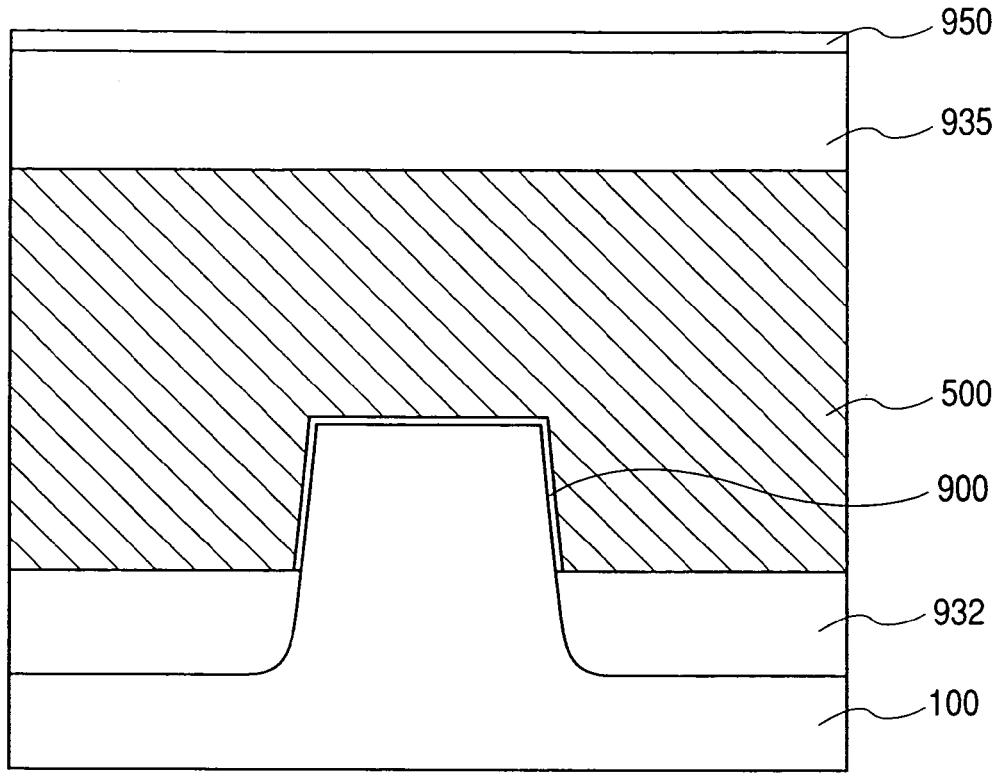
FIG. 23B is a cross-sectional structural view showing the manufacturing step of the second device of the present invention.
Figure 23C:
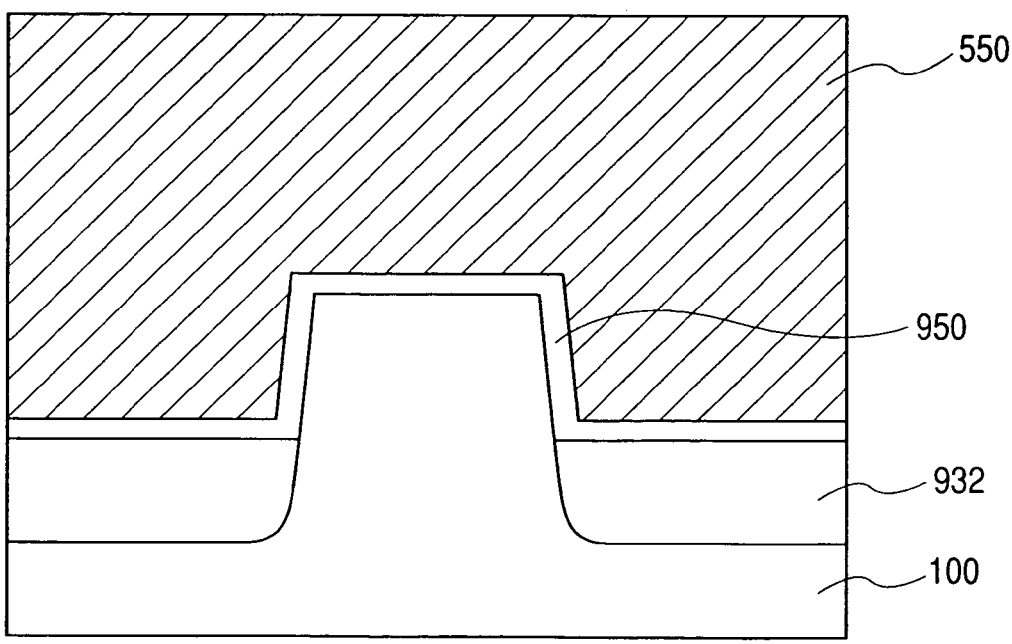
FIG. 23C is a cross-sectional structural view showing the manufacturing step of the second device of the present invention.

An unnecessary portion of the memory gate layer 550 is removed and then, a diffusion layer 200 and a diffusion layer 300 are formed in self alignment with the memory gate 550 and select gate 900 by ion implantation (FIGS. 23A, 23B and 23C).

Figure 24A:
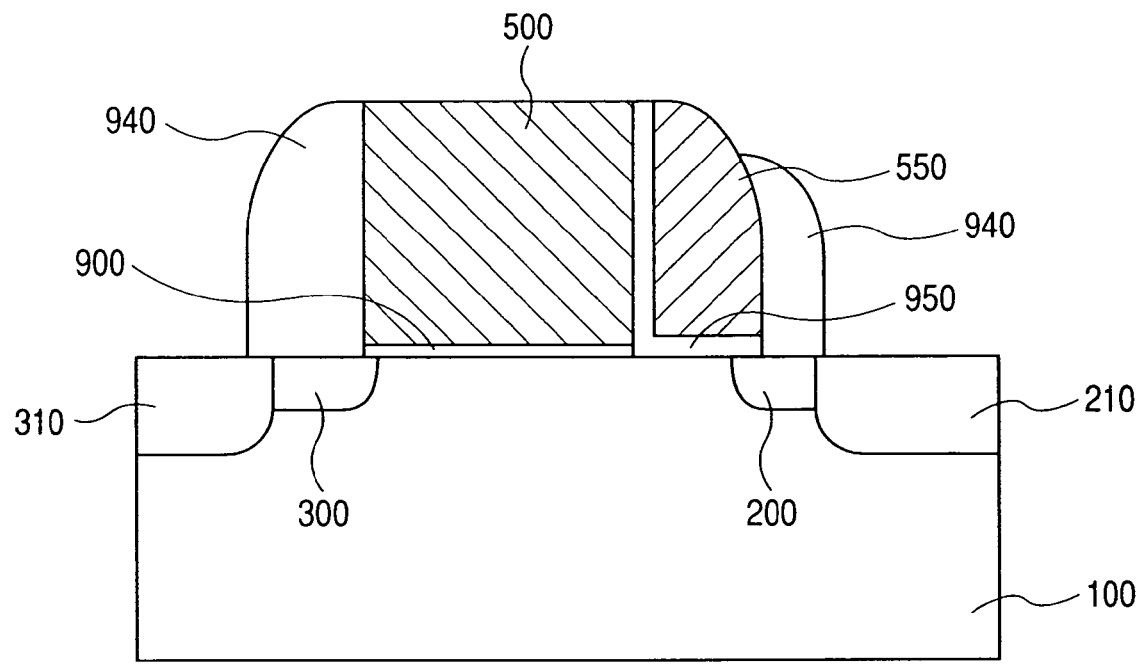
FIG. 24A is a cross-sectional structural view showing a manufacturing step of the second device of the present invention.
Figure 24B:
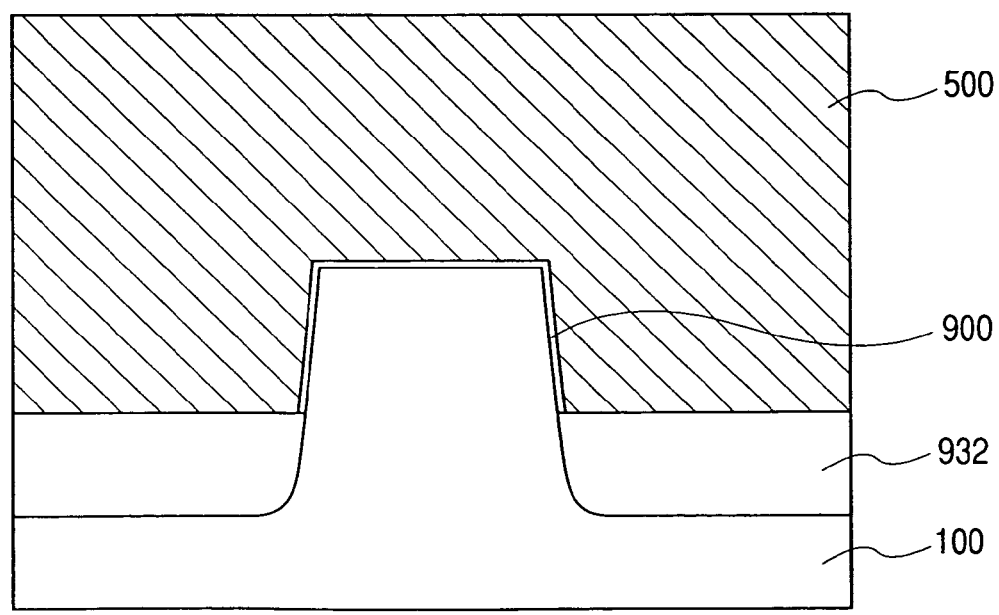
FIG. 24B is a cross-sectional structural view showing a manufacturing step of the second device of the present invention.
Figure 24C:
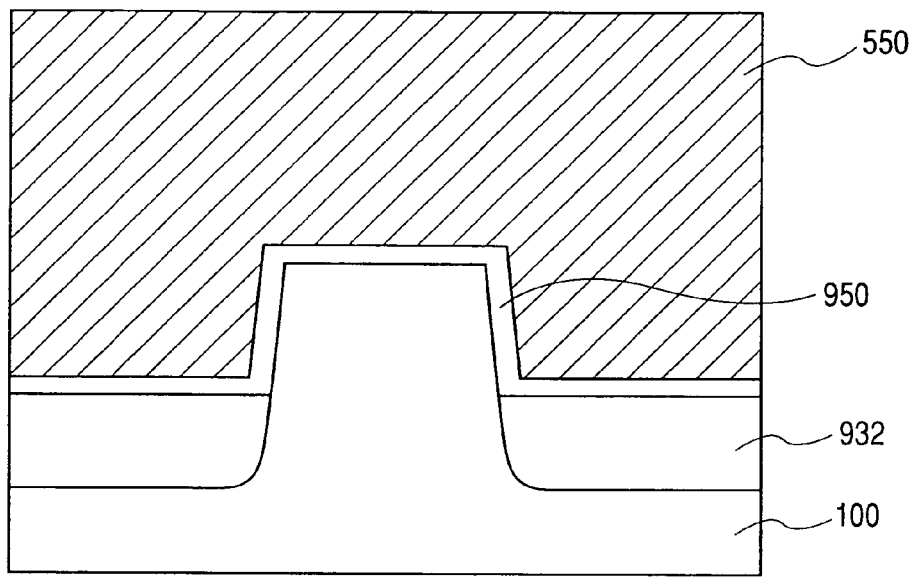
FIG. 24C is a cross-sectional structural view showing the manufacturing step of the second device of the present invention.

An oxide film spacer 940 is formed and then, a diffusion layer 210 and a diffusion layer 310 are formed (FIGS. 24A, 24B and 24C).

Figure 25A:
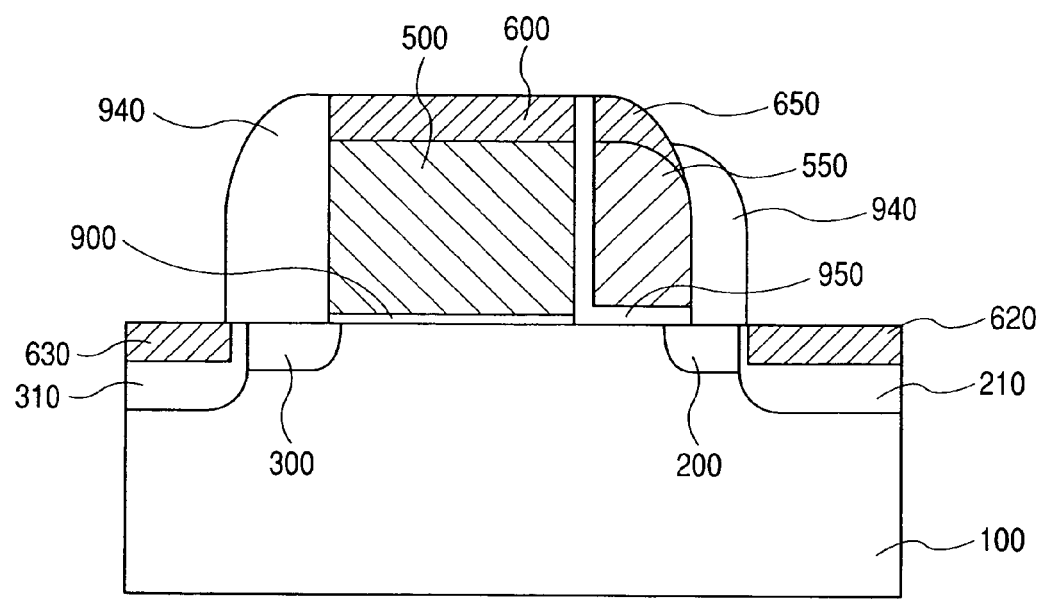
FIG. 25A is a cross-sectional structural view showing a manufacturing step of the second device of the present invention.
Figure 25B:
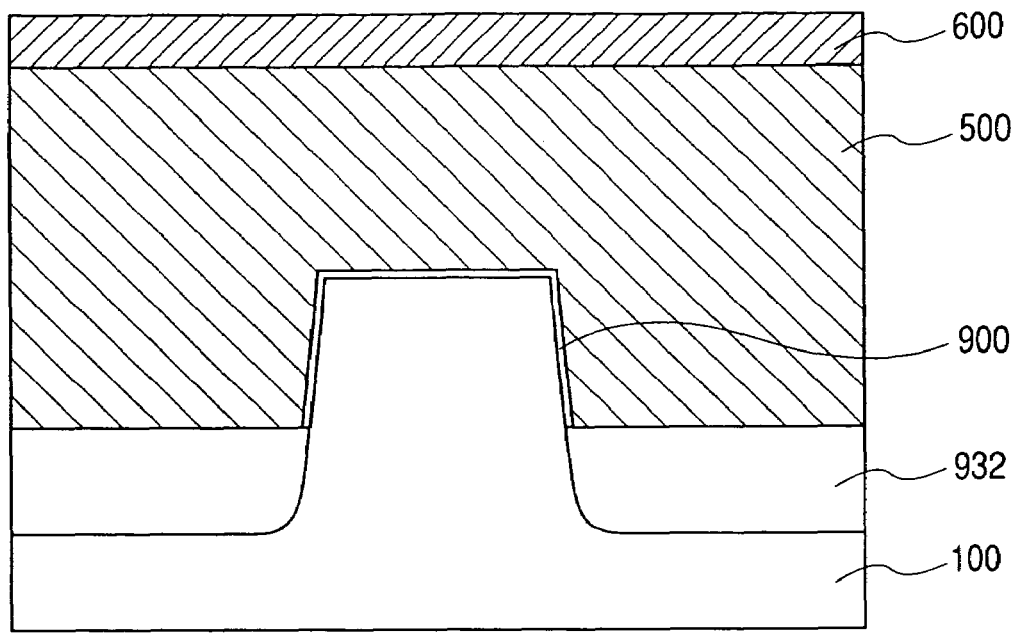
FIG. 25B is a cross-sectional structural view showing the manufacturing step of the second device of the present invention.
Figure 25C:
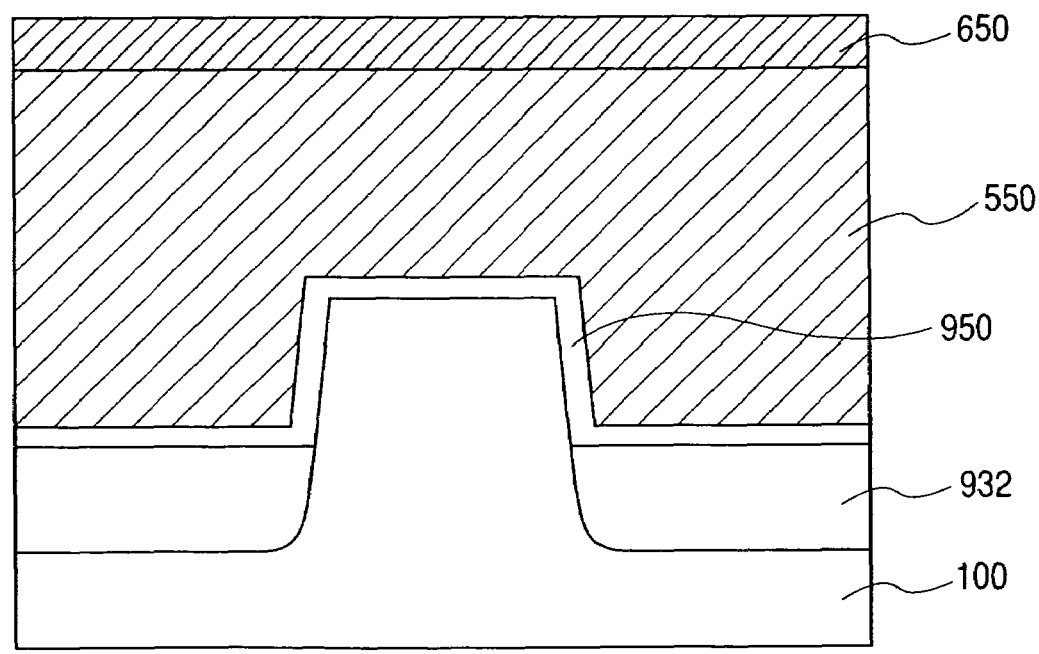
FIG. 25C is a cross-sectional structural view showing the manufacturing step of the second device of the present invention.

By using the known SALICIDE process, upper portions of the diffusion layers 210 and 310, the select gate 500 and the memory gate 550 are selectively converted into silicide (FIGS. 25A, 25B and 25C). The silicide layers thus formed are indicated by numerals 600, 620, 630, and 650.

This process facilitates processing, because the upper surface of the select gate has been planarized.

Third Embodiment

Figure 26:
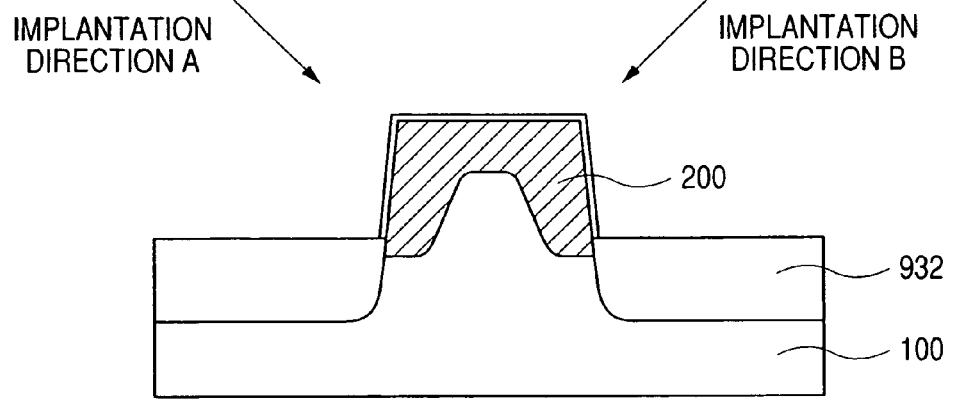
FIG. 26 is a cross-sectional structural view showing a manufacturing step of a third device of the present invention.

When diffusion layers 200, 210, 300 and 310 are formed, they can be formed effectively by implanting ions diagonally relative to the substrate surface. Described specifically, since the active region is convex shaped, an impurity can be introduced into the side surface by diagonally implanting ions. FIG. 26 is a cross-sectional view illustrating an example of diagonal ion implantation. In this example, an oxide film 932 is placed over a semiconductor substrate 100. As illustrated in FIG. 26, the diffusion layer having a region along both side surfaces of the convex region is formed by implanting ions from two directions (A and B).

Fourth and Fifth Embodiments

Figure 27A:
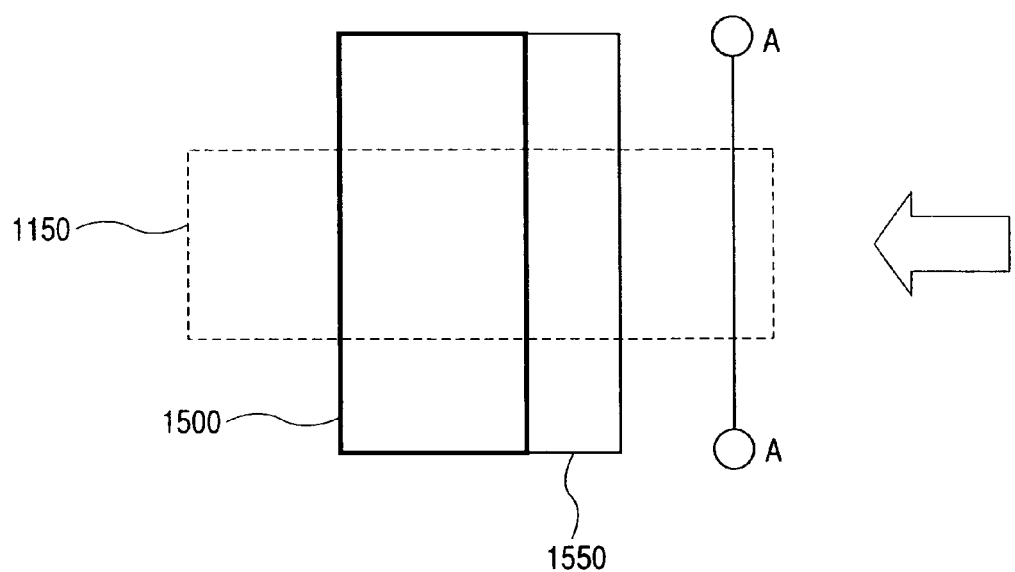
FIG. 27A is a cross-sectional structural view showing a manufacturing step of a fourth device of the present invention.
Figure 27B:
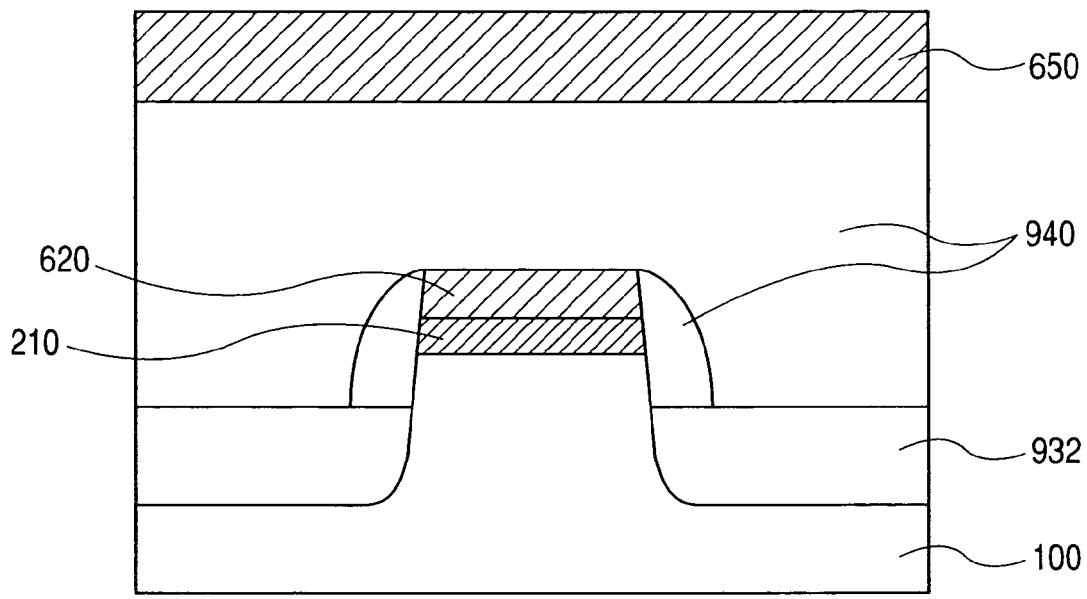
FIG. 27B is a cross-sectional structural view showing the manufacturing step of the fourth device of the present invention.

FIGS. 27A and 27B illustrate a structure capable of realizing good junction properties in the SALICIDE step. FIG. 27A is a planar layout. In FIG. 27A, as in FIG. 11, indicated by numeral 1150 is an active region, 1500 a select gate and 1550 a memory gate. FIG. 27B illustrates a cell structure when the A-A cross-section of FIG. 27A is viewed from an arrow direction. A silicide layer 620 is formed only on the upper portion of the convex by forming a spacer 940 on the side surfaces of the convex of the semiconductor substrate 100. The silicide layer 620 can be formed in the diffusion layer 210. In this diagram, indicated by numeral 932 is an oxide film and 650 a silicide layer.

In this example, the active region 1150 has a convex-shaped cross-sectional structure and at this step difference portion, the memory gate 550 may remain in the form of a spacer. FIGS. 28 to 36 are diagrams for explaining this step difference.

Figure 28:
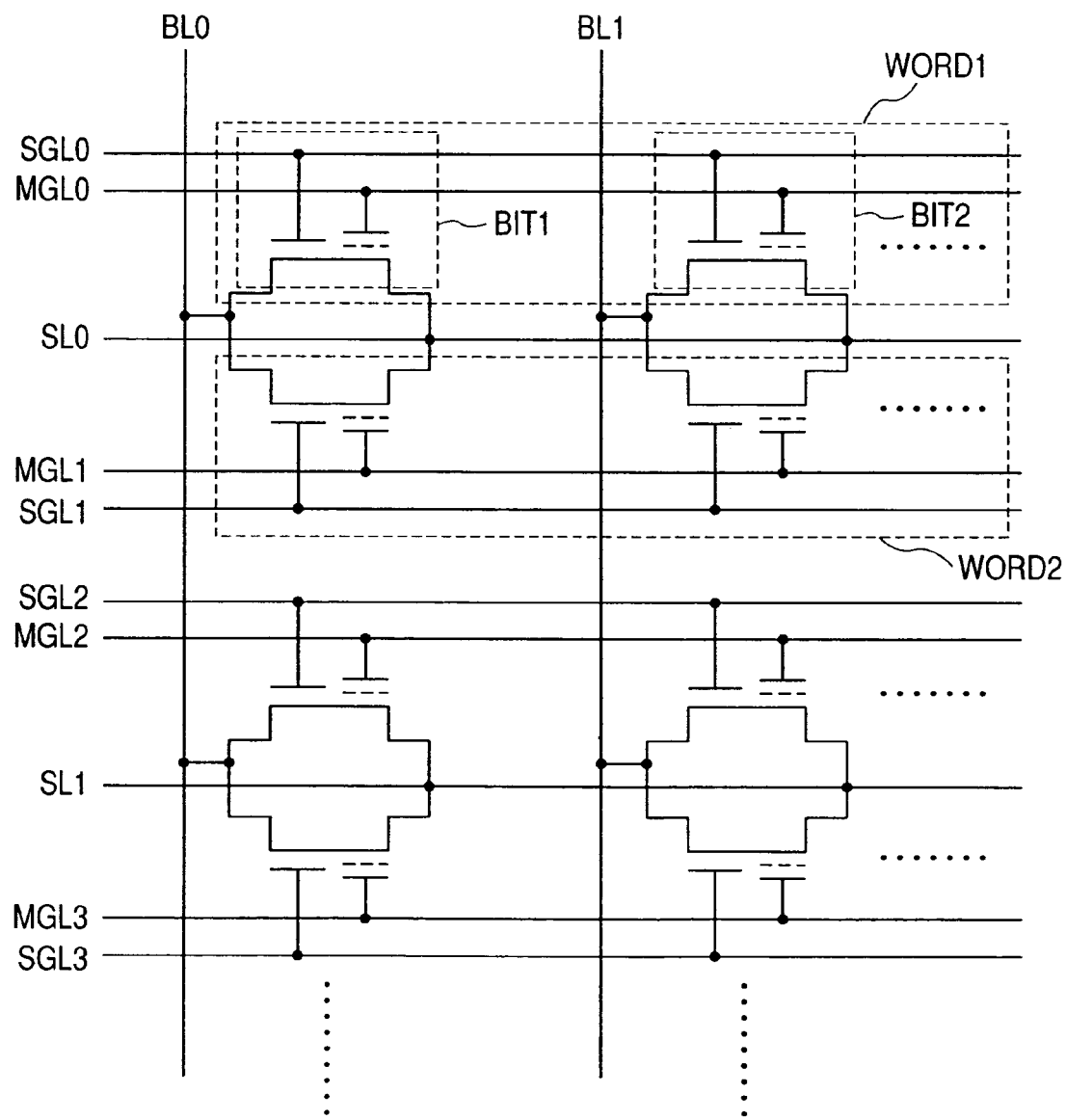
FIG. 28 is an equivalent circuit diagram for explaining a memory cell array.
Figure 29:
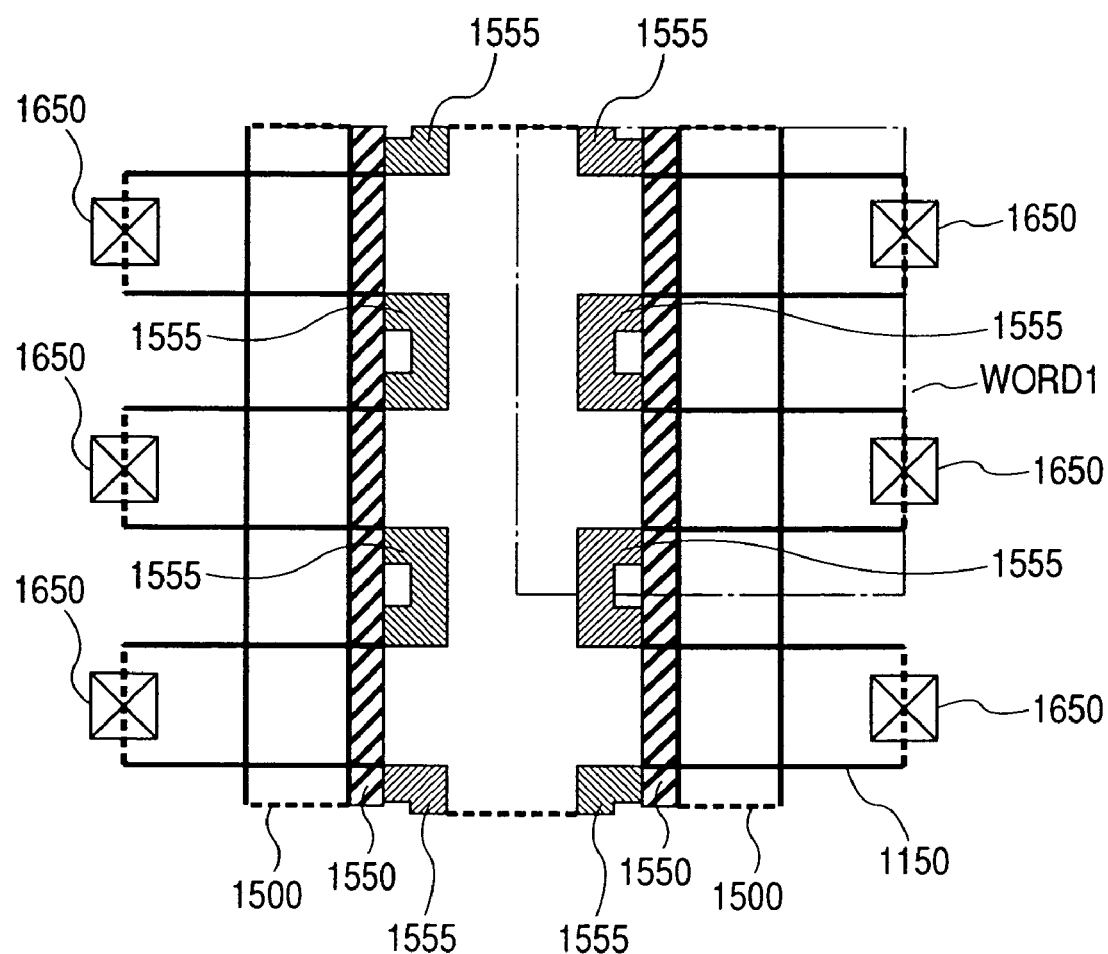
FIG. 29 is a plan view for explaining a memory cell layout.

FIG. 28 is an equivalent circuit diagram of a memory cell array, while FIG. 29 is a plan view illustrating the layout of its essential portion. The layout of the memory array region illustrated in FIG. 28 as WORD1 is shown in FIG. 29. Memory cells BIT1 and BIT2 in the memory array region WORD1 are illustrated in WORD 1 in the plan view of FIG. 29. Select gate 1500 and memory gate 1550 in each of the memory cells BIT1 and BIT2 are located line-symmetrically on the right and left sides of this diagram. Similar to the above-described examples, indicated by numeral 1150 is an active region and 1650 a contact. In this example, memory gates opposite to each other are driven in the same phase.

As can be understood from the above-described manufacturing steps, the active region 1150 has a convex shaped cross-sectional structure during the processing of the memory gate 1550. In a region indicated by numeral 1555, a processing residue remains along the step difference of the active region 1150. On the opposite side of the memory gate 1550 with the select gate 1500 sandwiched therebetween, a memory gate is removed so that no such processing residue appears. As can be seen from FIG. 29, this processing residue 1555 does not cause short-circuit between memory gates, because it is attached to the memory gate 1550.

Figure 30A:
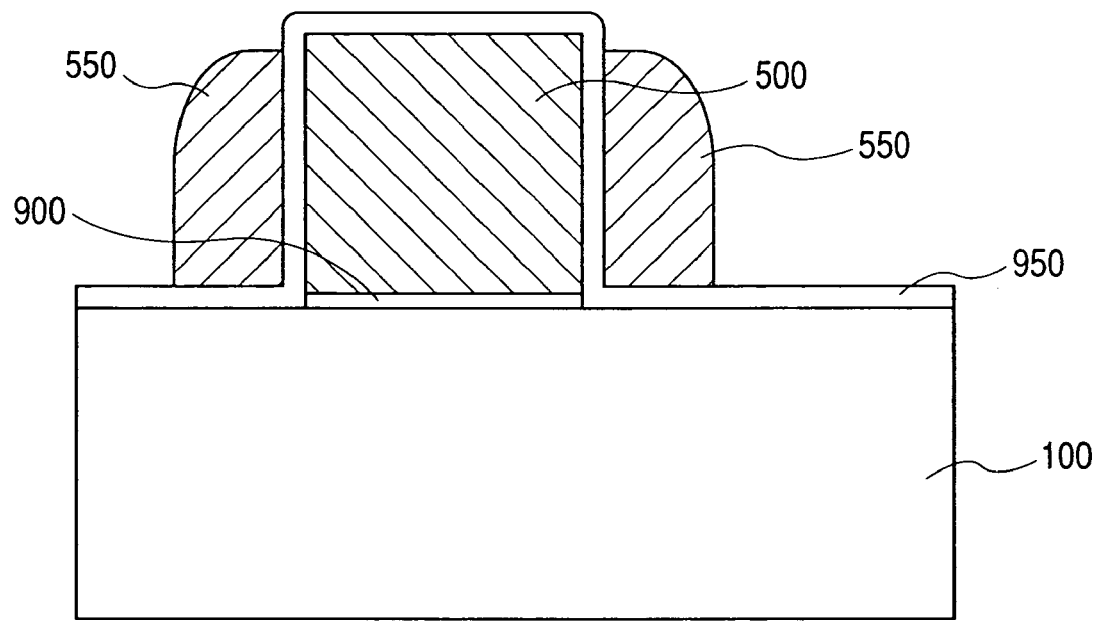
FIG. 30A is a cross-sectional structural view showing a manufacturing step of a fifth device of the present invention.
Figure 30B:
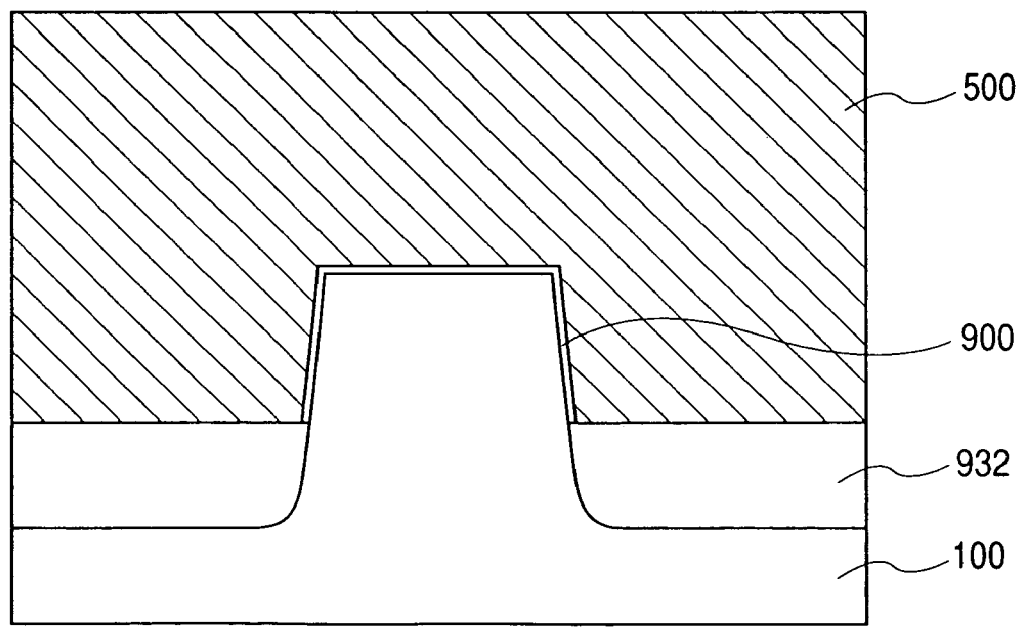
FIG. 30B is a cross-sectional structural view showing the manufacturing step of the fifth device of the present invention.
Figure 30C:
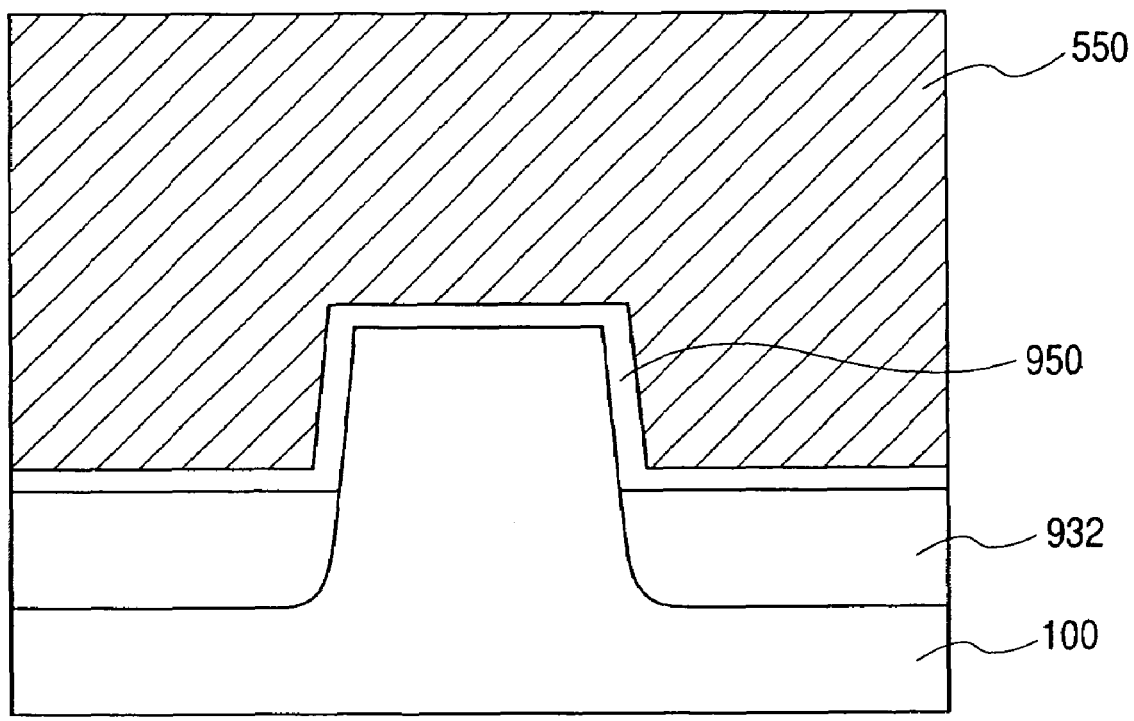
FIG. 30C is a cross-sectional structural view showing the manufacturing step of the fifth device of the present invention.

As illustrated in FIG. 30, the processing residue region 1555 as illustrated in FIG. 29 can be formed by forming the memory gate 1550 by spacer processing without over etching. This leads to a reduction in the resistance of the memory gate. FIGS. 30A, 30B and 30C correspond to the respective cross-sections of FIG. 11, similar to the above-described drawings.

Figure 31:
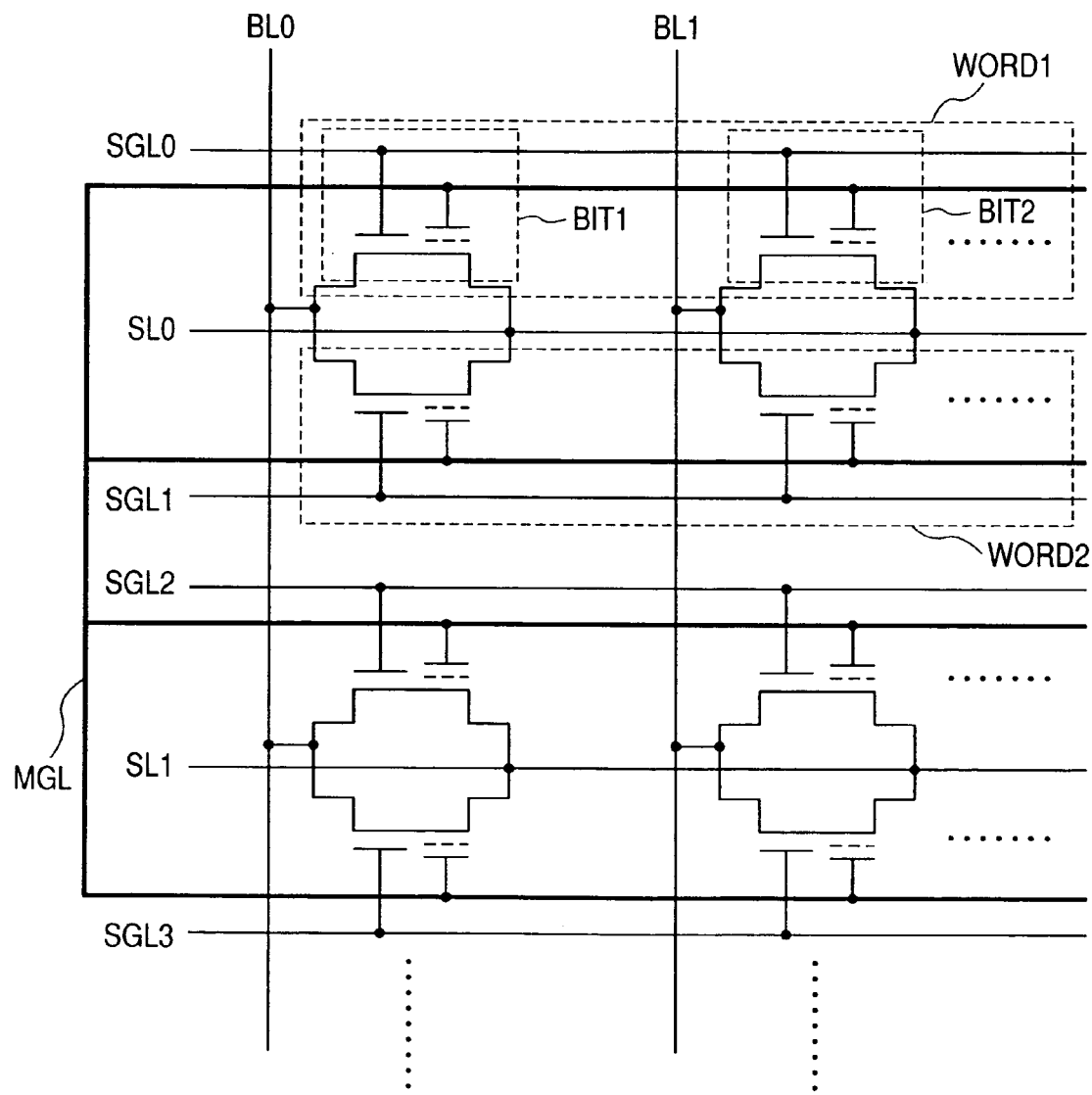
FIG. 31 is an equivalent circuit diagram for explaining a memory cell array.
Figure 32:
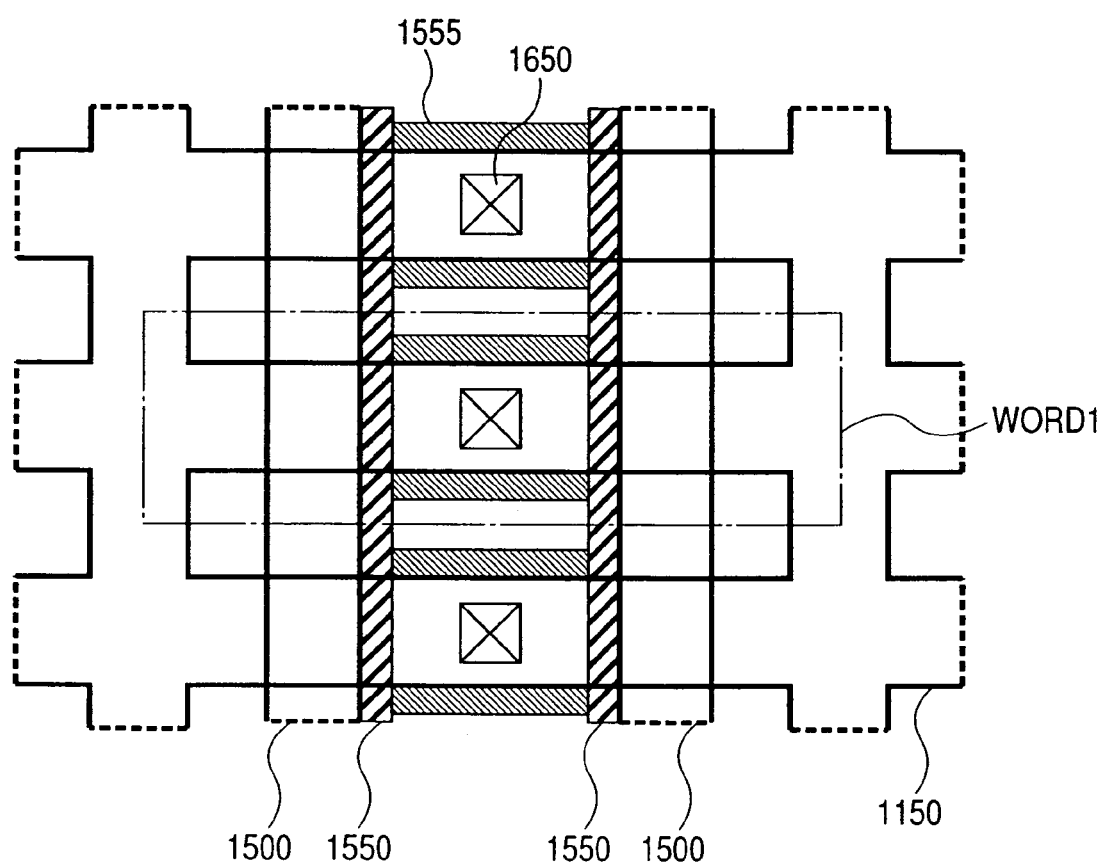
FIG. 32 is a plan view for explaining a memory cell layout.

FIGS. 31 and 32 illustrate an example of another array constitution. FIG. 31 is an equivalent circuit diagram, while FIG. 32 is a plan view showing the layout of its essential portion. In this example, a memory gate MGL is used in common. The other portions are similar to those of the above-described examples, so that detailed description on them is omitted. The constitution of this example can be adopted, because in the cell of this example having a split gate structure, cell selection is carried out at a select gate. In FIG. 32, two memory cells BIT1 and BIT2 of WORD 1 in FIG. 31 are illustrated. Reference numerals are similar to those of the above-described examples. In FIG. 32, a processing residue 1555 appears so as to connect between the memory gates 1550. The memory gate is however used in common so that a resistance can be reduced without causing a failure due to short-circuit between memory gates.

Figure 33:
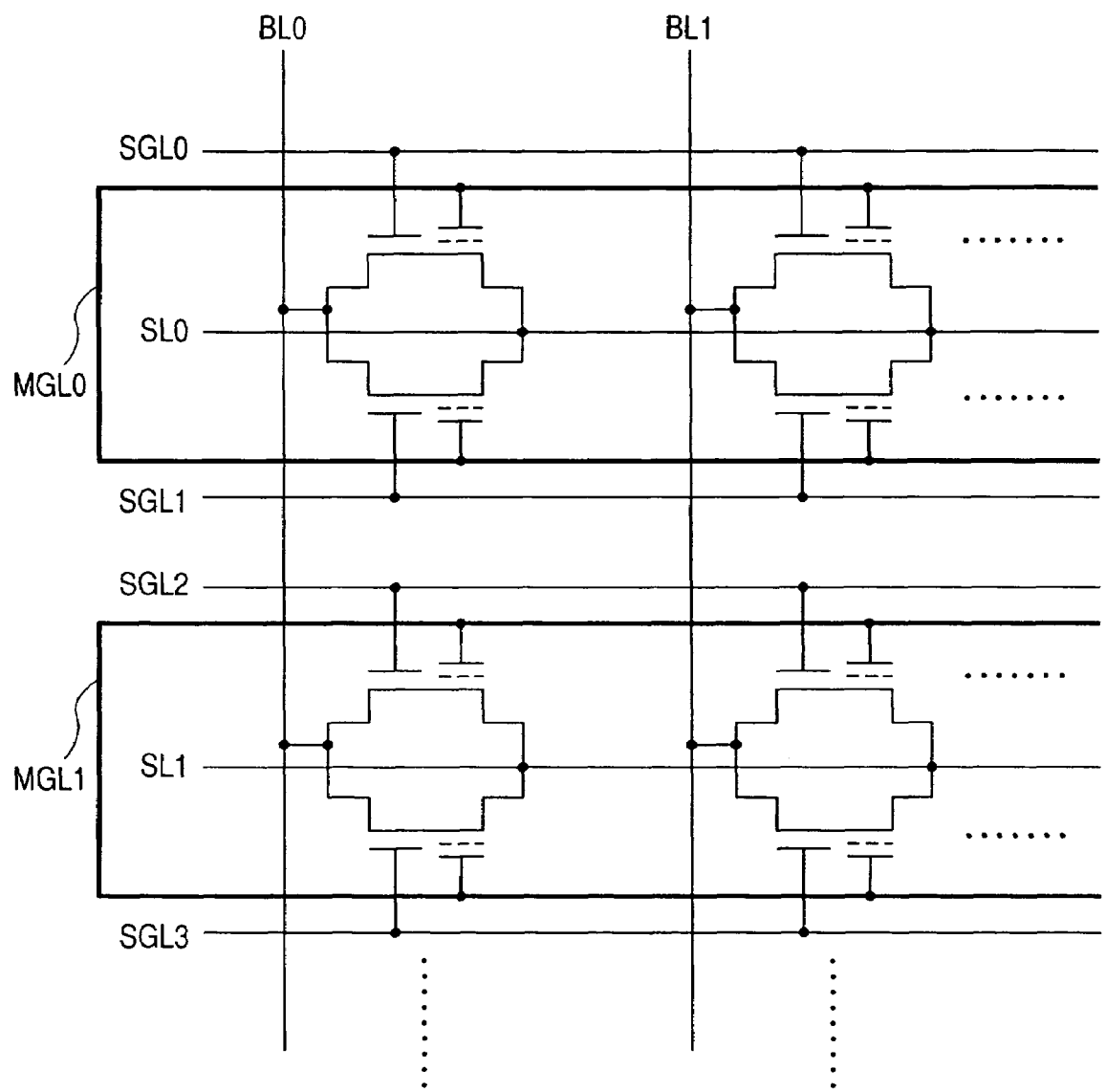
FIG. 33 is an equivalent circuit diagram for explaining a memory cell array.
Figure 34:
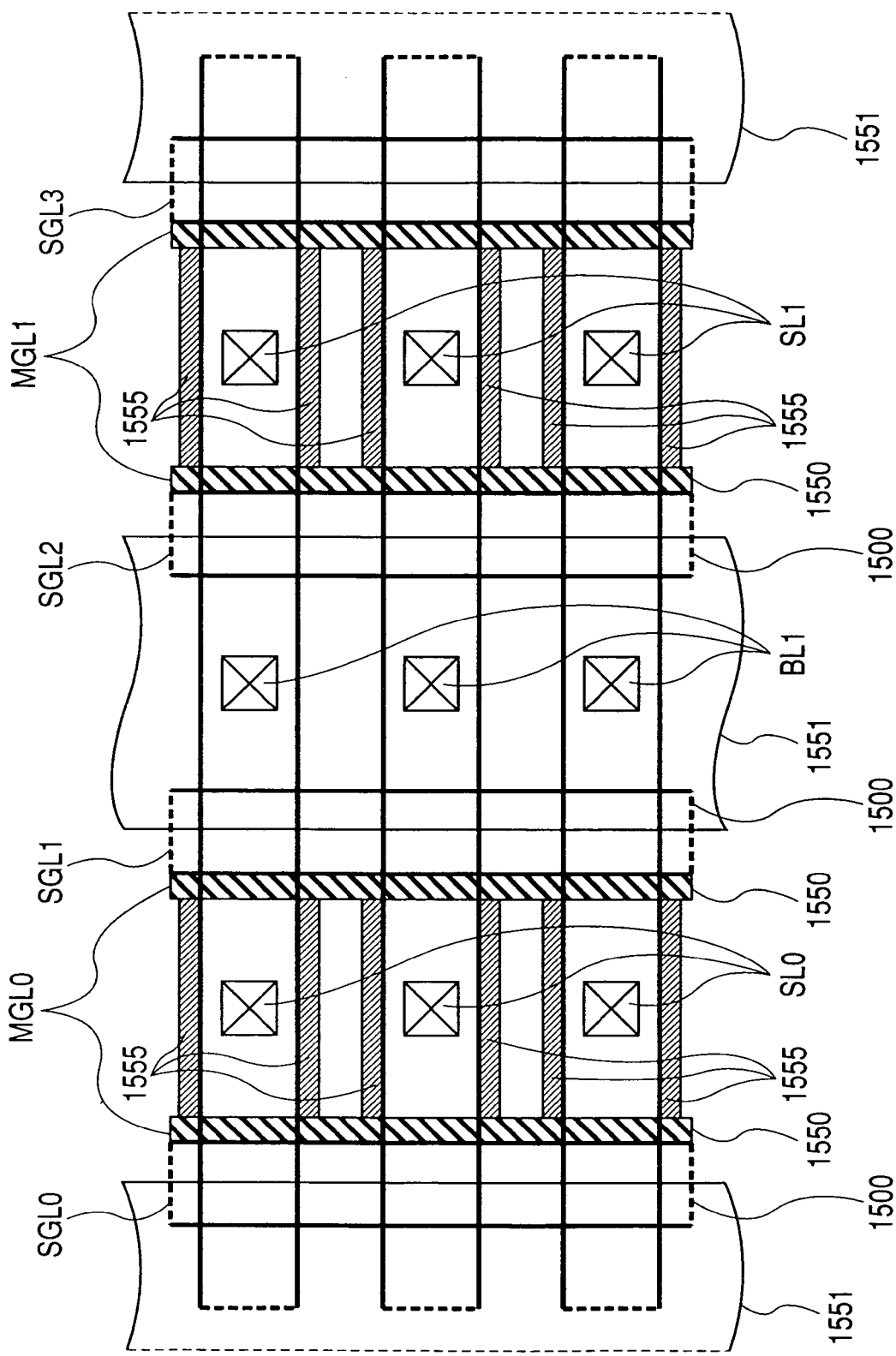
FIG. 34 is a plan view for explaining a memory cell layout.

Illustrated in FIGS. 33 and 34 is an example in which only a memory gate is used in common for opposite cells. FIG. 33 is an equivalent circuit diagram, while FIG. 34 is a plan view illustrating the layout of its essential portion. In this example, memory gates (MGL0, MGL) which are opposite to each other are examples each used in common. Regions corresponding to the memory gates MGL0 and MGL1, each used in common, are illustrated on right and left sides of FIG. 34. Moreover, two memory gates to which MGL0 is connected, which can be seen in FIG. 33, are illustrated symmetrically on the right and left sides, each as numeral 1550. Word lines SGL0 and SGL1 corresponding to the memory gate MGL0 used in common are placed in parallel to the position of numeral 1550. Two memory gates to which MGL1 is connected, which can be seen in FIG. 33, are illustrated symmetrically on the right and left sides, each as numeral 1550. Word lines SGL2 and SGl3 corresponding to the memory gate MGL1 used in common are illustrated similar to that of MGL0. The other portions are similar to the above-described examples so that detailed description on them is omitted.

In this cell, memory gates opposite to each other are used in common so that processing residue, which is indicated in FIG. 34 by numeral 1555 does not cause any problem. Indicated by numeral 1551 is an arrangement example of a mask for removing a spacer 550 formed on the side opposite to the memory gate with the select gate sandwiched therebetween.

In this example, an isolation field oxide film at a memory gate portion is retreated from the substrate surface by etching so that the active region in which a memory gate electrode is to be formed has a convex shape. When the memory gate electrode is formed, a material therefore is also formed on the side surface of the convex shape. This makes it possible to increase the effective channel width of a transistor having such a memory gate electrode, compared with a case where the active region has not a convex shape. On the other hand, when an active region in which a peripheral device is to be formed has a convex shape, a channel is formed also over the side surface, inevitably causing a difference in the threshold voltage for the formation of a channel between the side surface of the convex shape and the upper surface of the convex shape. When a voltage which is conventionally off-state is applied to the gate electrode, a channel is formed on the side surface of the convex shape. Undesirably, a leak current owing to the side surface channel flows even under an off state.

In this example, therefore, only an active region in which a memory gate electrode is to be formed is convexed, while an active region for a peripheral device is not convexed, by etching only the isolation field oxide film from the memory gate portion.

Since this example has an etching step of the element isolation insulating film at the memory gate portion, the surface height of the element isolation insulating film at the memory gate portion is lower than that of the element isolation insulating film in which transistor having a select gate electrode and a peripheral device are to be formed.

Sixth Embodiment

Figure 35:
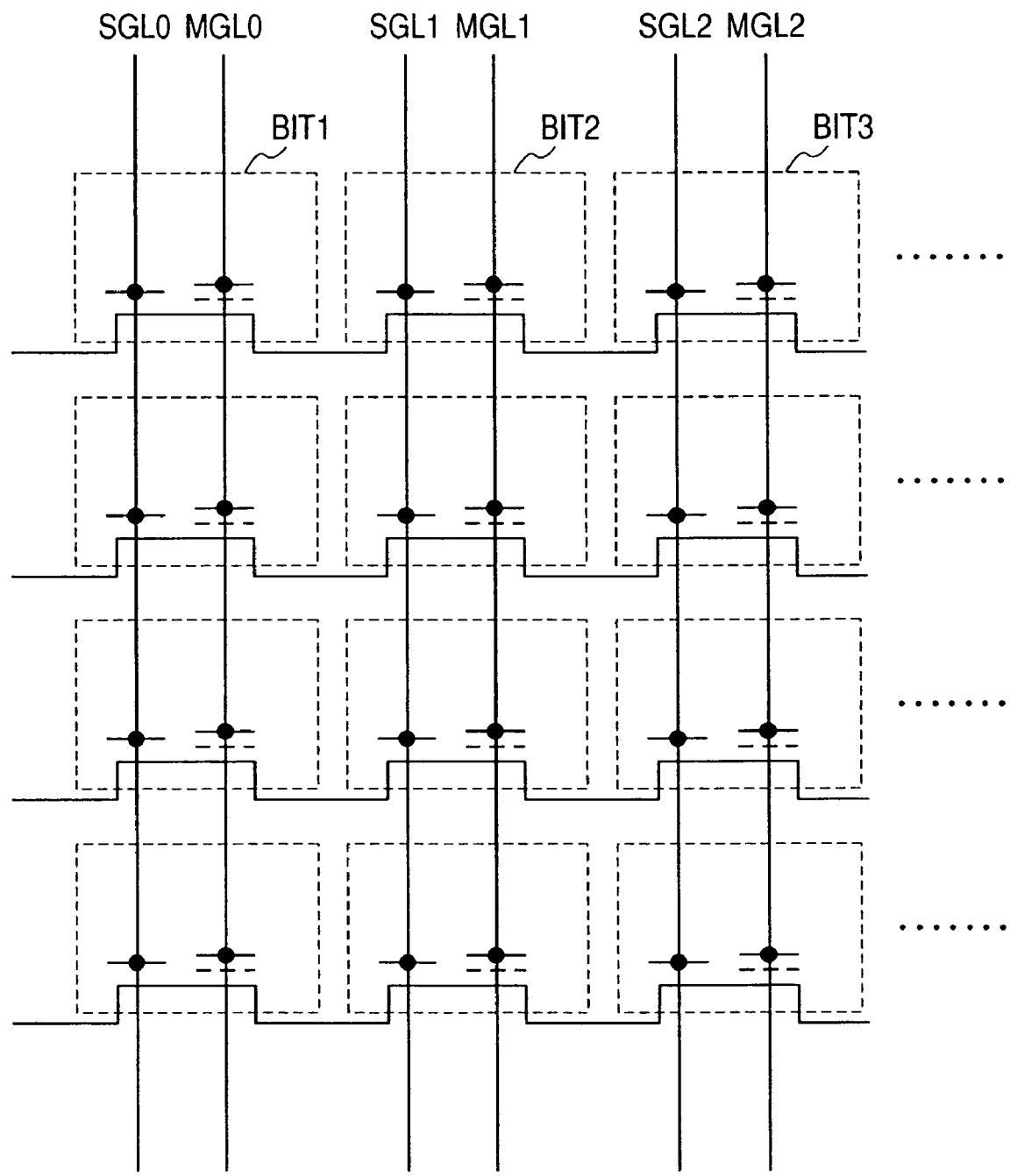
FIG. 35 is an equivalent circuit diagram for explaining a memory cell array.
Figure 36:
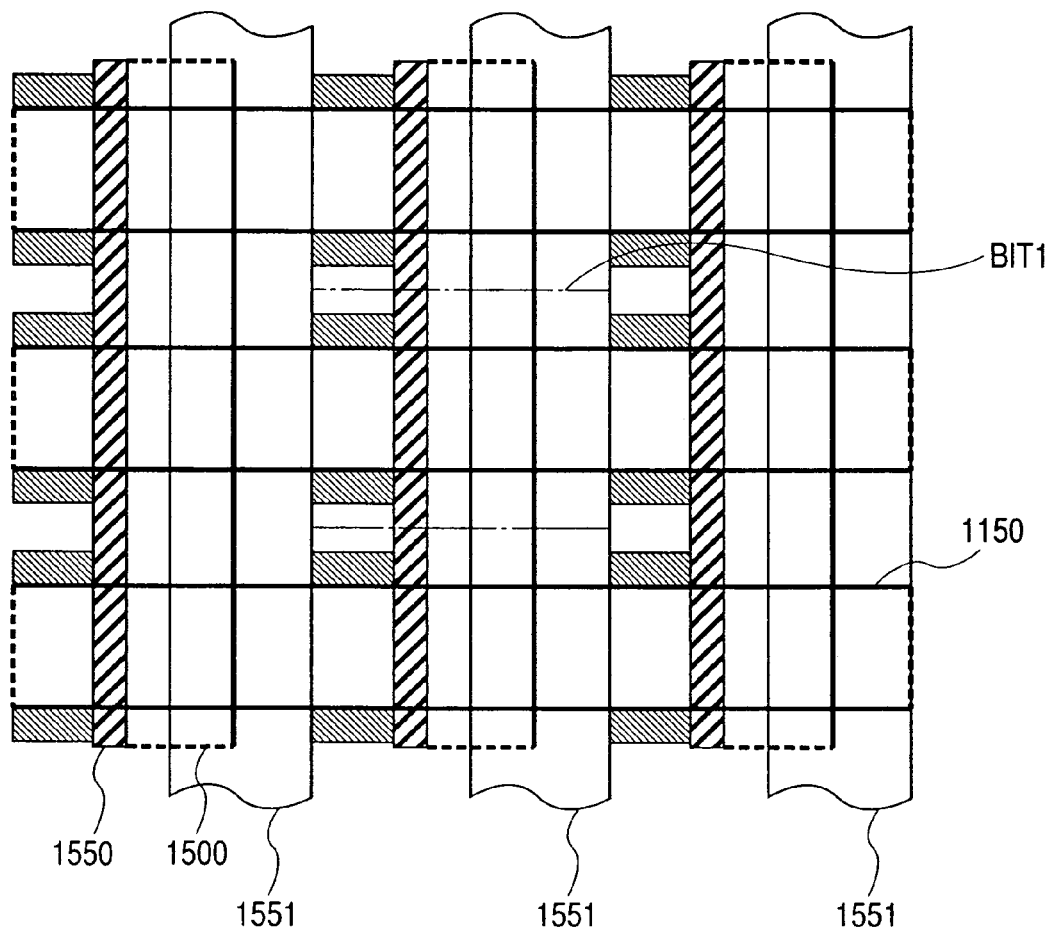
FIG. 36 is a plan view for explaining a memory cell layout.
Figure 37A:
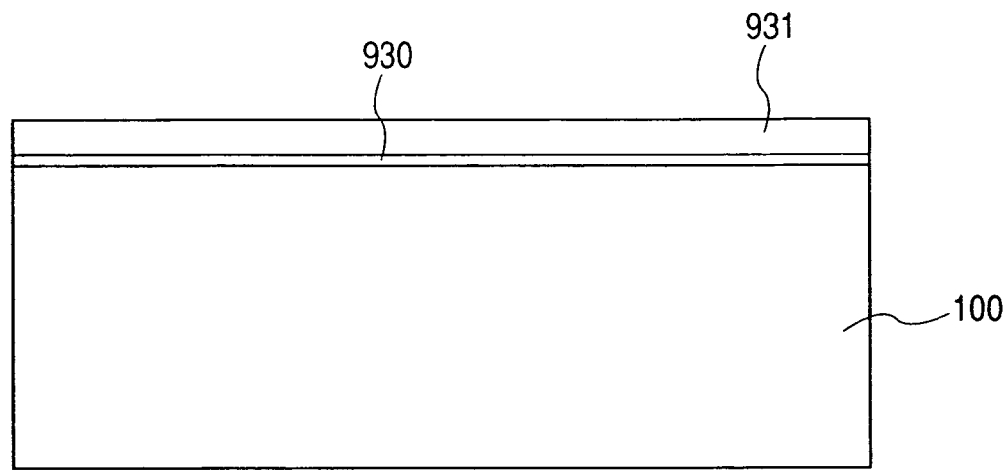
FIG. 37A is a cross-sectional structural view showing a manufacturing step of a sixth device of the present invention.
Figure 37B:
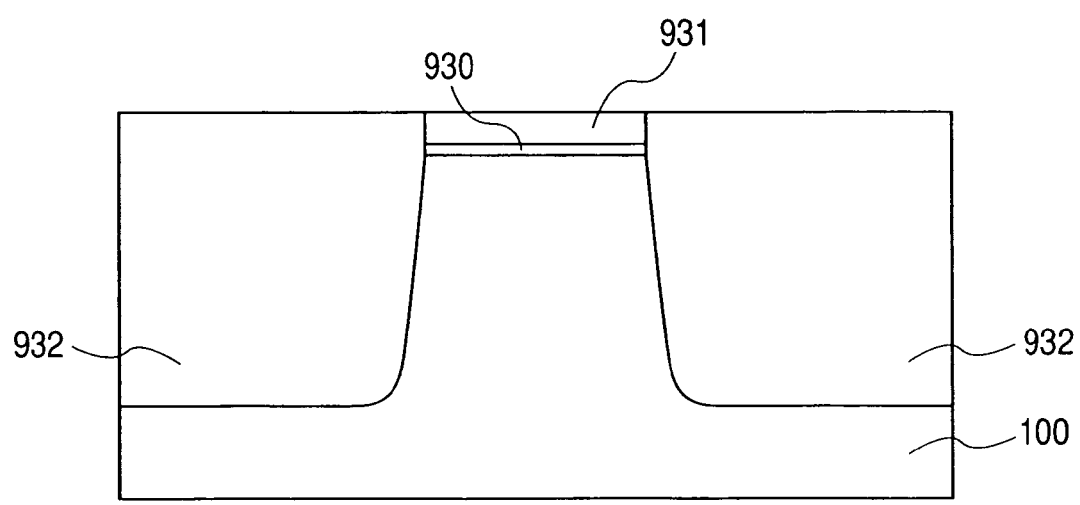
FIG. 37B is a cross-sectional structural view showing the manufacturing step of the sixth device of the present invention.
Figure 37C:
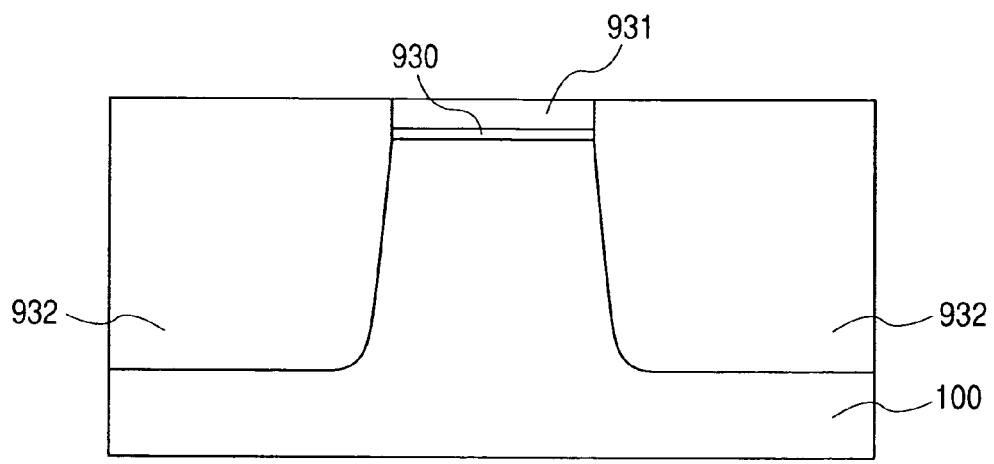
FIG. 37C is a cross-sectional structural view showing the manufacturing step of the sixth device of the present invention.
Figure 37D:
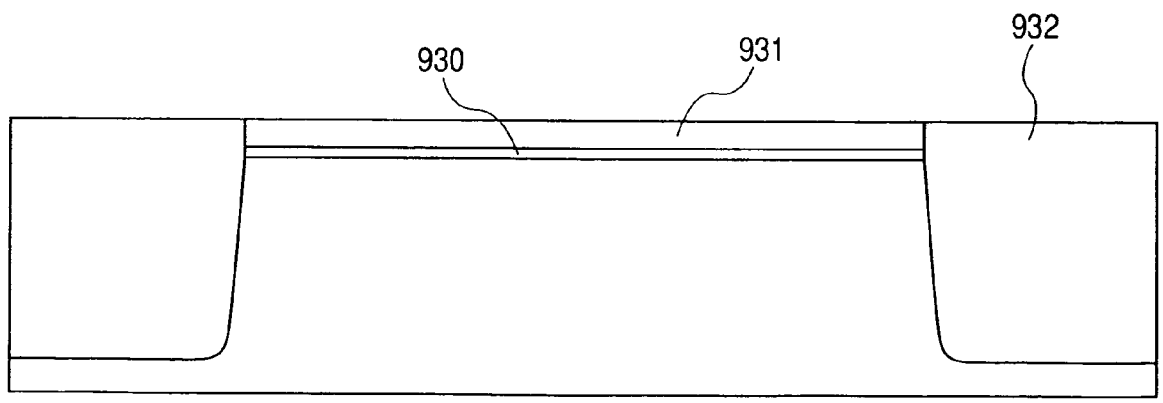
FIG. 37D is a cross-sectional structural view showing the manufacturing step of the sixth device of the present invention.
Figure 37E:
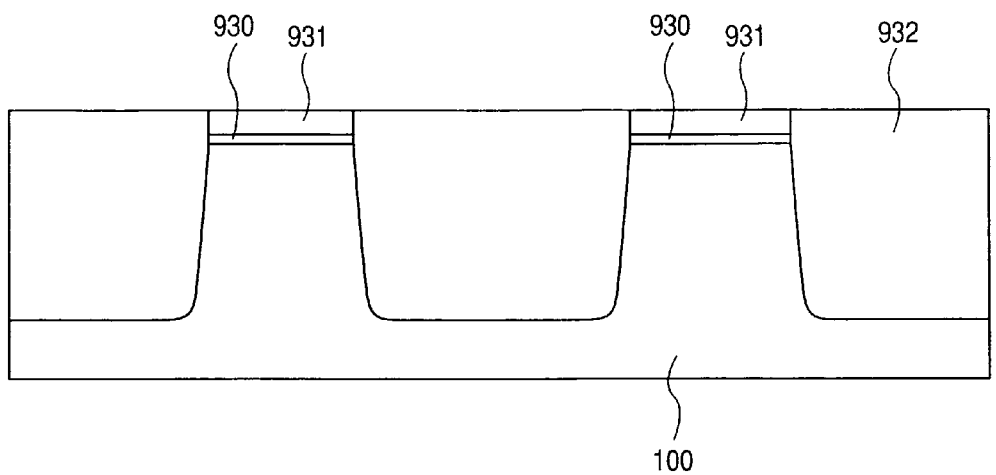
FIG. 37E is a cross-sectional structural view showing the manufacturing step of the sixth device of the present invention.
Figure 38A:
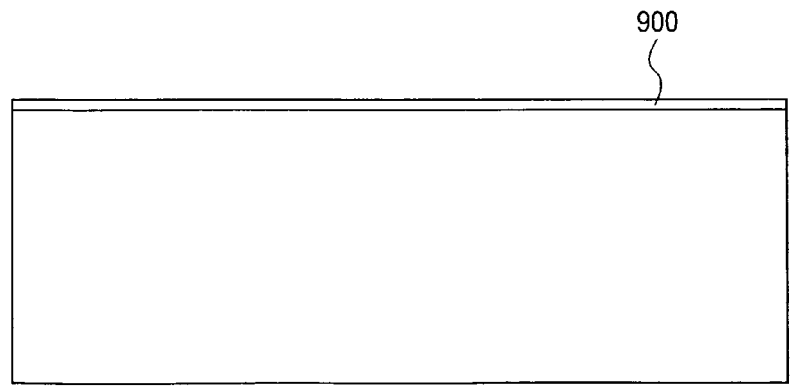
FIG. 38A is a cross-sectional structural view showing a manufacturing step of the sixth device of the present invention.
Figure 38B:
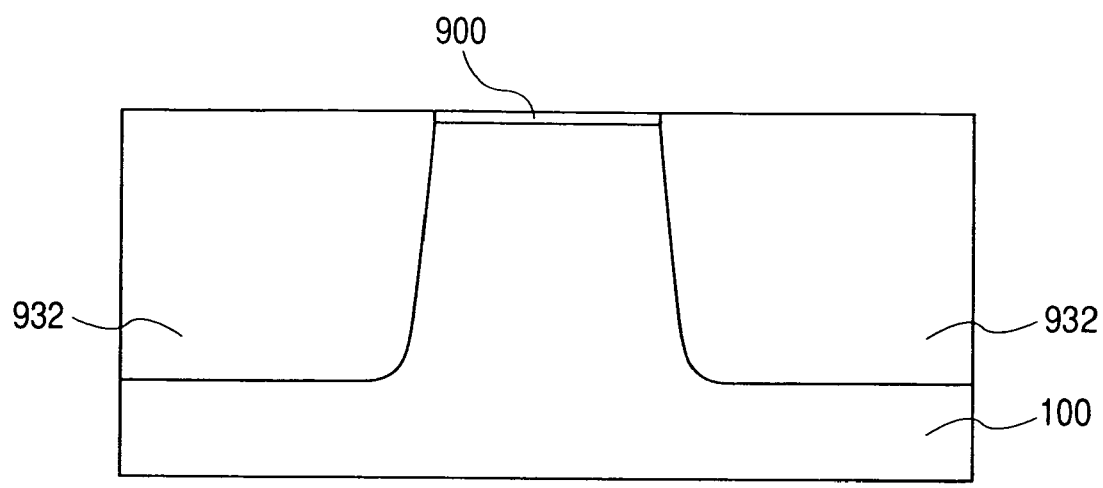
FIG. 38B is a cross-sectional structural view showing the manufacturing step of the sixth device of the present invention.
Figure 38C:
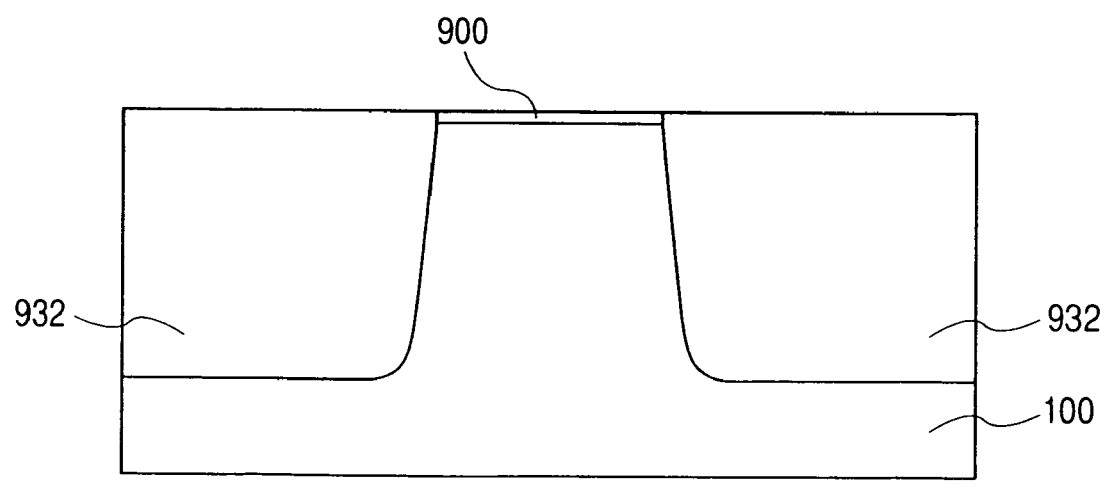
FIG. 38C is a cross-sectional structural view showing the manufacturing step of the sixth device of the present invention.
Figure 38D:
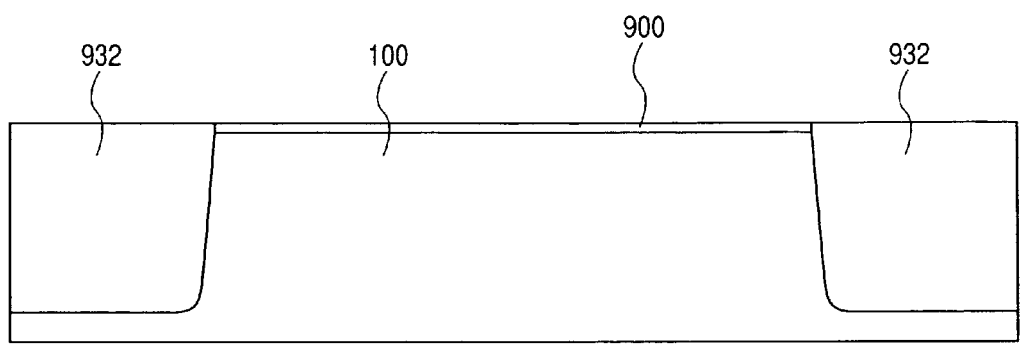
FIG. 38D is a cross-sectional structural view showing the manufacturing step of the sixth device of the present invention.
Figure 38E:
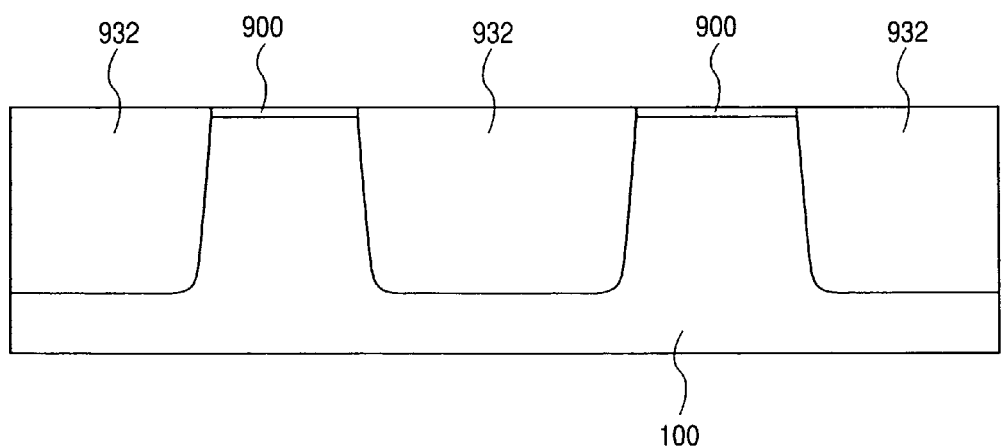
FIG. 38E is a cross-sectional structural view showing the manufacturing step of the sixth device of the present invention.
Figure 39A:
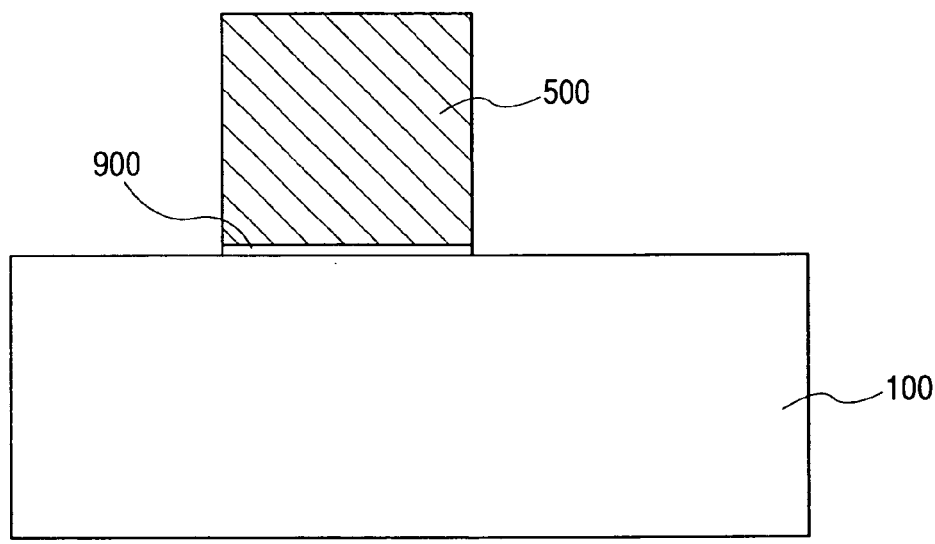
FIG. 39A is a cross-sectional structural view showing a manufacturing step of the sixth device of the present invention.
Figure 39B:
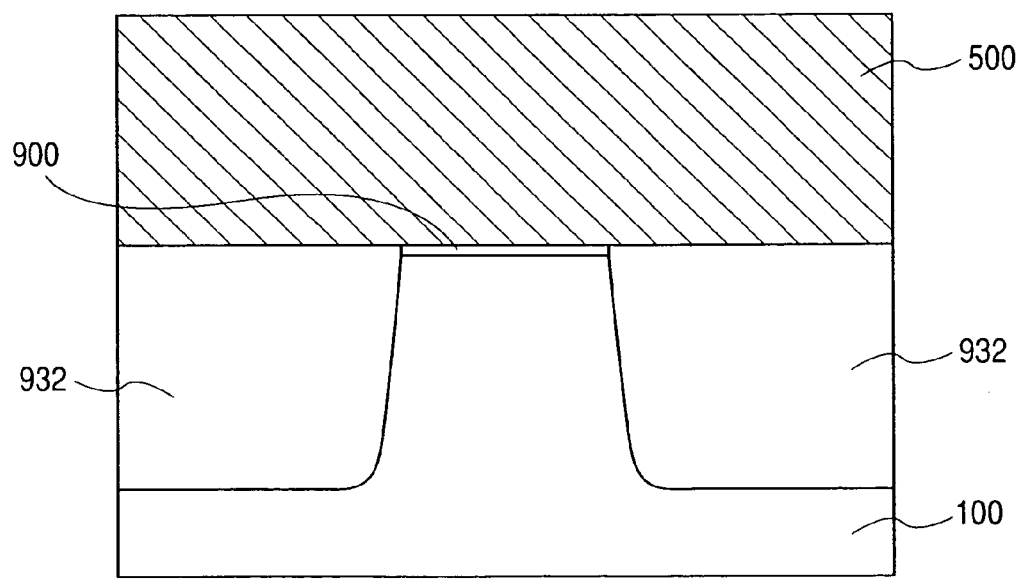
FIG. 39B is a cross-sectional structural view showing the manufacturing step of the sixth device of the present invention.
Figure 39C:
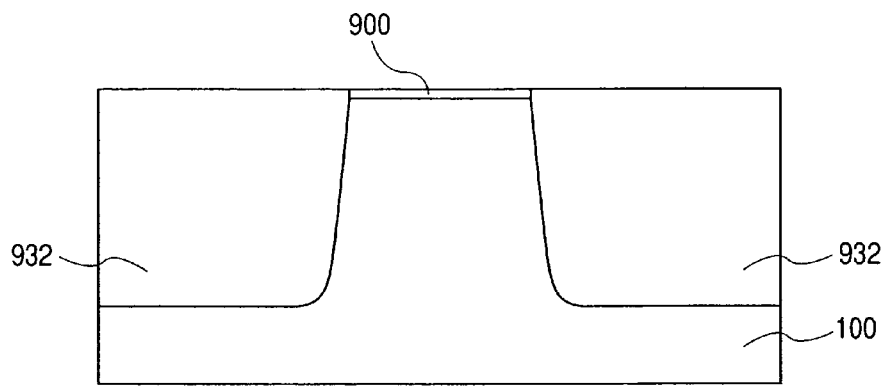
FIG. 39C is a cross-sectional structural view showing the manufacturing step of the sixth device of the present invention.
Figure 39D:
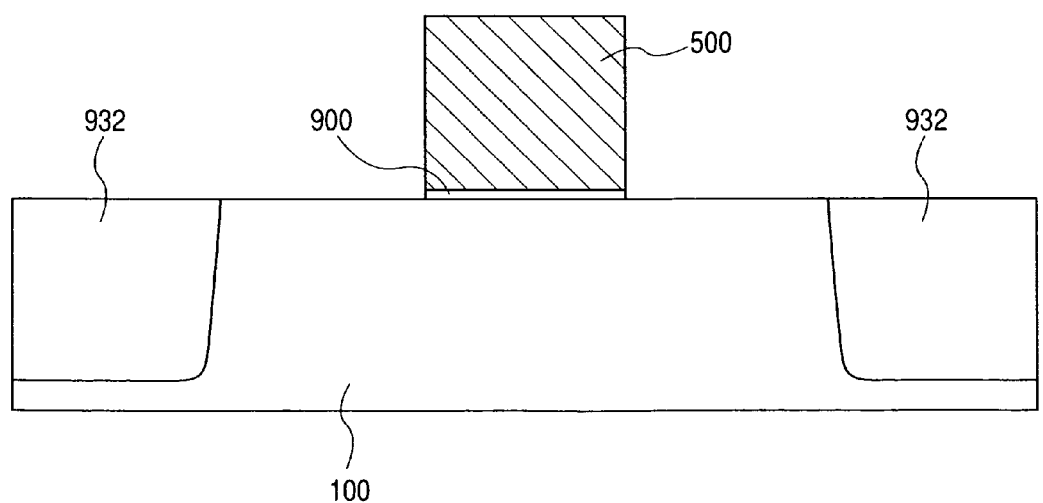
FIG. 39D is a cross-sectional structural view showing the manufacturing step of the sixth device of the present invention.
Figure 39E:
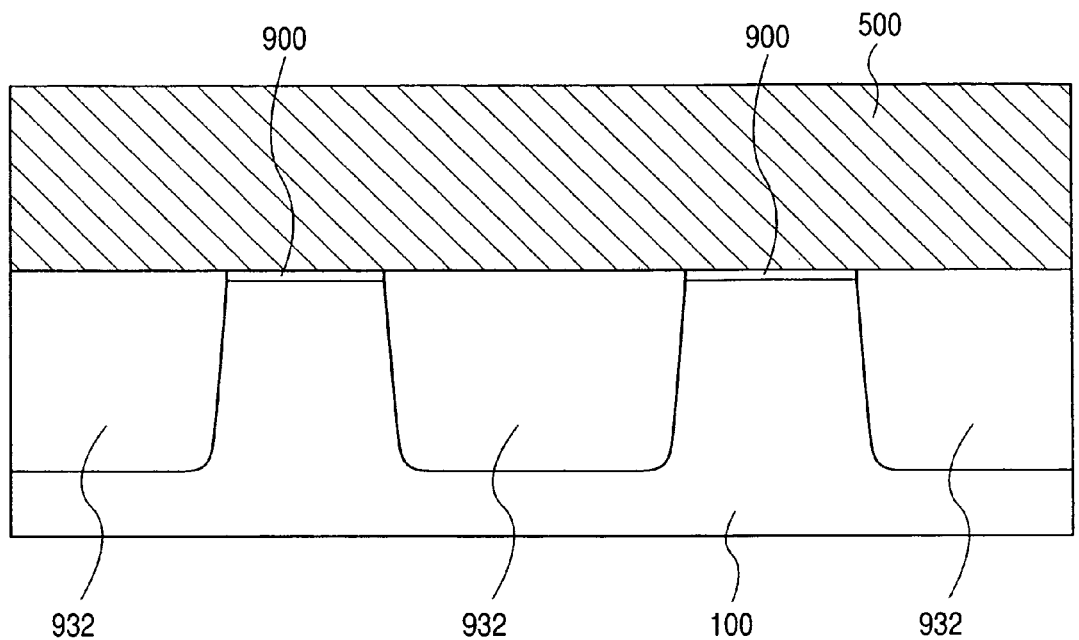
FIG. 39E is a cross-sectional structural view showing the manufacturing step of the sixth device of the present invention.
Figure 40A:
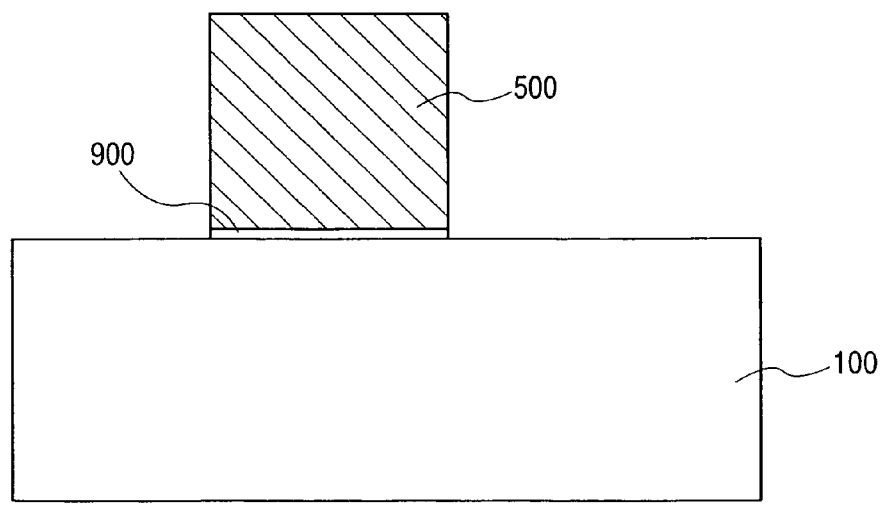
FIG. 40A is a cross-sectional structural view showing a manufacturing step of the sixth device of the present invention.
Figure 40B:
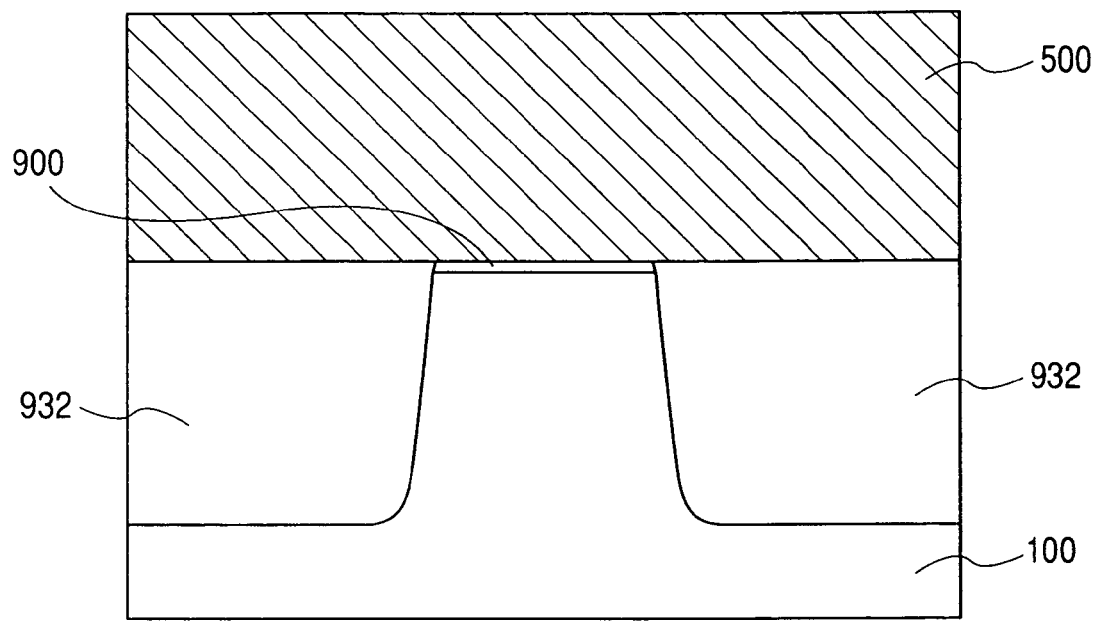
FIG. 40B is a cross-sectional structural view showing the manufacturing step of the sixth device of the present invention.
Figure 40C:
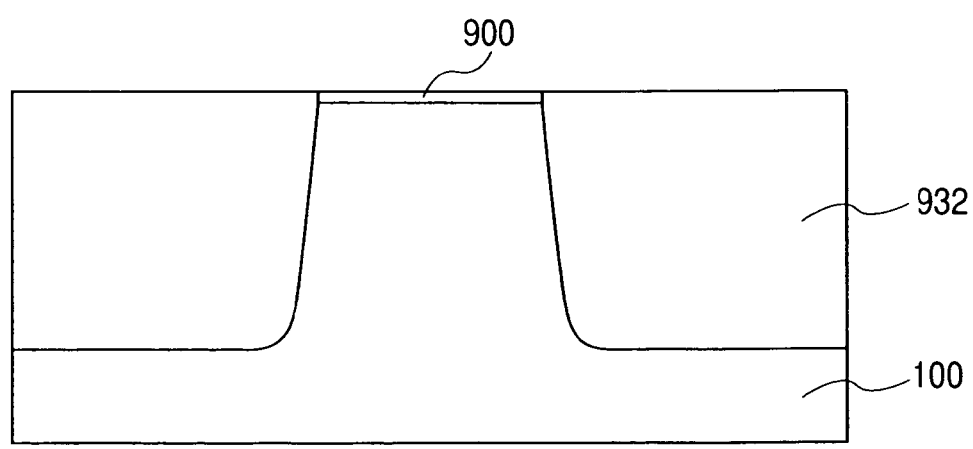
FIG. 40C is a cross-sectional structural view showing the manufacturing step of the sixth device of the present invention.
Figure 40D:
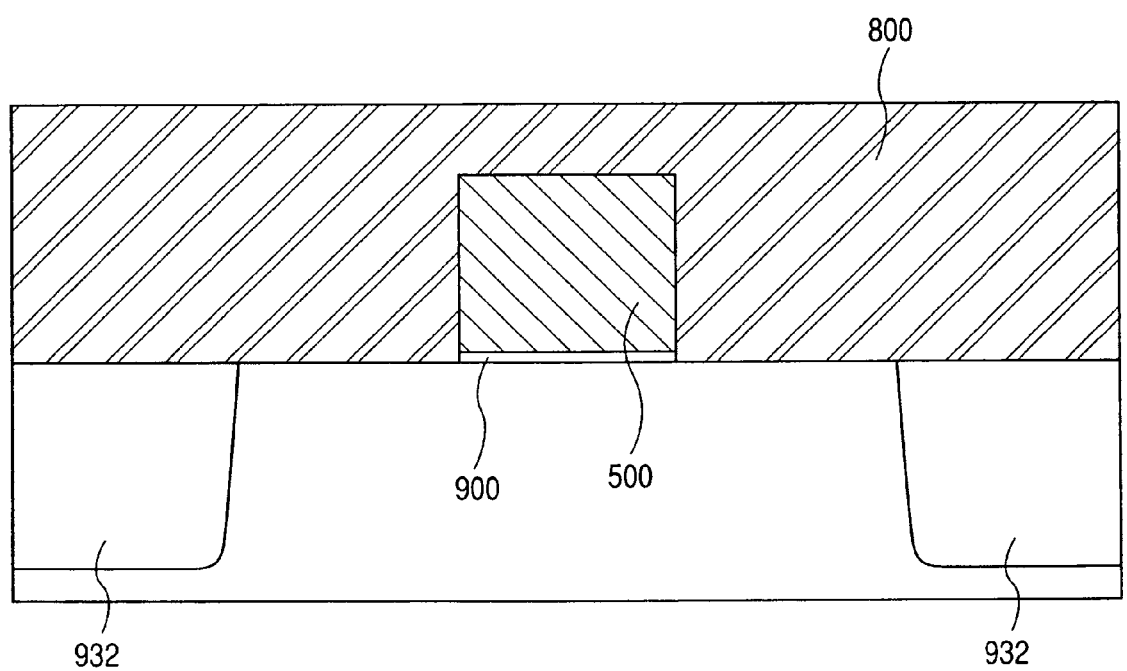
FIG. 40D is a cross-sectional structural view showing the manufacturing step of the sixth device of the present invention.
Figure 40E:
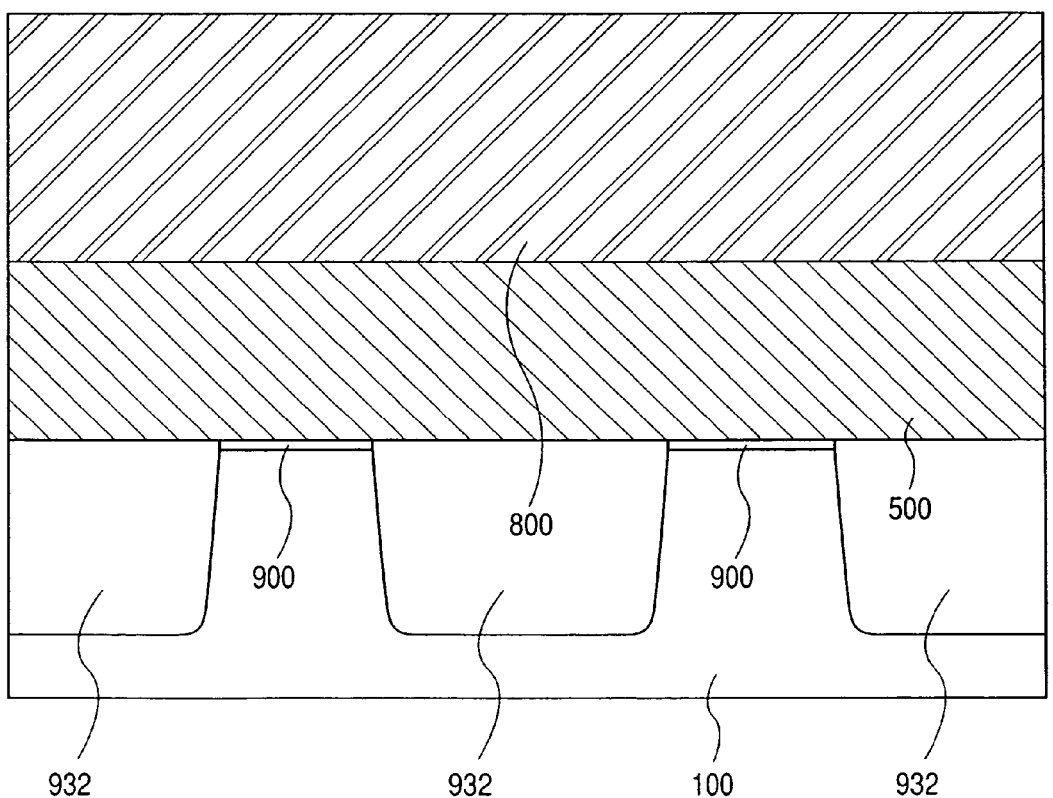
FIG. 40E is a cross-sectional structural view showing the manufacturing step of the sixth device of the present invention.
Figure 41A:
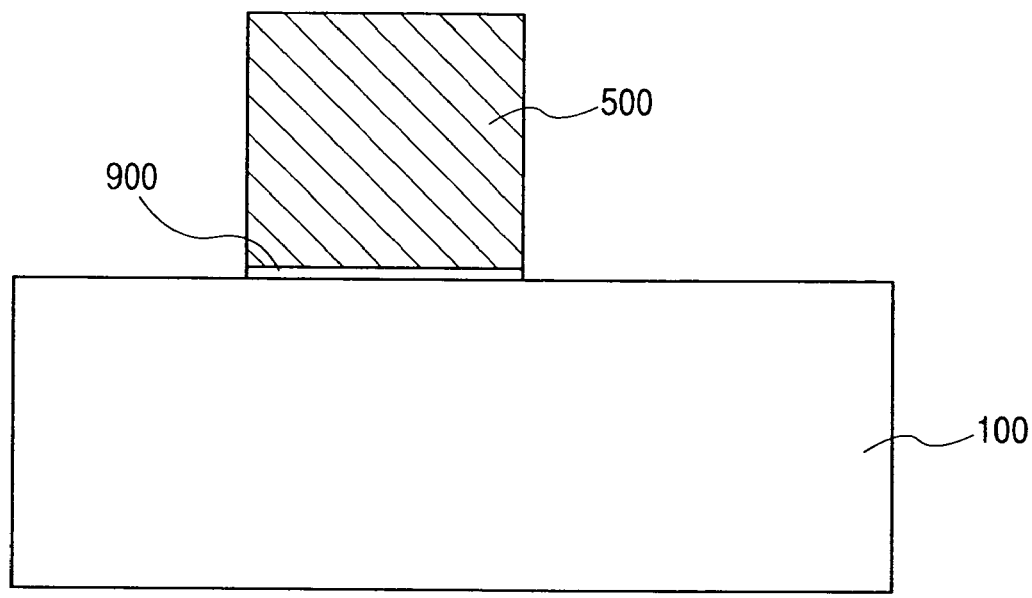
FIG. 41A is a cross-sectional structural view showing a manufacturing step of the sixth device of the present invention.
Figure 41B:
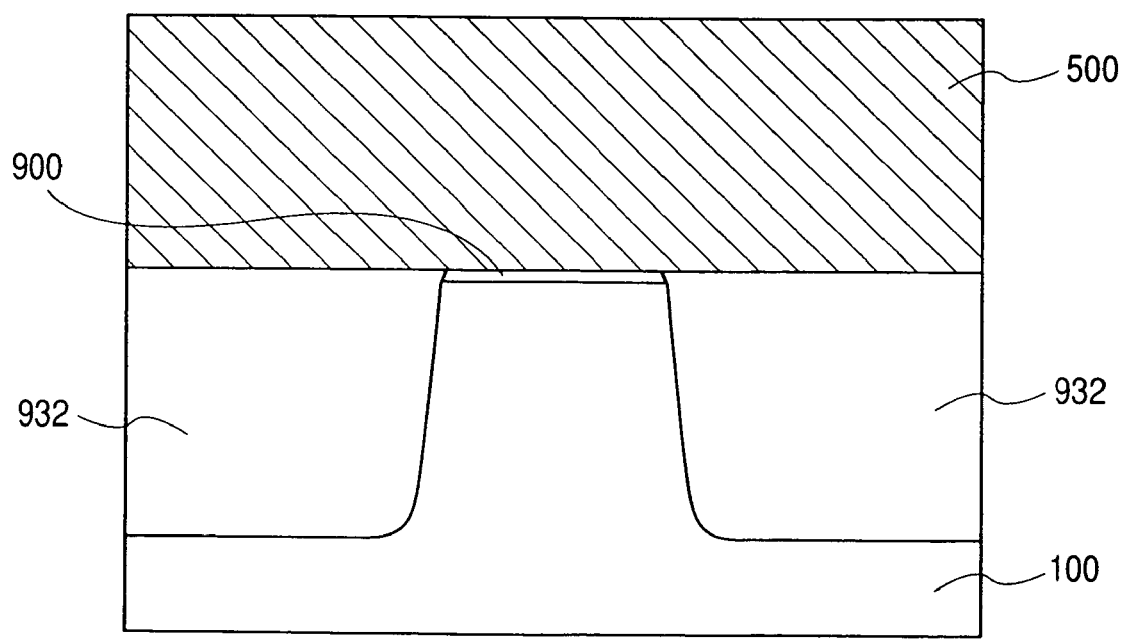
FIG. 41B is a cross-sectional structural view showing the manufacturing step of the sixth device of the present invention.
Figure 41C:
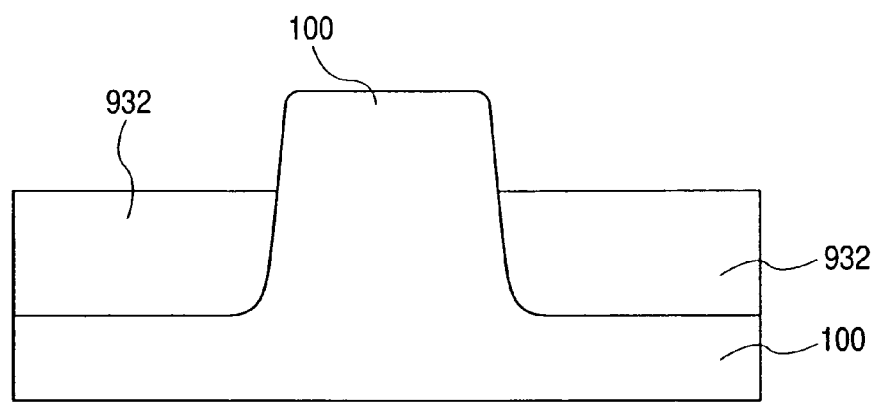
FIG. 41C is a cross-sectional structural view showing the manufacturing step of the sixth device of the present invention.
Figure 41D:
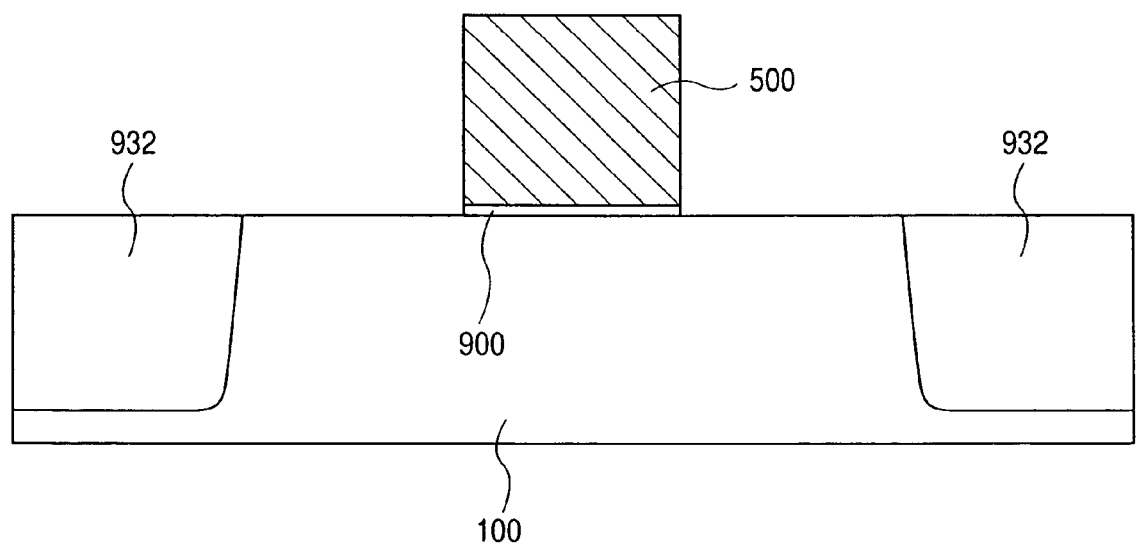
FIG. 41D is a cross-sectional structural view showing the manufacturing step of the sixth device of the present invention.
Figure 41E:
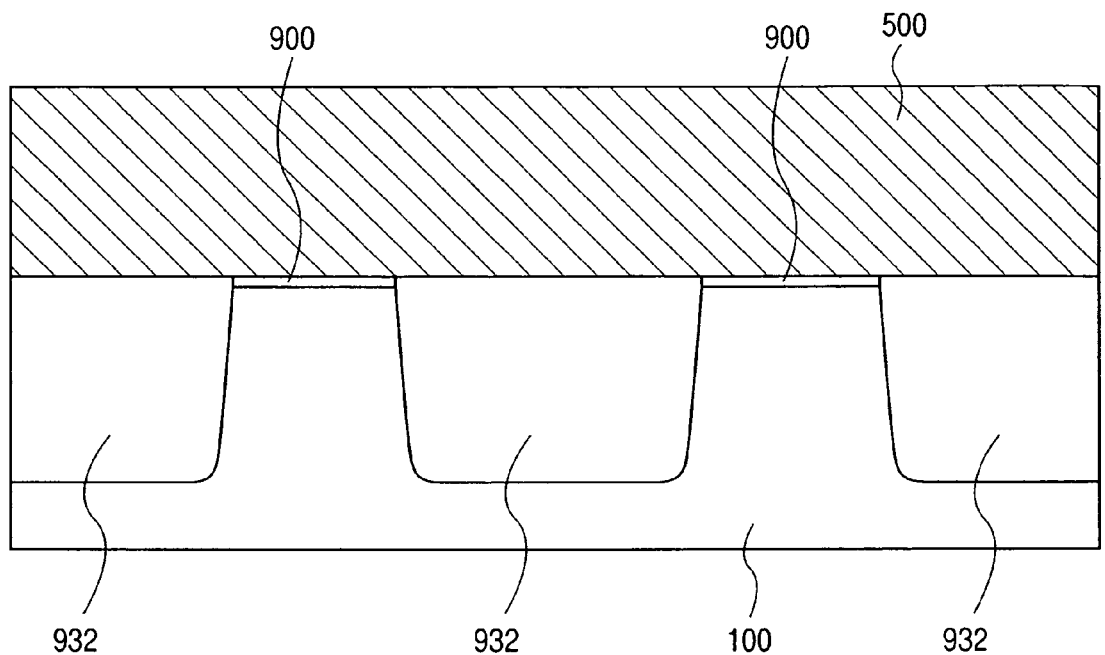
FIG. 41E is a cross-sectional structural view showing the manufacturing step of the sixth device of the present invention.
Figure 42A:
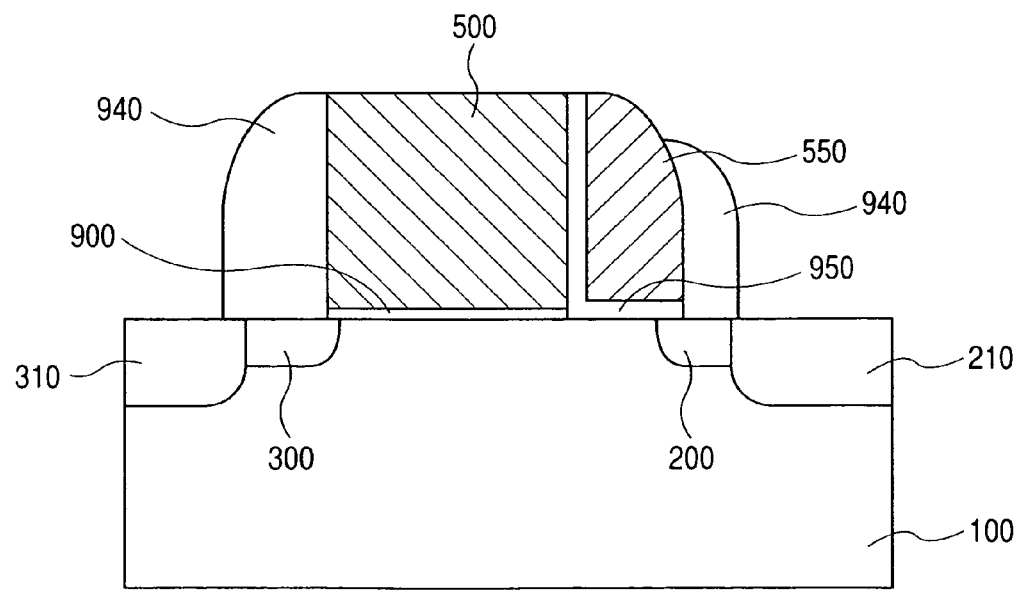
FIG. 42A is a cross-sectional structural view showing a manufacturing step of the sixth device of the present invention.
Figure 42B:
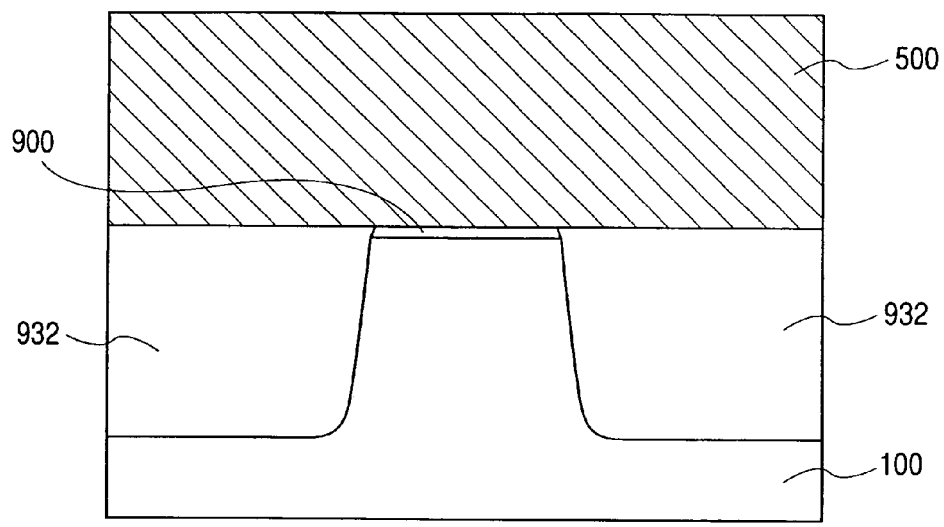
FIG. 42B is a cross-sectional structural view showing the manufacturing step of the sixth device of the present invention.
Figure 42C:
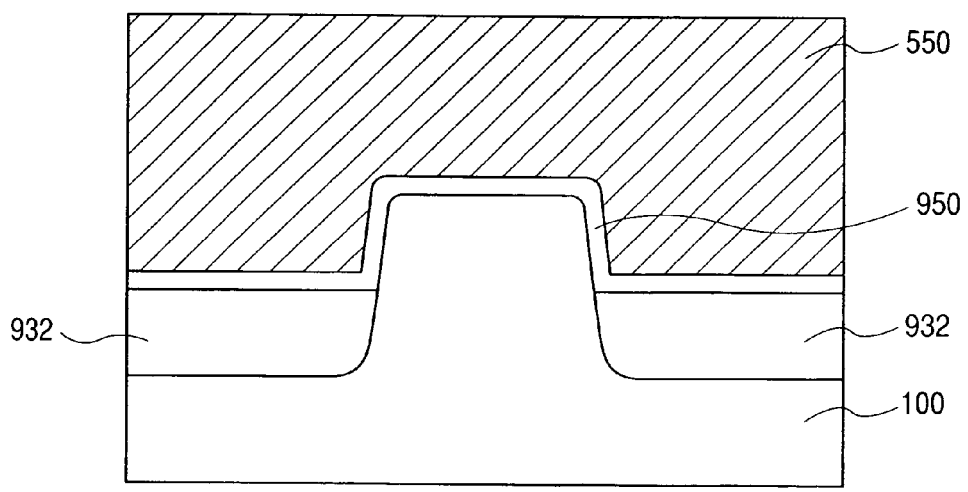
FIG. 42C is a cross-sectional structural view showing the manufacturing step of the sixth device of the present invention.
Figure 42D:
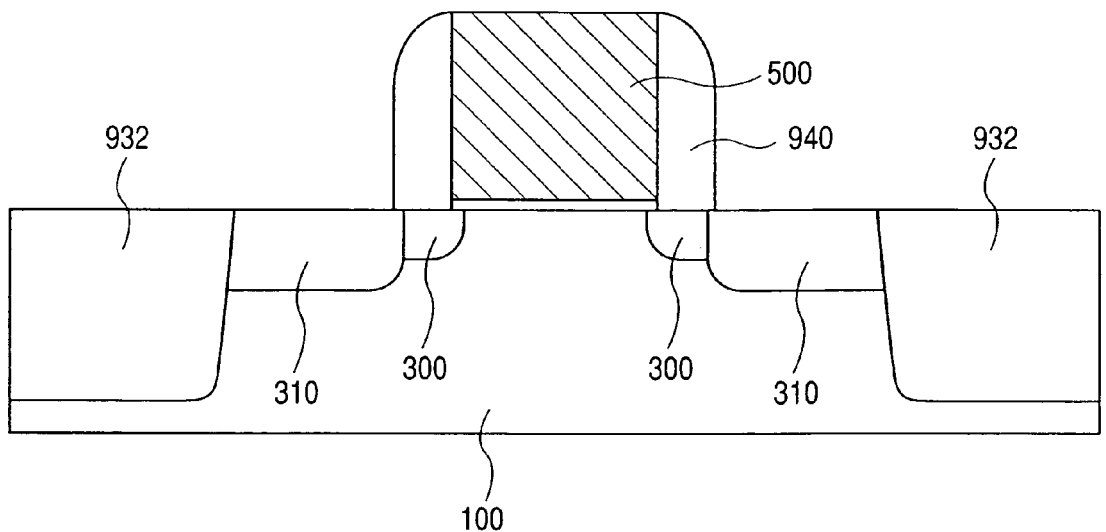
FIG. 42D is a cross-sectional structural view showing the manufacturing step of the sixth device of the present invention.
Figure 42E:
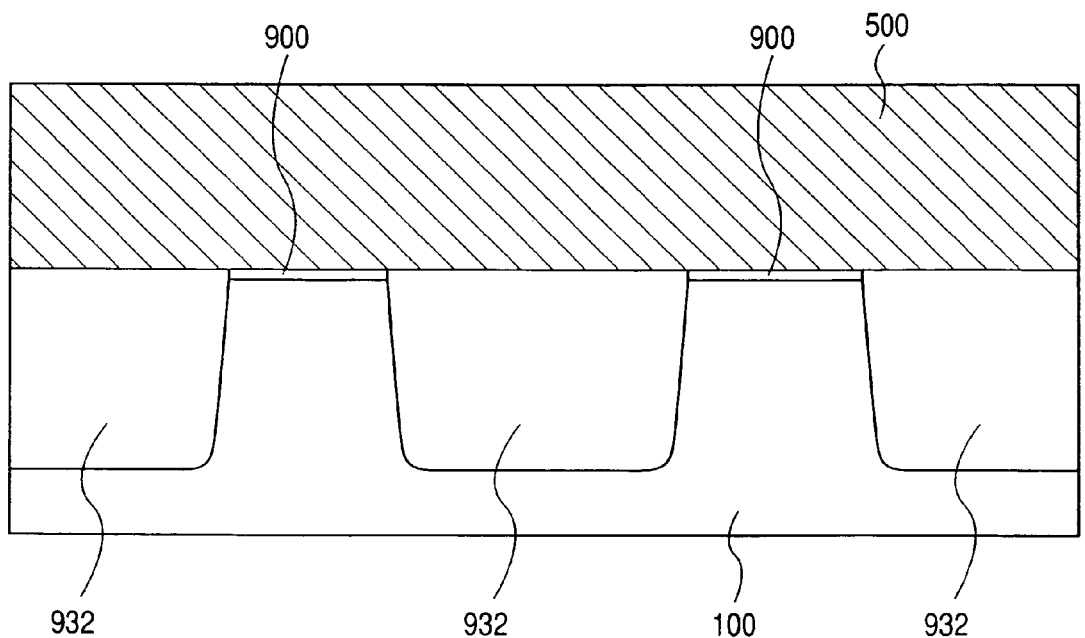
FIG. 42E is a cross-sectional structural view showing the manufacturing step of the sixth device of the present invention.

Memory cells stacked vertically one after another are shown in FIGS. 35 and 36. FIG. 35 is an equivalent circuit diagram, while FIG. 36 is a plan view illustrating the layout of its essential portion.

When memory cells are stacked vertically one after another, a problem such as short-circuit due to processing residue does not occur even if over etching for the formation of a spacer is not performed, because the spacer gate 550 on one side is necessarily removed.

An example in which only the memory gate is formed into a convex shape will next be described. FIG. 37A to FIG. 43E are cross-sectional views of a device of another example illustrated in the order of manufacturing steps. In this case, ordinary flat devices can be formed in a peripheral circuit or logic portion, simultaneously with a select gate. Devices to be used in a peripheral circuit are required to have an equal device parameter from the viewpoint of a circuit design. This widens an application range and devices manufactured at another place can be used as are. Sometimes, devices in a peripheral circuit are required to be similar to those manufactured so far. This example is therefore effective when a device having an ordinary structure is demanded.

In FIG. 37A to FIG. 43E, each of FIGS. 37A, 38A, 39A, 40A, 41A, 42A, and 43A is a cross-section (A-A cross-section) in the channel direction of FIG. 11, each of FIGS. 37B, 38B, 39B, 40B, 41B, 42B, and 43B is a cross-section (B-B cross-section) including a select gate, and each of FIGS. 37C, 38C, 39C, 40C, 41C, 42C, and 43c is a cross-section (C-C cross-section) including a memory gate. Each of FIGS. 37D, 38D, 39D, 40D, 41D, 42D, and 43D is a cross-section in the channel direction of a peripheral device, while each of FIGS. 37E, 38E, 39E, 40E, 41E, 42E, and 43E is a cross-section including the gate of a peripheral device. The illustration of the peripheral device is not included in the equivalent circuit, but that having the constitution of a conventional integrated circuit can be used. Each cross-sectional view is only that of the essential portion. Also in the below-described example, this equally applies to the drawings referring to peripheral devices.

An element isolation structure is formed in a semiconductor substrate by the above-described shallow trench isolation process (FIGS. 37A, 37B, 37C, 37D and 37E). Described specifically, after formation of an oxide film 930 over the surface of an active region of a semiconductor substrate 100, a silicon nitride film 931 is deposited thereover. By lithography, a desired portion of the film stack of the silicon nitride film 931 and the oxide film 930, and the semiconductor substrate 100 is etched to form an active region. After oxidation of the surface of a trench thus formed in the above-described step, a silicon dioxide film 932 is deposited. The oxide film over the surface of the semiconductor substrate is not illustrated for simplicity. The surface of the semiconductor substrate thus prepared is then subjected to chemical mechanical polishing, whereby a so-called shallow trench isolation is completed.

An exposed substrate surface is then thermally oxidized to form a gate insulating film 900 of 2.5 nm thickness (FIGS. 38A, 38B, 38C, 38D, and 38E).

Polycrystalline silicon 500 is deposited, followed by patterning, whereby a select gate is formed (FIGS. 39A, 39B, 39C, 39D and 39E). At this time, a gate electrode of a device in a peripheral circuit portion can be formed simultaneously.

The select gate and peripheral device portion are masked with a resist 800 (FIGS. 40A, 40B, 40C, 40D and 40E).

The isolation field oxide film 932 in the memory gate portion is etched by 50 nm (FIGS. 41A, 41B, 41C, 41D and 41E).

After formation of a gate insulating film 950 of the memory gate, a memory gate 550 is formed by the spacer formation process. Then, by ion implantation, diffusion layers 200, 210, 300 and 310 are formed (FIGS. 42A, 42B, 42C, 42D and 42E). These processes can be carried out as in the above-described examples.

Illustrated is a structure in which a silicide portion is formed by using the conventional SALICIDE process (FIGS. 43A, 43B, 43C, 43D and 43E).

Figure 43A:
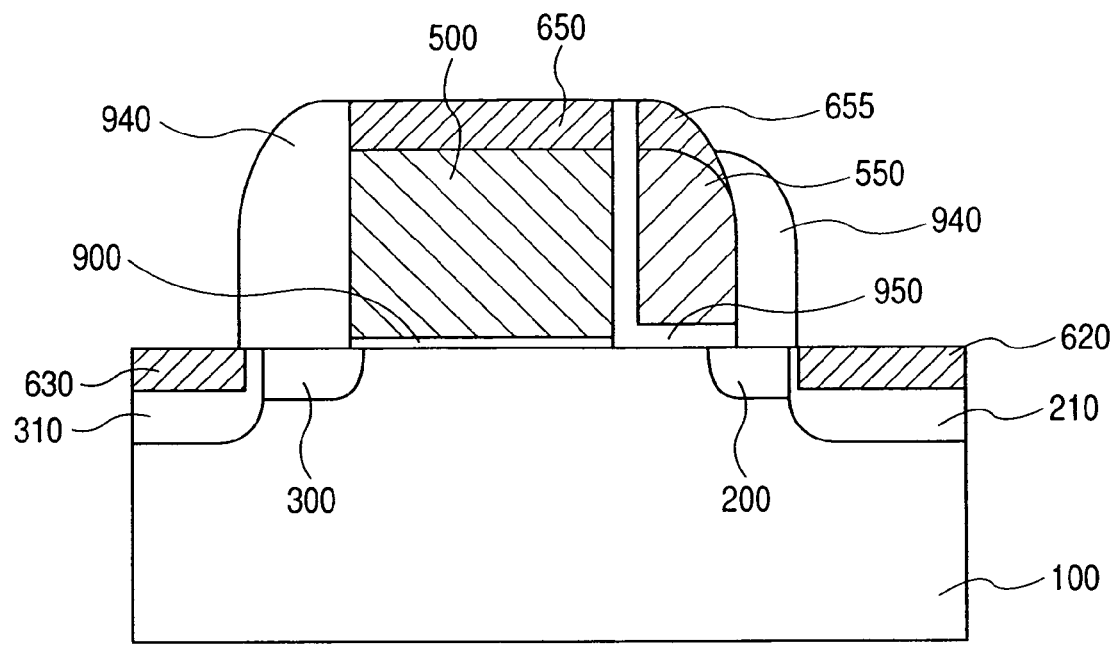
FIG. 43A is a cross-sectional structural view showing a manufacturing step of the sixth device of the present invention.
Figure 43B:
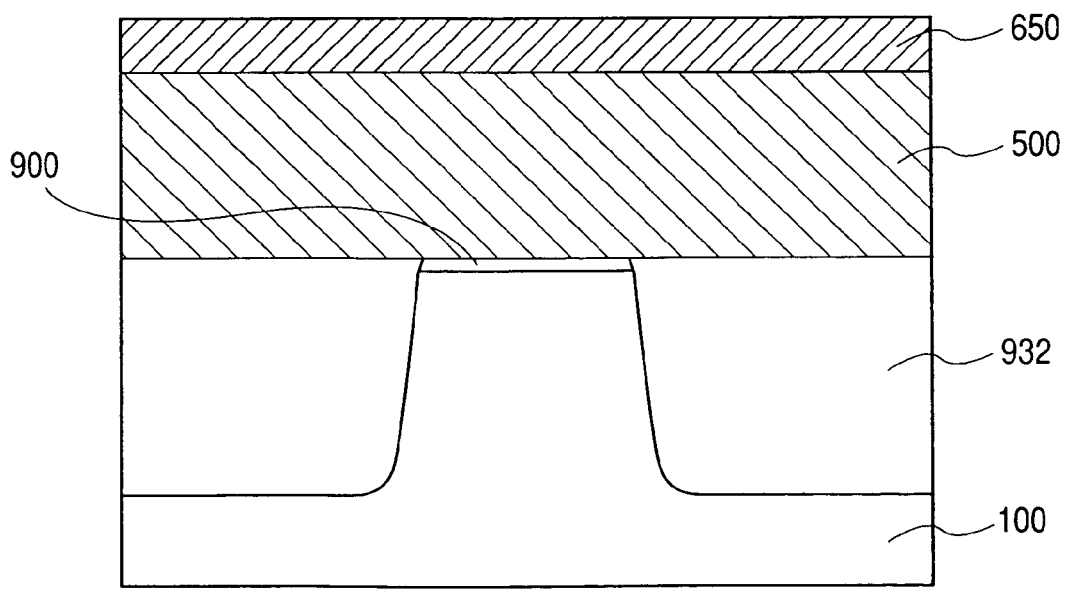
FIG. 43B is a cross-sectional structural view showing the manufacturing step of the sixth device of the present invention.
Figure 43C:
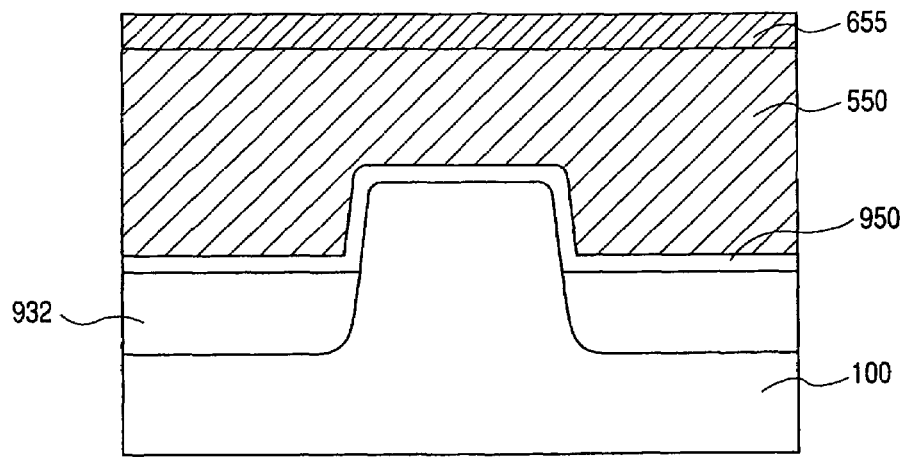
FIG. 43C is a cross-sectional structural view showing the manufacturing step of the sixth device of the present invention.
Figure 43D:
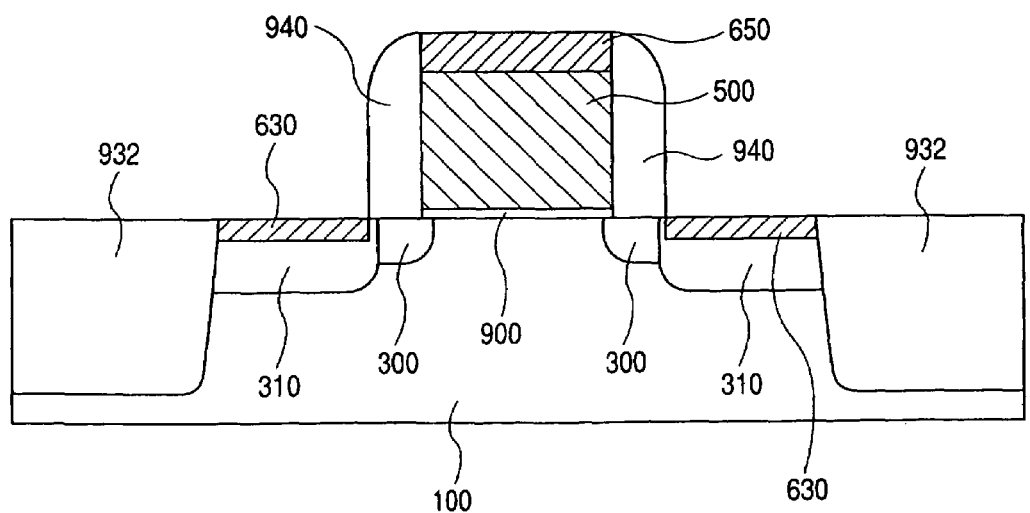
FIG. 43D is a cross-sectional structural view showing the manufacturing step of the sixth device of the present invention.
Figure 43E:
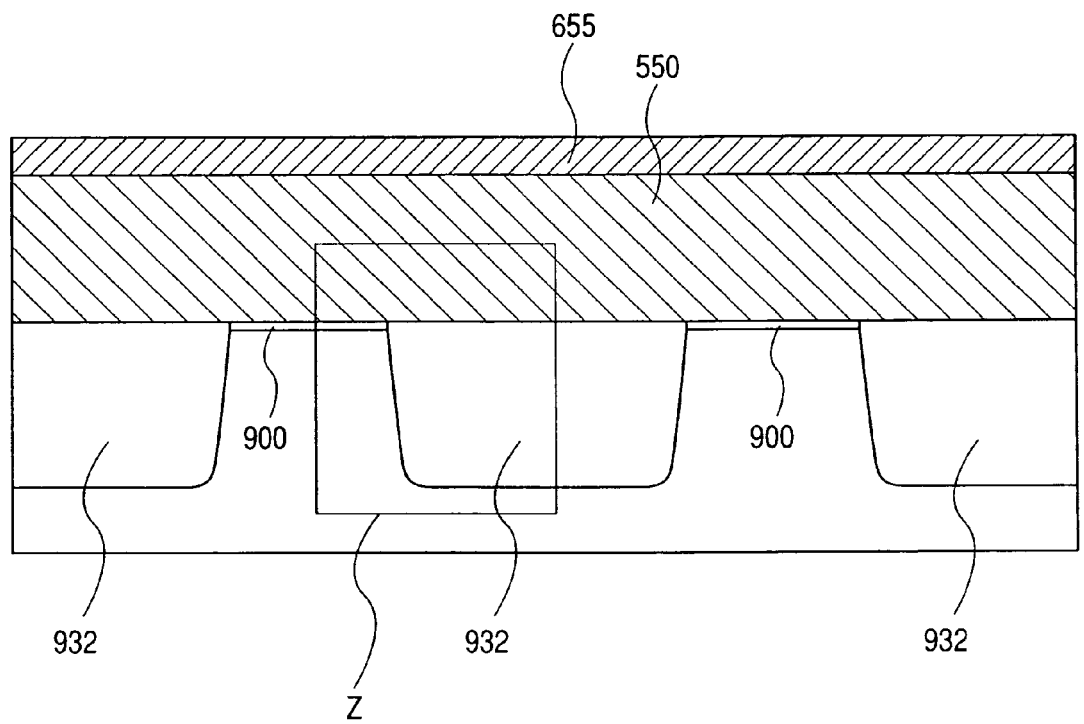
FIG. 43E is a cross-sectional structural view showing the manufacturing step of the sixth device of the present invention.
Figure 43F:
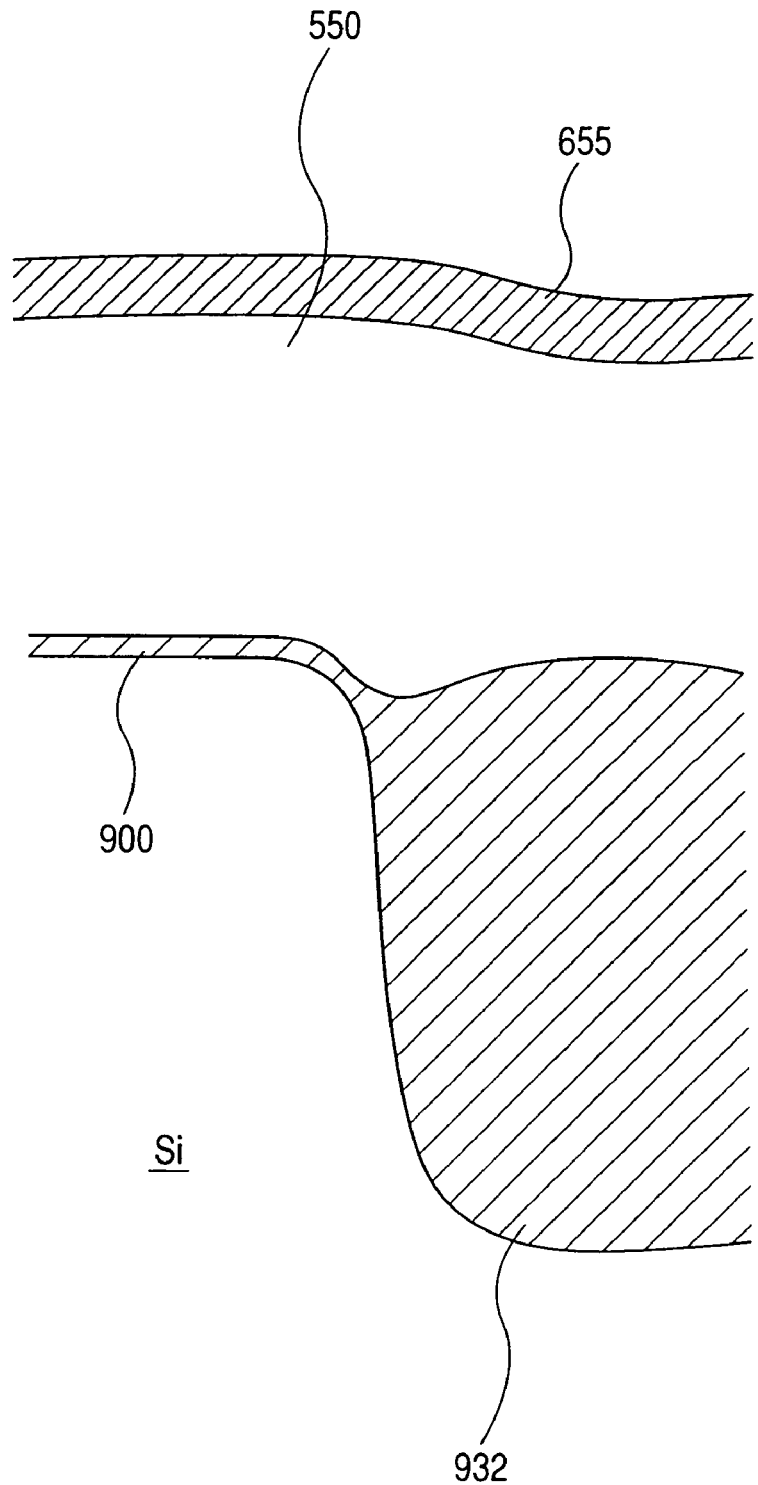
FIG. 43F is a partially enlarged view of a portion Z of FIG. 43E.
Figure 44A:
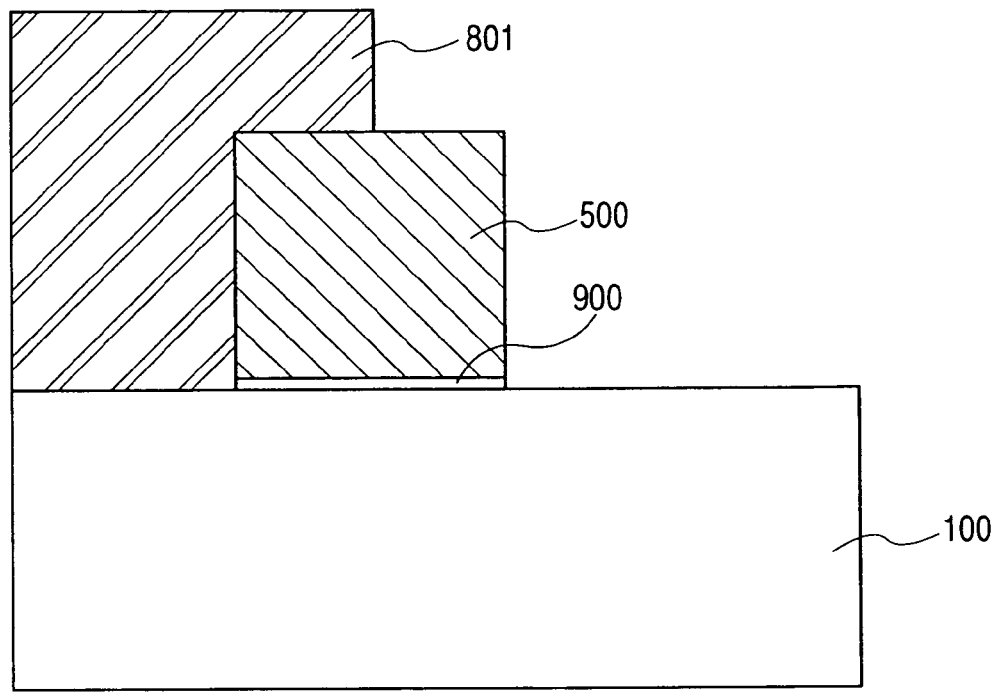
FIG. 44A is a cross-sectional structural view showing a manufacturing step of the seventh device of the present invention.
Figure 44B:
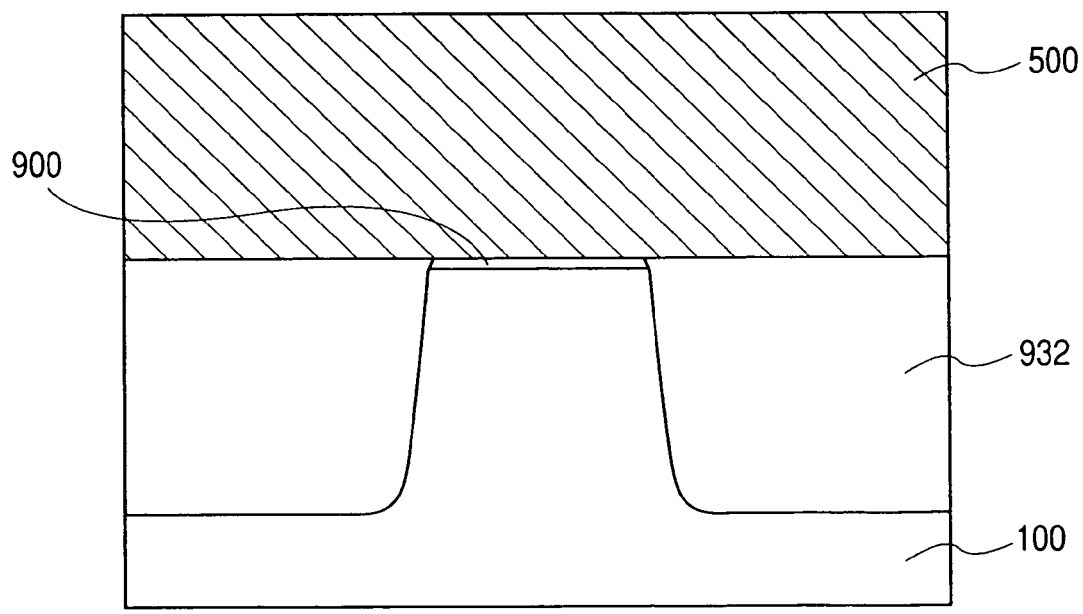
FIG. 44B is a cross-sectional structural view showing the manufacturing step of the seventh device of the present invention.
Figure 44C:
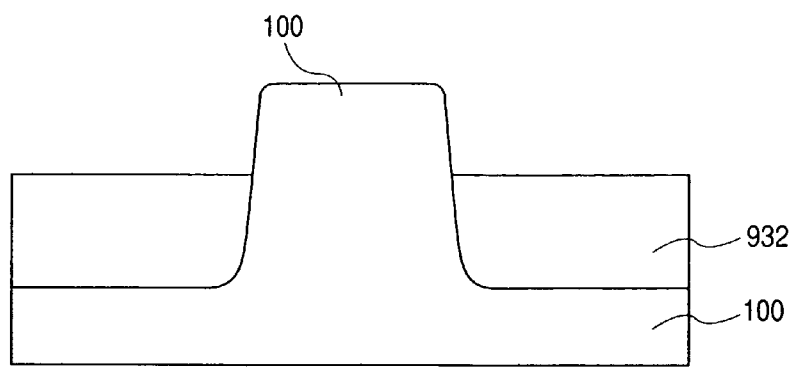
FIG. 44C is a cross-sectional structural view showing the manufacturing step of the seventh device of the present invention.
Figure 44D:
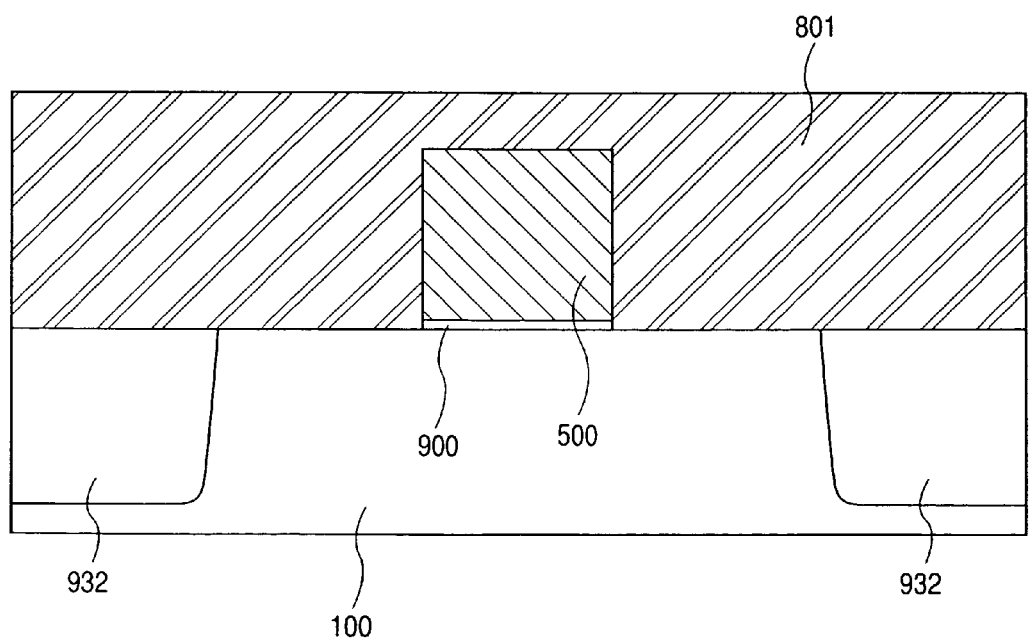
FIG. 44D is a cross-sectional structural view showing the manufacturing step of the seventh device of the present invention.
Figure 44E:
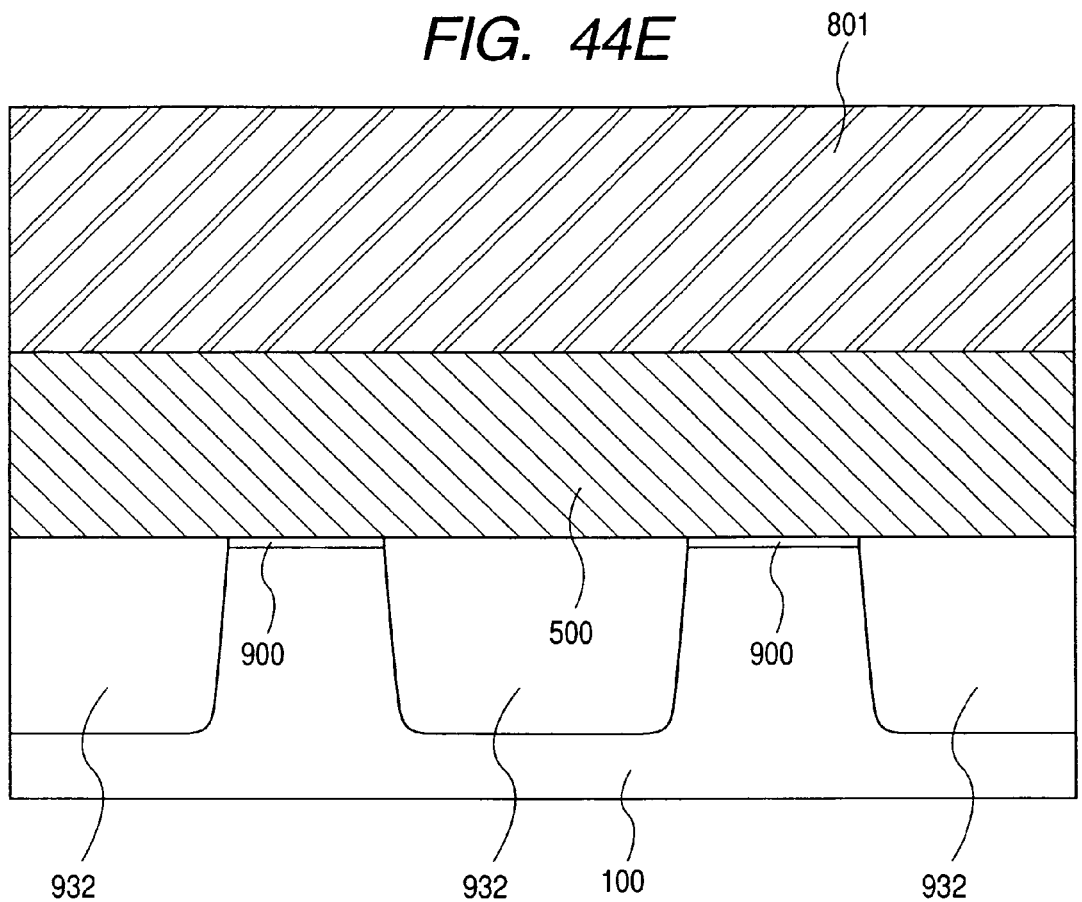
FIG. 44E is a cross-sectional structural view showing the manufacturing step of the seventh device of the present invention.
Figure 45A:
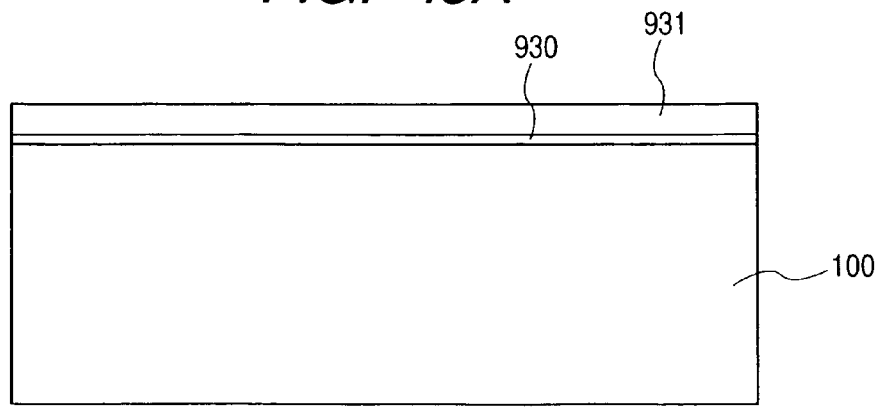
FIG. 45A is a cross-sectional structural view showing a manufacturing step of the eighth device of the present invention.
Figure 45B:
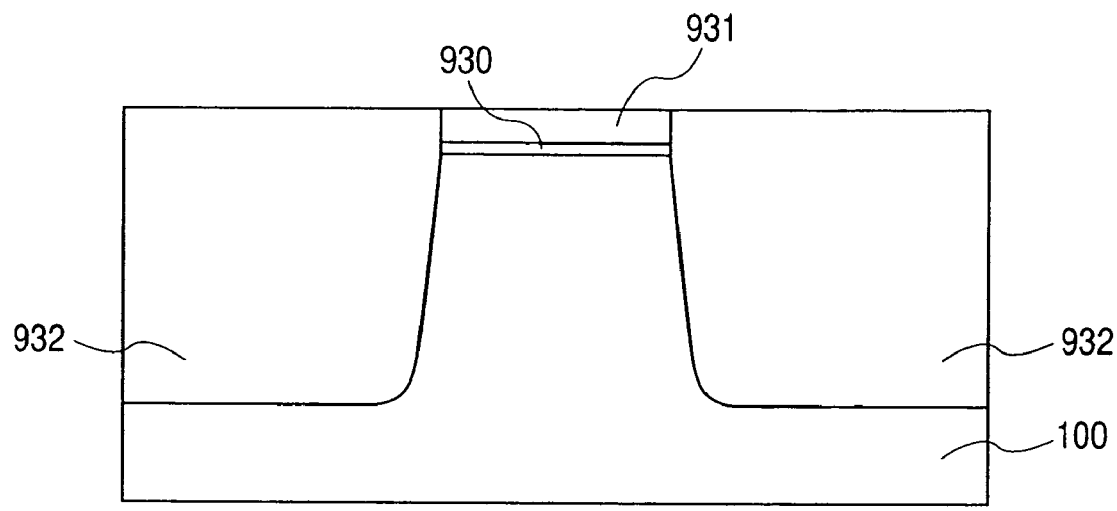
FIG. 45B is a cross-sectional structural view showing the manufacturing step of the eighth device of the present invention.
Figure 45C:
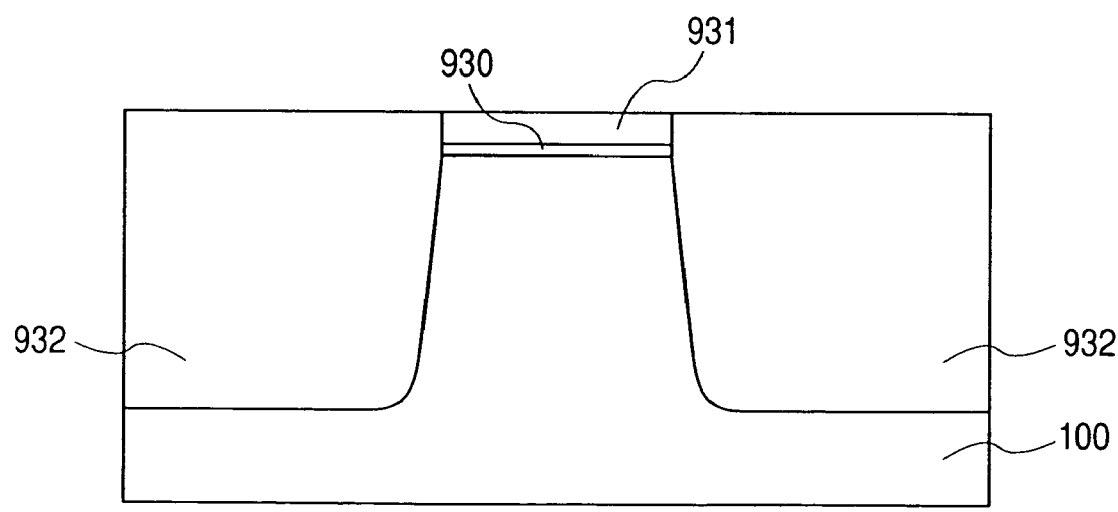
FIG. 45C is a cross-sectional structural view showing the manufacturing step of the eighth device of the present invention.
Figure 45D:
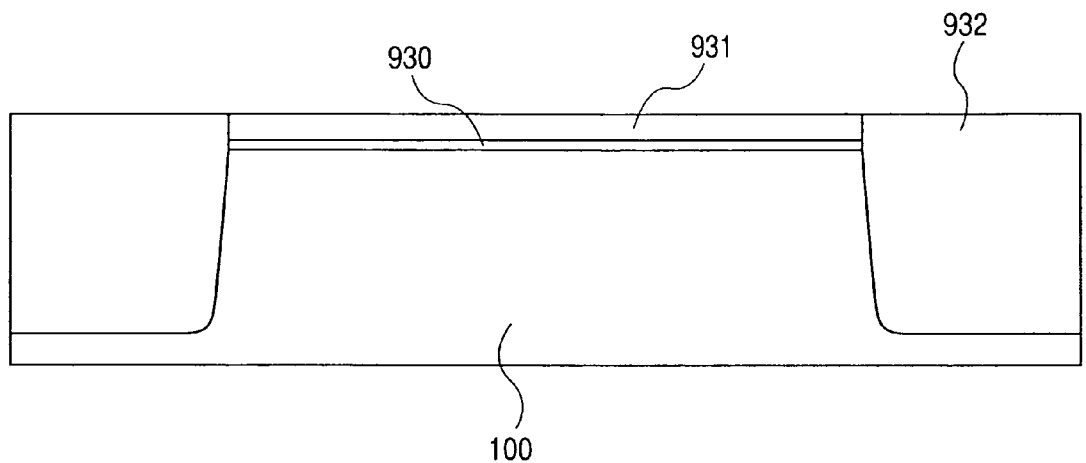
FIG. 45D is a cross-sectional structural view showing the manufacturing step of the eighth device of the present invention.
Figure 45E:
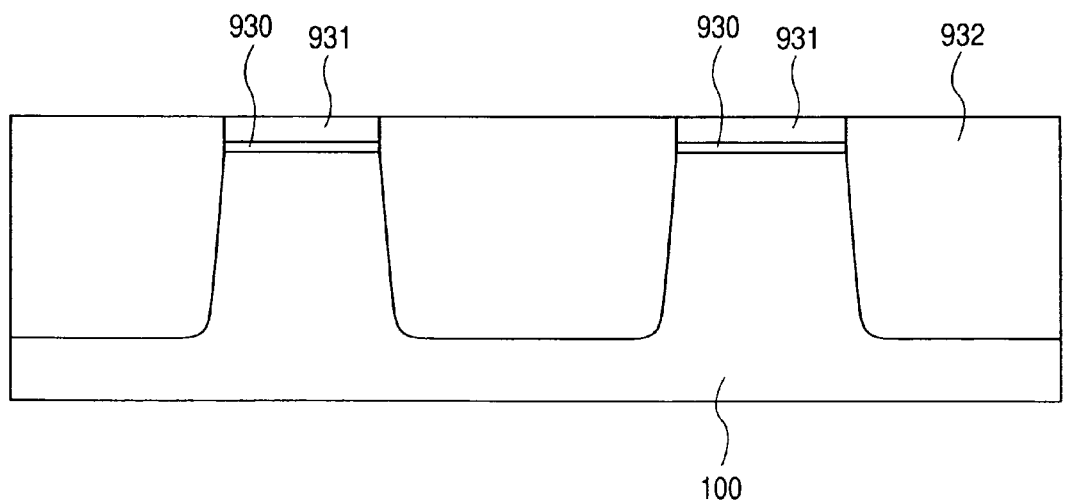
FIG. 45E is a cross-sectional structural view showing the manufacturing step of the eighth device of the present invention.
Figure 46A:
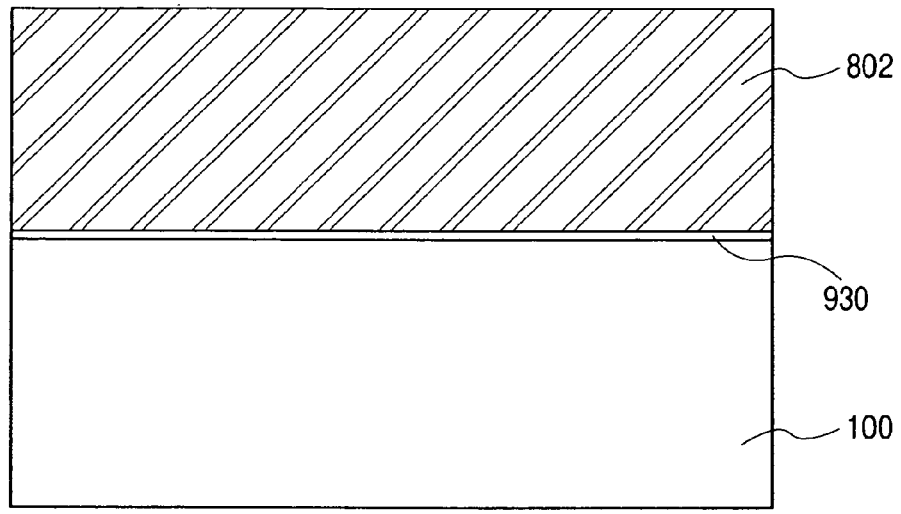
FIG. 46A is a cross-sectional structural view showing a manufacturing step of the eighth device of the present invention.
Figure 46B:
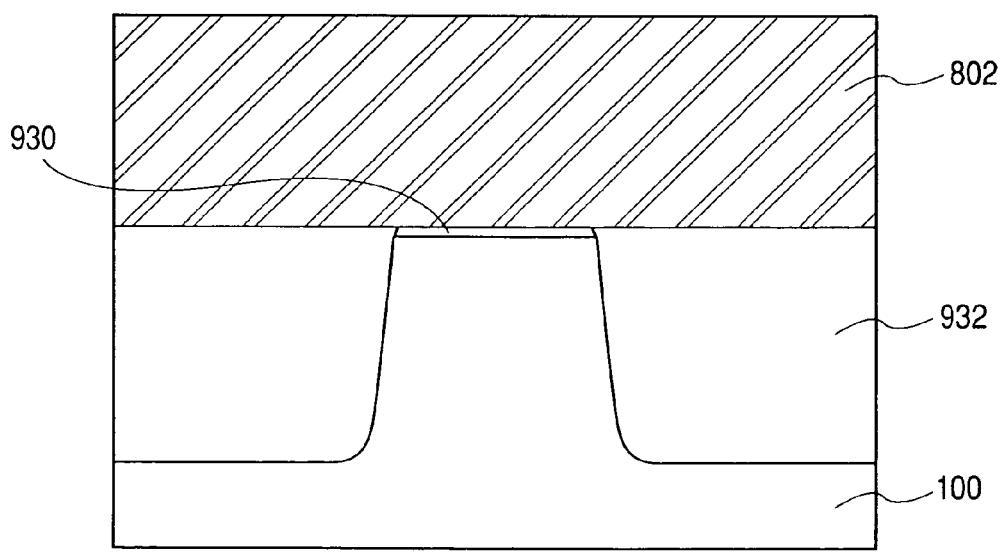
FIG. 46B is a cross-sectional structural view showing the manufacturing step of the eighth device of the present invention.
Figure 46C:
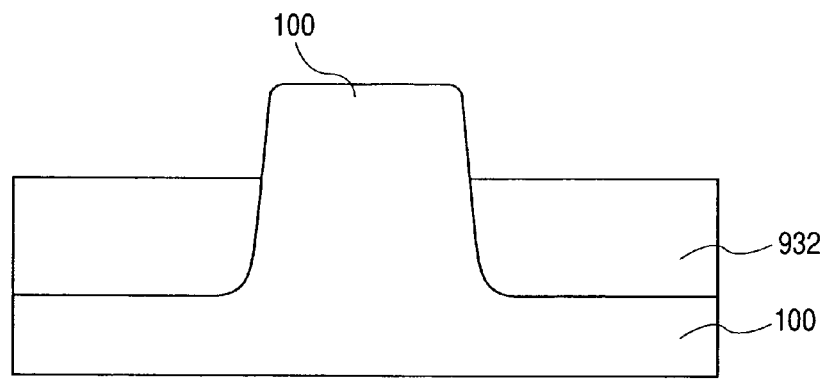
FIG. 46C is a cross-sectional structural view showing the manufacturing step of the eighth device of the present invention.
Figure 46D:
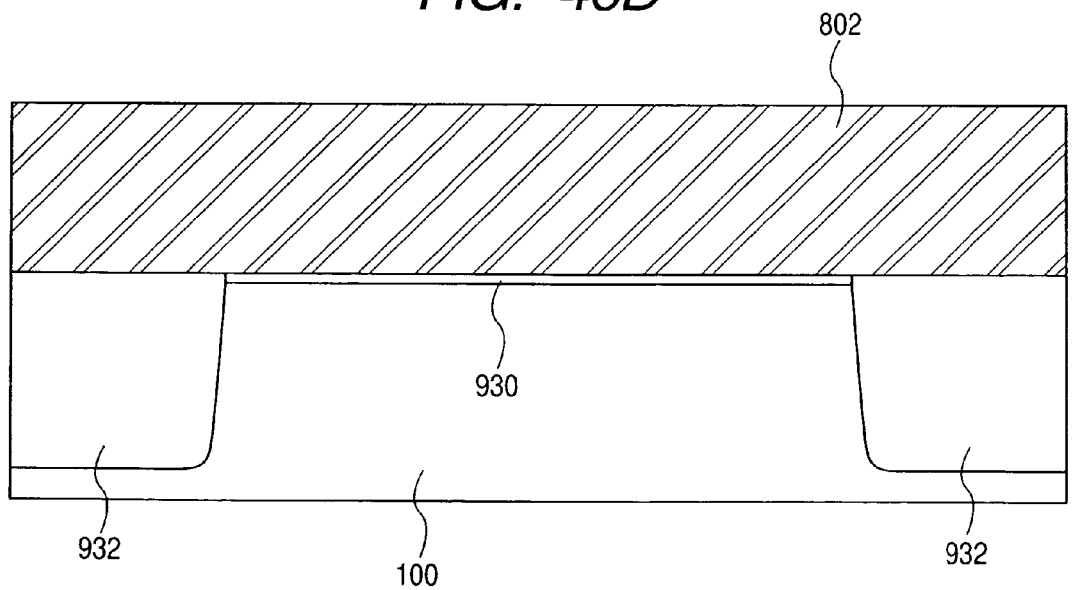
FIG. 46D is a cross-sectional structural view showing the manufacturing step of the eighth device of the present invention.
Figure 46E:
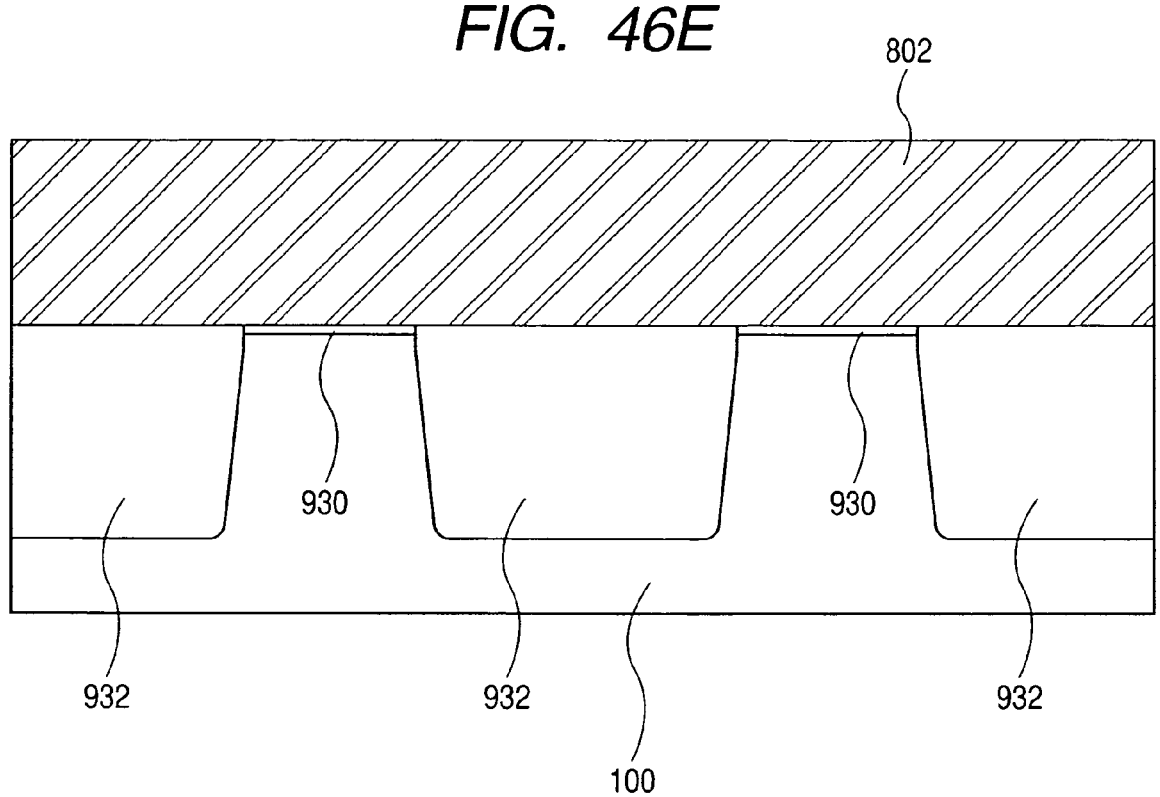
FIG. 46E is a cross-sectional structural view showing the manufacturing step of the eighth device of the present invention.
Figure 47A:
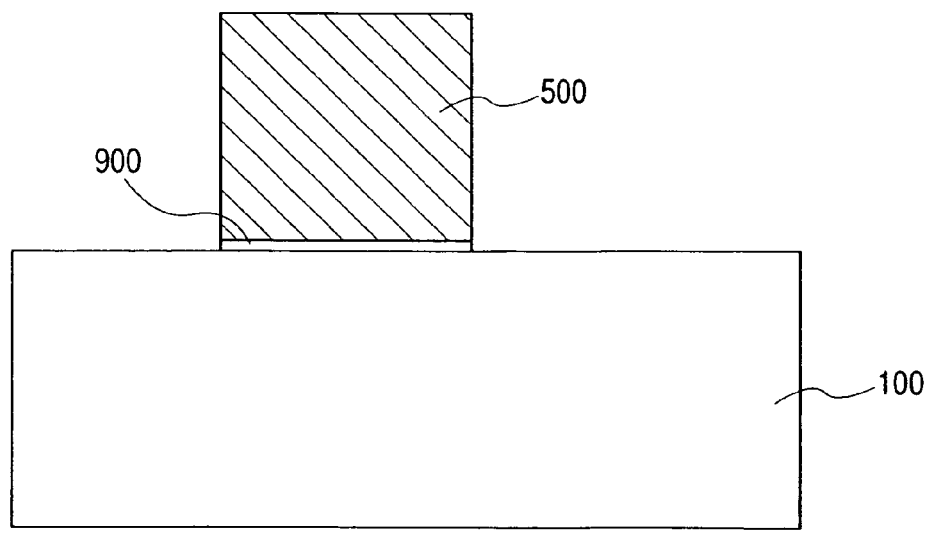
FIG. 47A is a cross-sectional structural view showing a manufacturing step of the eighth device of the present invention.
Figure 47B:
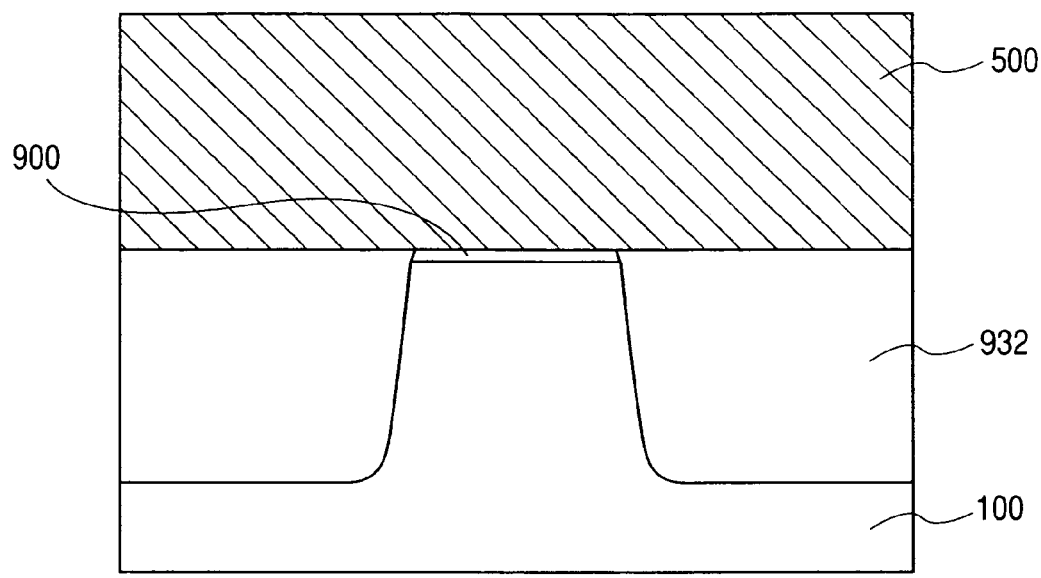
FIG. 47B is a cross-sectional structural view showing the manufacturing step of the eighth device of the present invention.
Figure 47C:
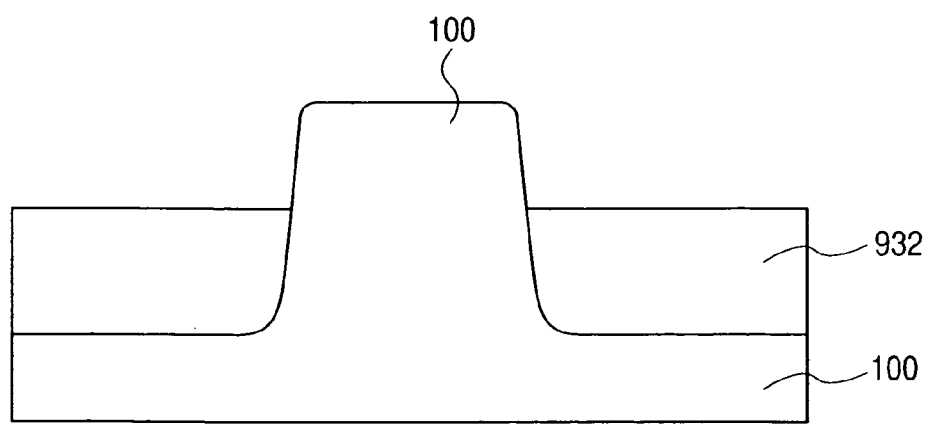
FIG. 47C is a cross-sectional structural view showing the manufacturing step of the eighth device of the present invention.
Figure 47D:
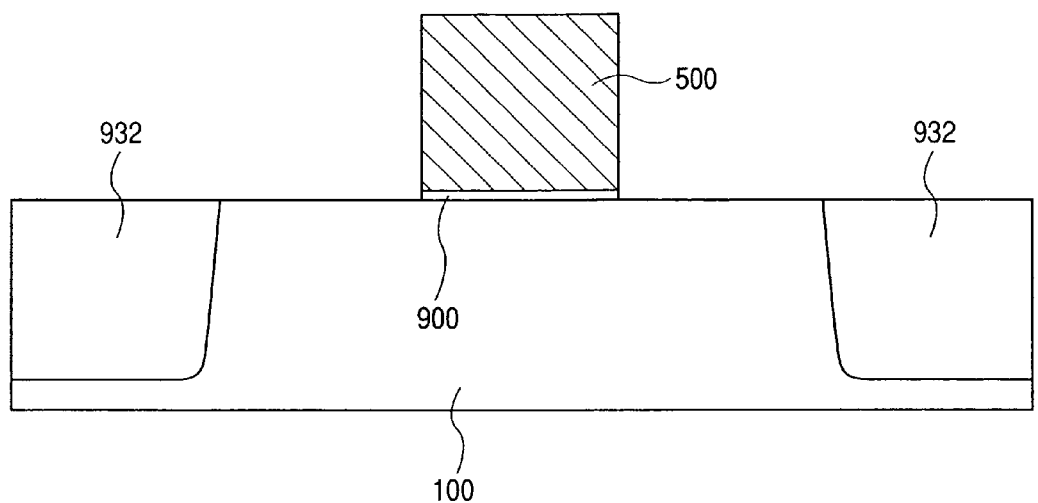
Figure 47E:
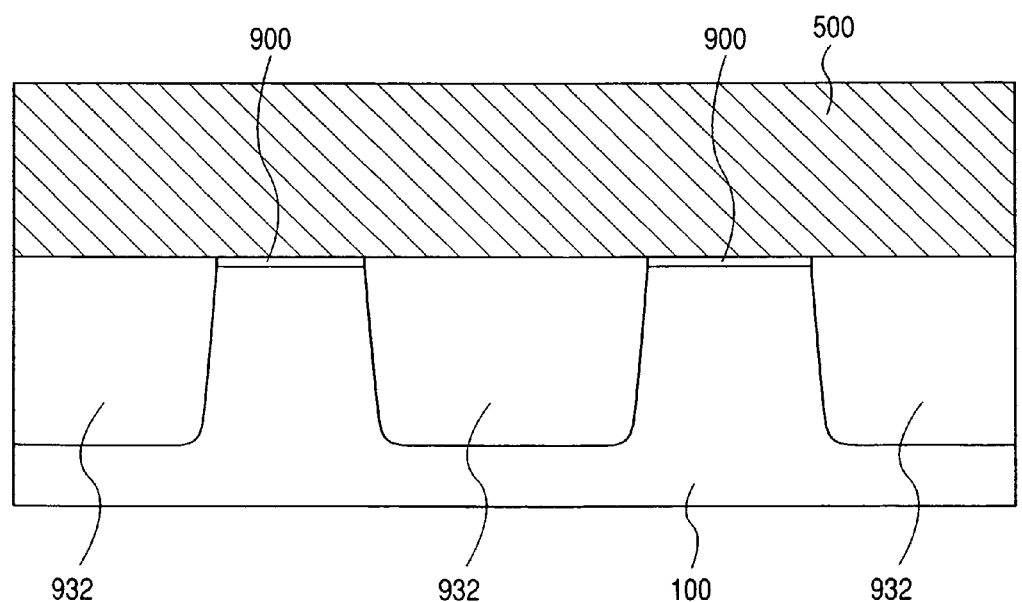
Figure 48A:
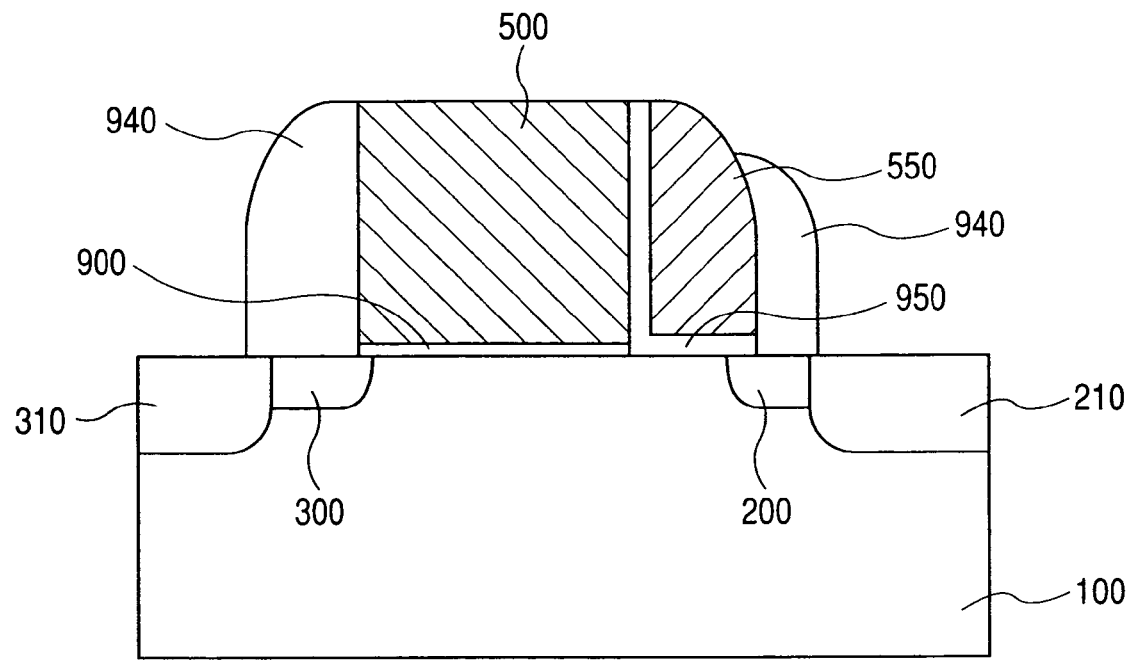
Figure 48B:
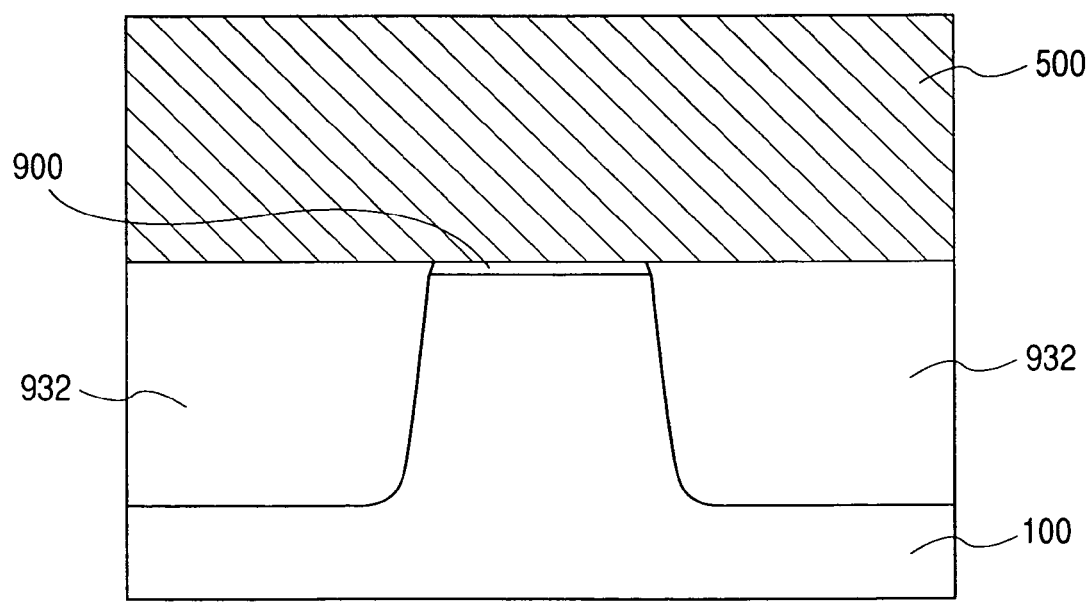
Figure 48C:
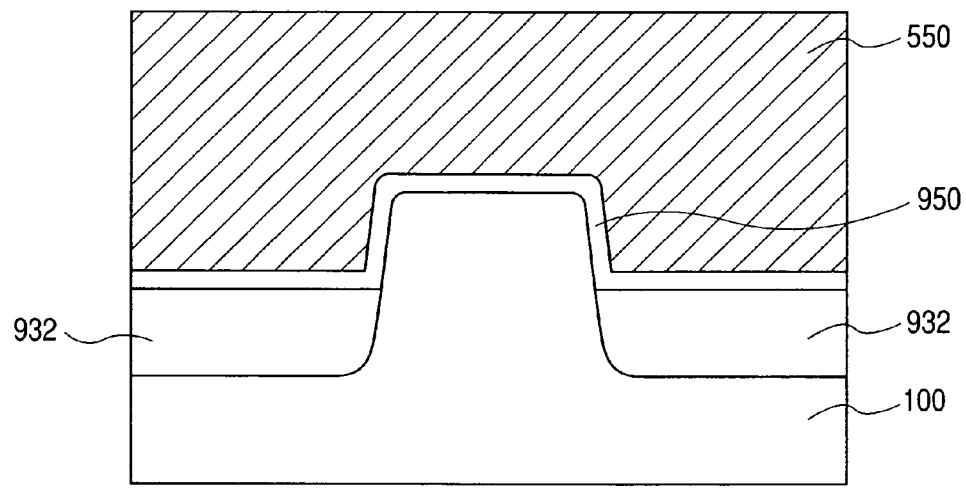
Figure 48D:
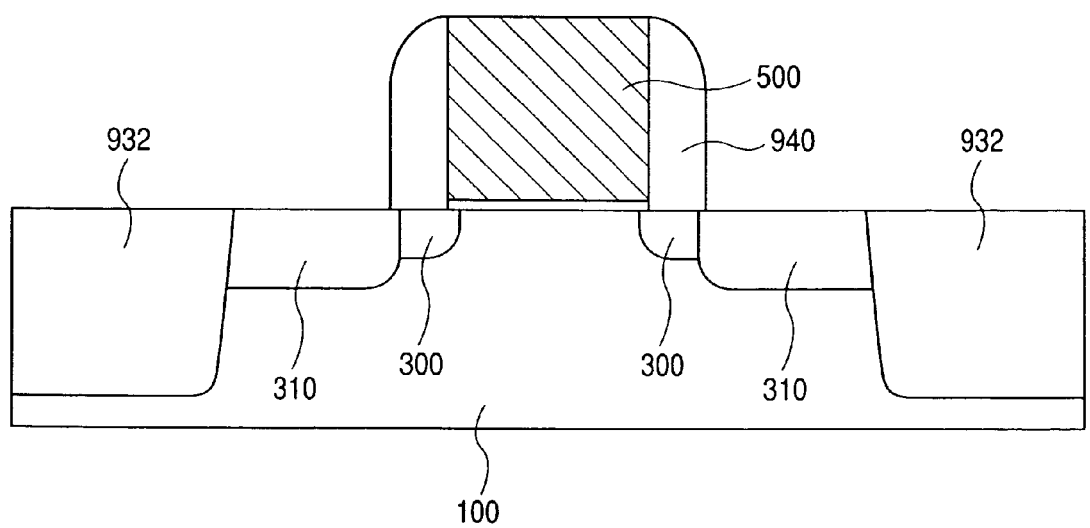
Figure 48E:
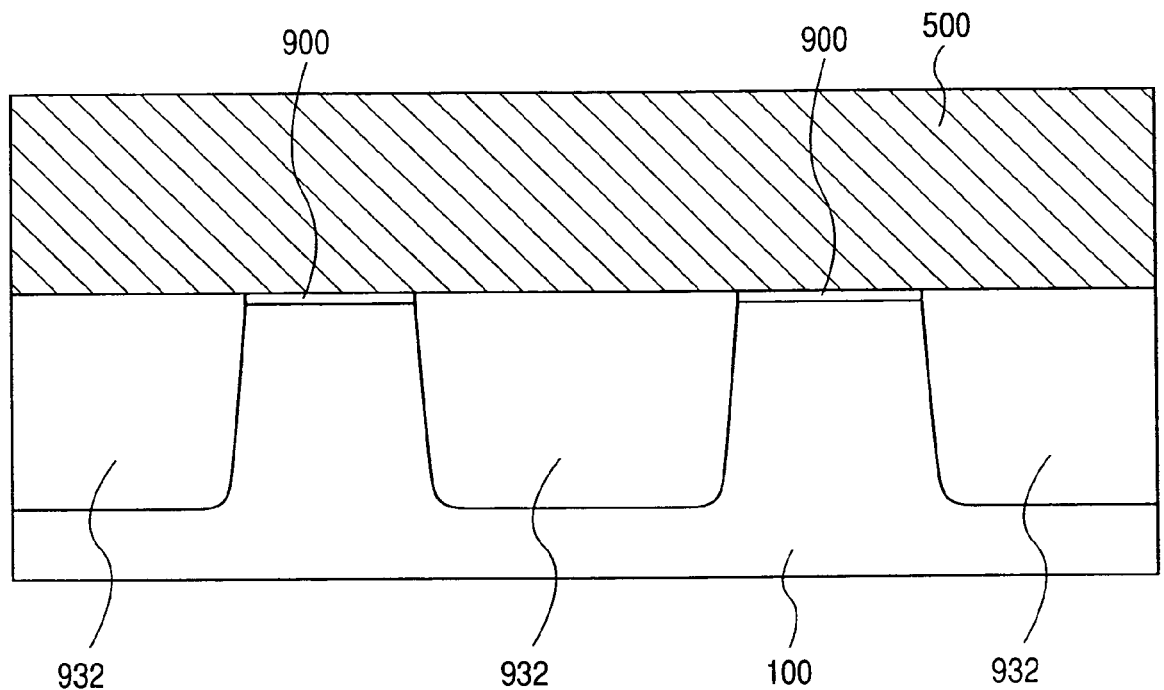

FIG. 43F is a partially enlarged view of a portion Z of FIG. 43E. In the drawings up to FIG. 43E, the surface of the semiconductor substrate is drawn with a straight line, but in an actual step, a little recess is formed at the end portions of the convex portion of silicon as illustrated in FIG. 43F when the silicon dioxide film is formed. Although not referred to particularly, this also applies to another example.

Seventh Embodiment

FIGS. 44A to 44E illustrate an example of improving a yield by covering a memory portion with a mask during formation of a convex shape. A mask 800 as illustrated in FIGS. 40A to 40E is placed (a portion indicated by numeral 801 corresponds to the mask) also on the select gate side of the memory portion so as to prevent the select gate diffusion layers 300 and 310 from having a convex shape. By this, the peripheral circuit region and diffusion layers are able to have the same structure even within a memory array.

Eighth Embodiment

FIGS. 45A-45E to FIGS. 48A-48E illustrate another example. In them, a step of forming a flat select gate and peripheral circuit device, while forming a memory gate over a convex shape is illustrated. FIGS. 45A to 45C, FIGS. 46A to 46C, FIGS. 47A to 47C, and FIGS. 48A to 48C are cross-sectional views in the channel direction of FIG. 11. FIGS. 45D and 45E, FIGS. 46D and 46E, FIGS. 47D and 47E, and FIGS. 48D and 48E are cross-sectional views in the channel direction of a peripheral device and cross-sectional view including the gate of a peripheral device, respectively. Essential steps of this example are similar to those of the above-described examples so that essential steps will be described simply and matters specific to this example will be described in detail.

As the above-described examples, an element isolation region is formed in a semiconductor substrate 100 (FIGS. 45A, 45B, 45C, 45D and 45E).

A mask 802 is placed over a peripheral circuit region and a select gate region and a convex shape is formed in a memory gate portion (FIGS. 46A, 46B, 46C, 46D and 46E).

The select gate 500 and peripheral circuit device are processed (FIGS. 47A, 47B, 47C, 47D and 47E).

A memory gate insulating film 950 and a memory gate 550 are formed, followed by similar processing to that of the above-described examples, whereby a memory cell and a peripheral circuit device can be obtained (FIGS. 48A, 48B, 48C, 48D and 48E). By this process, a conventional MOSFET can be formed in the peripheral circuit region and selection agate and memory gate is able to have a convex active region. In the steps of FIGS. 46A to 46E, the select gate and memory gate can be formed over the convex active region by covering only the peripheral region with a resist.

Ninth Embodiment

Figure 1:
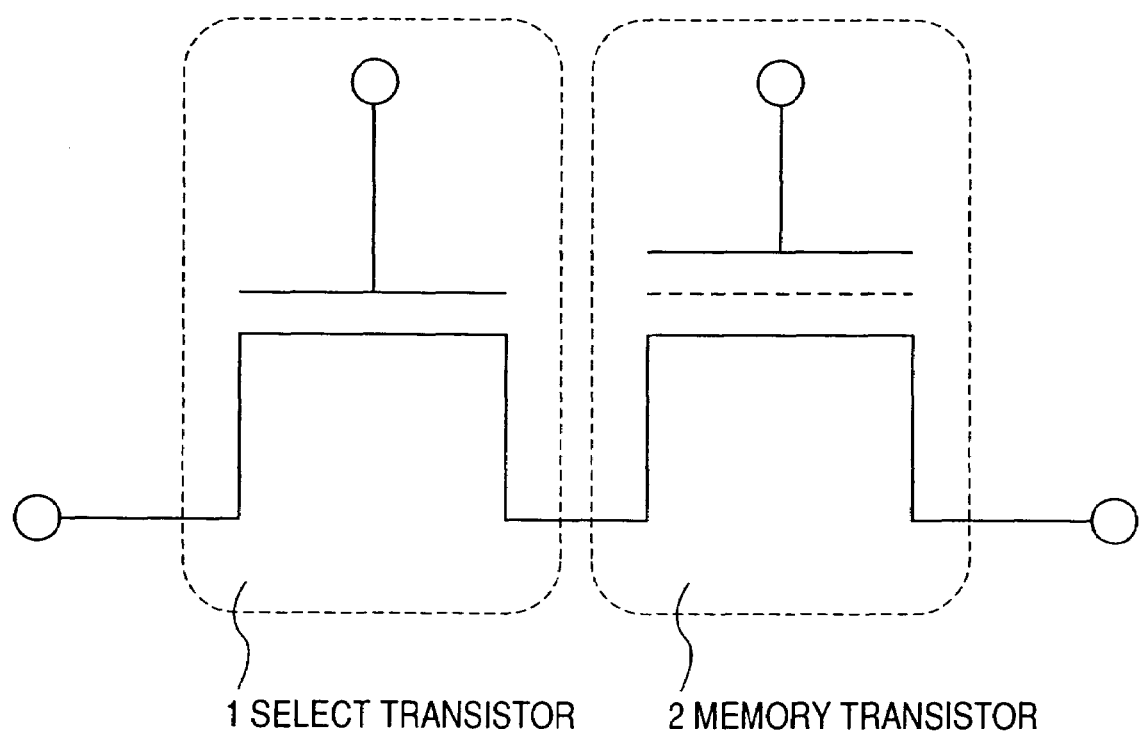
FIG. 1 is an equivalent circuit diagram of a memory cell for explaining the memory cell.
Figure 49:
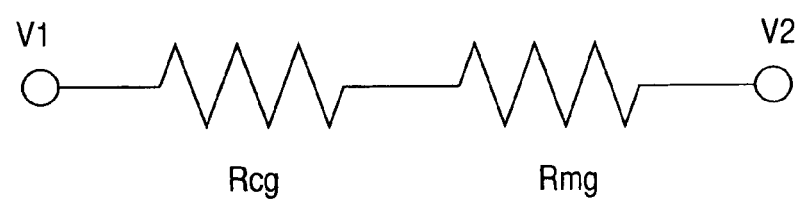

The memory device of the present invention has a structure, as illustrated in FIG. 1, in which two transistors, that is, a select transistor and a memory gate are stacked vertically one after another. With regards to a read current of a cell, resistance Rcg corresponding to a select gate and resistance Rmg corresponding to a memory gate are connected equivalently in series. This relationship as an equivalent circuit is illustrated in FIG. 49. When only the memory gate is formed into a convex shape, Rmg can therefore be reduced.

A large read current is available by reversing the relationship between V1 and V2 of the conventional readout method to V1<V2, because in the select gate, carriers can be drawn inside of the substrate from an inversion layer formed over the surface by making use of the concave shape.

Figure 50:
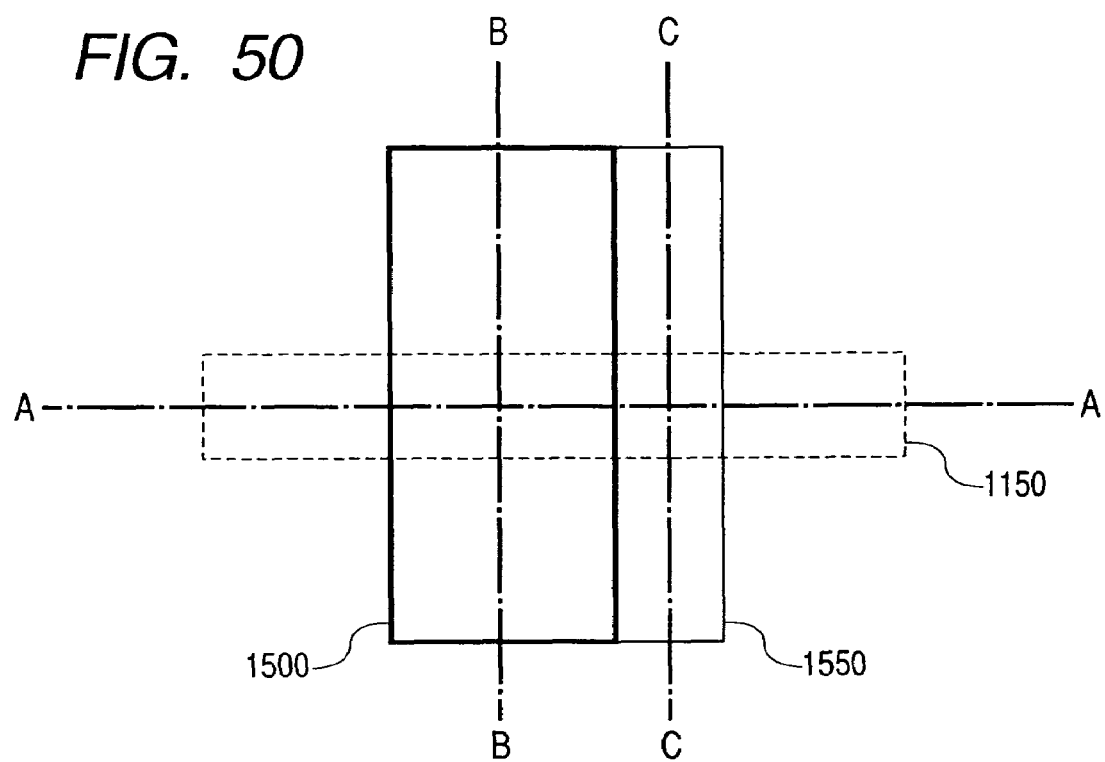
Figure 51:
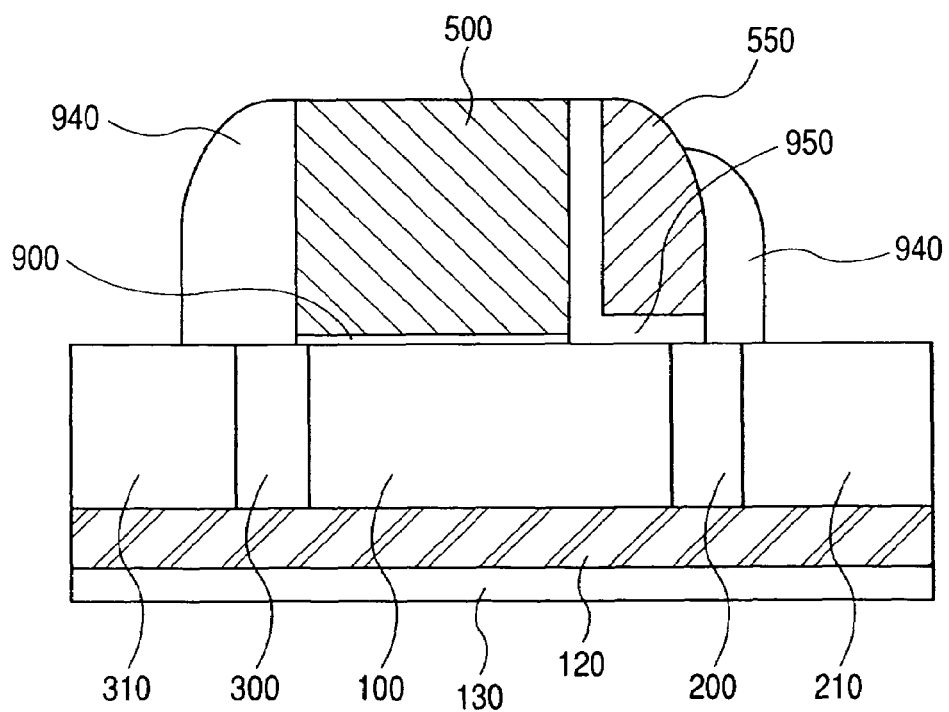

Effects by the convex shape can also be attained by a memory cell formed over SOI (Silicon On Insulator). FIG. 50 is a plan view of the layout, while FIG. 51 illustrates its cross-sectional structure.

The characteristic in the planar layout is that the width of a channel to be laid out can be made smaller than a bulk, while the characteristic in the cross-sectional structure is that a buried oxide film 120 is laid over a supporting substrate 130. FIGS. 52A-52C to FIGS. 56A-56C are cross-sectional views of its device in the order of manufacturing steps. As illustrated in FIG. 50, in these drawings, FIGS. 52A to 52C, FIGS. 53A to 53C, FIGS. 54A to 54C, FIGS. 55A to 55C, and FIGS. 56A to 56C show cross-section (A-A) in the channel direction, cross-section (B-B cross-section) including the select gate, and cross-section (C-C cross-section) including the memory gate, respectively.

Silicon single crystal (SOI) 100 of 80 nm thickness over a so-called "buried oxide film" 120 over a supporting substrate 130 is etched using an active region pattern (indicated by numeral 1150, FIG. 50) (FIGS. 52A, 52B and 52C).

The surface of the SOI 100 is oxidized to form a gate insulating film 900 of 2.5 nm thickness. Polycrystalline silicon 500 is deposited to give its thickness of 300 nm, and polished by CMP to flatten the polycrystalline silicon surface. A silicon dioxide film 935 of 50 nm thickness is deposited by CVD, followed by etching of a film stack of the oxide film 935 and polycrystalline silicon 500 by using a select gate pattern (indicated by numeral 1500, FIG. 50) (FIGS. 53A, 53B and 53C).

The silicon surface is exposed from the memory gate region and then thermally oxidized to form an oxide film of 4 nm thickness. By stacking a silicon nitride film of 10 nm thickness and a silicon dioxide film of 7 nm thickness over the resulting oxide film, a memory gate insulating film 950 is formed (FIGS. 54A, 54B and 54C).

After deposition of polycrystalline silicon to give its thickness of 50 nm, a spacer gate 550 is formed over the side surfaces of the select gate by the spacer forming process (FIG. 55A) and an unnecessary portion of the polycrystalline silicon is removed (FIGS. 55A, 55B and 55C).

In a similar manner to the above-described examples, diffusion layers 200, 210, 300 and 310 are formed, whereby a memory cell structure having a concave shape can be obtained (FIGS. 56A, 56B, and 56C).

Embodiment 10

In FIG. 57A to FIG. 57C to FIGS. 61A to 61C, a process of forming a concave shaped cell easily by using the above-described SOI is illustrated. In these drawings, respective cross-sections of FIG. 50 are also employed.

An oxide film layer 936 of 30 nm thickness is formed by thermal oxidation of silicon (SOI) on the surface of an SOI substrate. Then, using an active region pattern (indicated by numeral 1150, FIG. 50), the oxide film 936 and SOI layer are processed (FIGS. 57A, 57B and 57C).

The side surface of the SOI 100 is oxidized to form a gate insulating film 900 of 2.5 nm thickness. Polycrystalline silicon 500 of 300 nm thickness is deposited, followed by polishing by CMP to flatten the polycrystalline silicon surface. A silicon dioxide film 935 of 50 nm thickness is deposited by CVD. With a select gate pattern (indicated by numeral 1500, FIG. 50), a film stack (FIG. 58A) of the oxide film 935 and polycrystalline silicon 500 is etched (FIGS. 58A, 58B and 58C). During this etching, existence of the layer 936 prevents etching of the SOI 100.

The silicon surface is exposed from the memory gate region and thermally oxidized to form an oxide film of 4 nm thickness. Then, a silicon nitride film of 10 nm thickness and a silicon dioxide film of 7 nm thickness are stacked over the resulting oxide film to form a memory gate insulating film 950 (FIG. 59A) (FIGS. 59A, 59B and 59C).

After deposition of polycrystalline silicon of 50 nm thickness, the spacer forming process is employed to form a spacer gate 550 on the side surfaces of the select gate 500. An unnecessary portion of the polycrystalline silicon is then removed (FIGS. 60A, 60B and 60C).

In a similar manner to that employed in the above-described examples, diffusion layers 200, 210, 300 and 310 are formed, whereby a memory cell structure having a concave shape can be obtained (FIGS. 61A, 61B and 61C).

The gate insulating film 950 of the memory gate is thicker than the gate insulating film 900 of the select gate so that it is inferior in driving power. According to the structure of this example, however, the upper portion and two side surfaces of the SOI serve as a channel of the memory gate so that a difference in the current driving power between them can be reduced.

Embodiment 11

A memory cell structure having a memory gate formed on one side of a select gate was described above. This example is, on the other hand, effective also for a structure having a memory gate on both sides of a select gate.

FIG. 62 is a planar layout of such a memory cell structure. On both sides of a select gate 1500, a memory gate 1550 is located. When the memory gate is formed in self alignment, it is not included in a mask pattern. FIGS. 63A to 63C illustrate the cross-sectional structure of the device of FIG. 62. FIG. 63A is a cross-sectional view in a channel direction (A-A cross-section), FIG. 63B is a B-B cross-section of FIG. 62 including the select gate, and FIG. 63C is C-C and D-D cross-sections of FIG. 62 including the memory gate. The same structure is formed in the C-C and D-D cross-sections. It is only necessary to adopt a similar manufacturing method to that illustrated in FIGS. 21A to 21C to FIG. 25A to 25C except the removal step of an unnecessary portion of the memory gate 550 as illustrated in FIG. 23A to FIG. 23C is changed and the memory gate is formed on both sides of the select gate. In this example, the select gate, and two memory gates are formed over the convex shape.

FIG. 64 illustrates a memory cell structure similar to that described in FIGS. 62 and 63 except that the select gate is formed with a flat structure and the memory gate is formed in the convex shape. It can be formed by using the manufacturing steps as described in FIGS. 37A to 37C to FIG. 43A to FIG. 43C.

Embodiment 12

FIG. 65 and FIGS. 66A to 66C illustrate a memory gate formed on both sides of a select gate by using SOI.

FIG. 65 illustrates its planar layout. The memory gate 1550 is located on both sides of the select gate 1500. When the memory gate is formed in self alignment, the mask pattern does not include the memory gate. FIGS. 66A to 66C illustrate the cross-sectional structure of the device of FIG. 65. FIG. 66A is a cross-sectional view in a channel direction (A-A cross-section), FIG. 66B is a B-B cross-section of FIG. 65 including the select gate, and FIG. 66C is C-C and D-D cross-sections of FIG. 65 including the memory gate. The same structure is formed in the C-C and D-D cross-sections. It is only necessary to adopt a similar manufacturing method to that illustrated in FIGS. 21A to 21C to FIGS. 25A to 25C except the removal step of an unnecessary portion of the memory gate 550 as illustrated in FIGS. 23A to 23C is changed and the memory gate is formed on both sides of the select gate. In this example, the select gate, and two memory gates are formed over the convex shape made of SOI.

Main modes of the present invention will next be enumerated.

A first example is a nonvolatile semiconductor memory device which is equipped with a first metal insulator semiconductor field effect transistor ("metal insulator semiconductor field effect transistor" will hereinafter be abbreviated as MISFET) formed over a silicon substrate, and a second MISFET formed in parallel and at the same time in contact with the first transistor gate and has a first diffusion layer electrode in a direction at right angles to these gates, a first gate, a first channel controlled thereby, a second gate, a second channel controlled thereby, and a second diffusion layer electrode, wherein a gate insulating film of the second MISFET has a charge retaining function, and a current flowing between a first diffusion layer and a second diffusion layer is controlled by a change in voltage characteristics caused by the second gate, characterized in that the first transistor uses as a channel the side surface of a convex formed in a direction at right angles to a channel direction connecting the first diffusion layer electrode and the second diffusion layer electrode.

A second example is a nonvolatile semiconductor memory device which is equipped with a first MISFET formed over a silicon substrate, and a second MISFET formed in parallel and at the same time in contact with the first transistor gate and has a first diffusion layer electrode in a direction at right angles to these gates, a first gate, a first channel controlled thereby, a second gate, a second channel controlled thereby, and a second diffusion layer electrode, wherein a gate insulating film of the second MISFET has a charge retaining function, and a current flowing between a first diffusion layer and a second diffusion layer is controlled by a change in voltage characteristics caused by the second gate, characterized in that the second transistor uses as a channel the side surface of a convex formed in a direction at right angles to a channel direction connecting the first diffusion layer electrode and the second diffusion layer electrode.

A third example is a nonvolatile semiconductor memory device which is equipped with a first MISFET formed over a silicon substrate, and a second MISFET formed in parallel and at the same time in contact with the first transistor gate and has a first diffusion layer electrode in a direction at right angles to these gates, a first gate, a first channel controlled thereby, a second gate, a second channel controlled thereby, and a second diffusion layer electrode, wherein a gate insulating film of the second MISFET has a charge retaining function, and a current flowing between a first diffusion layer and a second diffusion layer is controlled by a change in voltage characteristics caused by the second gate, characterized in that each of the first and second transistors uses as a channel the side surface of a convex formed in a direction at right angles to a channel direction connecting the first diffusion layer electrode and the second diffusion layer electrode.

A fourth example is a nonvolatile semiconductor memory device which is equipped with a first MISFET formed over a silicon substrate, and a second MISFET formed in parallel and at the same time in contact with the first transistor gate and has a first diffusion layer electrode in a direction at right angles to these gates, a first gate, a first channel controlled thereby, a second gate, a second channel controlled thereby, and a second diffusion layer electrode, wherein a gate insulating film of the second MISFET has a charge retaining function, and a current flowing between a first diffusion layer and a second diffusion layer is controlled by a change in voltage characteristics caused by the second gate, characterized in that the first transistor uses a flat substrate surface as a channel, while the second transistor uses as a channel a convex formed in a direction at right angles to a channel direction connecting the first diffusion layer electrode and the second diffusion layer electrode.

A fifth example is an integrated semiconductor device which has, over one substrate, a plurality of the semiconductor memory devices of the first example and a plurality of field effect transistors for controlling a channel via an insulating film and in which at least one of the field effect transistors has a flat channel.

A sixth example is an integrated semiconductor device which has, over one substrate, a plurality of the semiconductor memory devices of the second example and a plurality of field effect transistors for controlling a channel via an insulating film and in which at least one of the field effect transistors has a flat channel.

A seventh example is an integrated semiconductor device which has, over one substrate, a plurality of the semiconductor memory devices of the third example and a plurality of field effect transistors for controlling a channel via an insulating film and in which at least one of the field effect transistors has a flat channel.

An eighth example is an integrated semiconductor device which has, over one substrate, a plurality of the semiconductor memory devices of the fourth example and a plurality of field effect transistors for controlling a channel via an insulating film and in which at least one of the field effect transistors has a flat channel.

A ninth example is a manufacturing method of an integrated semiconductor device having the semiconductor memory device of the third example and a plurality of field effect transistors for controlling a channel via an insulating film, characterized in that the method comprises the steps of: forming an element isolation region, covering at least one of the field effect transistors with a mask, and processing a channel portion of the semiconductor memory device into a convex shape by using the mask.

A tenth example is a manufacturing method of a semiconductor memory device of the fourth example, which comprises the steps of: forming a first gate electrode and then etching with the first gate electrode as a mask, and forming a channel of the second transistor into a convex shape.

As described above in detail, a semiconductor device having a higher performance can be obtained by the method of the present invention while using only the semiconductor processes existing now so that it has high availability.

What is claimed is:
1. A semiconductor device, comprising:
a semiconductor substrate;
a first metal insulator semiconductor field effect transistor formed over the semiconductor substrate;
a second metal insulator semiconductor field effect transistor formed over the semiconductor substrate and having a second gate electrode formed with an insulating film inserted between the second gate electrode and a first gate electrode of the first metal insulator semiconductor field effect transistor;
an isolation field oxide film;
a first diffusion layer electrode;
a first channel region, corresponding to the first gate electrode, of the first metal insulator semiconductor field effect transistor;
a second channel region, corresponding to the second gate electrode, of the second metal insulator semiconductor field effect transistor; and
a second diffusion layer electrode opposite to the first diffusion layer electrode, with the first channel region and second channel region sandwiched therebetween,
the first diffusion layer electrode, the first channel region, the second channel region, and the second diffusion layer being in a direction crossing with the respective gate electrodes of the first and second metal insulator semiconductor field effect transistors,
wherein:
a gate insulating film of the second metal insulator semiconductor field effect transistor has a charge retaining function;
a current flowing between the first diffusion layer electrode and the second diffusion layer electrode is controlled by a change in voltage characteristics caused by the second gate electrode;
the second channel region has a semiconductor region which is convex shaped in a cross-section perpendicular to a channel direction connecting the first diffusion layer electrode and the second diffusion layer electrode;
the second channel region of the second metal insulator semiconductor field effect transistor is formed over a side wall of the convex shaped semiconductor region;

the first and second gate electrodes are disposed on the isolation field oxide film, and a height of the isolation field oxide film under the second gate electrode is less than a height of the isolation field oxide film under the first gate electrode; and the second gate electrode is a sidewall gate electrode, and a width of the second gate electrode over the isolation field oxide film is wider than a width between the first diffusion layer electrode and the second diffusion layer electrode.

2. A semiconductor device according to claim 1, wherein the first channel region of the first metal insulator semiconductor field effect transistor is formed over a surface of the semiconductor substrate except the convex shaped semiconductor region or is formed over a surface parallel to an upper surface of the semiconductor substrate.

3. A semiconductor device, comprising a plurality of non-volatile semiconductor memory devices each constructed in accordance with claim 1, and a metal insulator semiconductor field effect transistor, wherein a channel of the metal insulator semiconductor field effect transistor is formed over the surface of the semiconductor substrate except the convex shaped semiconductor region or a surface in parallel with an upper surface of the semiconductor substrate.

4. A semiconductor device, comprising a plurality of non-volatile semiconductor memory devices each constructed in accordance with claim 2, and a metal insulator semiconductor field effect transistor, wherein a channel of at least one of the metal insulator semiconductor field effect transistor is formed over the surface of the semiconductor substrate except the convex shaped semiconductor region or a surface in parallel with an upper surface of the semiconductor substrate.

5. A semiconductor device according to claim 1, wherein a channel width of the second channel region is wider than a channel width of the first channel region.

6. A semiconductor device, comprising:
a semiconductor substrate;
a first isolation field oxide film formed over the semiconductor substrate;
a second isolation field oxide film formed over the semiconductor substrate;
a first gate electrode formed over the semiconductor substrate via a first insulating film;
a second gate electrode formed over the semiconductor substrate via a second insulating film and adjacent to the first gate electrode;
a first diffusion layer formed in the semiconductor substrate; and
a second diffusion layer formed in the semiconductor substrate such that the first gate electrode and the second gate electrode are disposed between the first diffusion layer and the second diffusion layer, wherein:
the second insulating film has a charge storage film;
the first gate electrode is formed over the first isolation field oxide film;
the second gate electrode is formed over the second isolation field oxide film;
the surface of the second isolation field oxide film is retreated from the surface of the first isolation field oxide film, such that a height of the second isolation field oxide film is less than a height of the first isolation field oxide film;
the device has a semiconductor region which is convex shaped in a cross-section perpendicular to a direction connecting the first diffusion layer electrode and the second diffusion layer electrode;
the second gate electrode is disposed over a side wall of the convex shaped semiconductor region; and
the second gate electrode is a side wall gate electrode, and a width of the second gate electrode over the isolation field oxide film is wider than a width between the first diffusion layer electrode and the second diffusion layer electrode.

7. A semiconductor device according to claim 6, further comprising:
a third isolation field oxide film formed over the semiconductor substrate; and
a third gate electrode formed over the semiconductor substrate via a third insulating film, wherein:
the third gate electrode is formed over the third isolation field oxide film; and
the surface of the second isolation field oxide film is retreated from the surface of the third isolation field oxide film.

8. A semiconductor device according to claim 7, wherein the first gate electrode and second gate electrode are formed within a memory array region and the third gate electrode is formed within a peripheral circuit region.

9. A semiconductor device according to claim 6, wherein a width of the second gate electrode is wider than a width of the first gate electrode.

* * * * *